(12) United States Patent
Miyairi

(10) Patent No.: US 7,714,251 B2
(45) Date of Patent: May 11, 2010

(54) LASER IRRADIATION APPARATUS

(75) Inventor: Hidekazu Miyairi, Kanagawa (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 180 days.

(21) Appl. No.: 11/604,007

(22) Filed: Nov. 24, 2006

(65) Prior Publication Data
US 2007/0117288 A1 May 24, 2007

(51) Int. Cl.
*B23K 26/04* (2006.01)
*H01L 21/268* (2006.01)

(52) U.S. Cl. .............................. 219/121.83; 219/121.65; 438/487; 438/795

(58) Field of Classification Search ................. 438/166, 438/487, 795; 219/121.65, 121.83, 121.62; 346/107.1; 356/213
See application file for complete search history.

(56) References Cited

U.S. PATENT DOCUMENTS

| | | | | |
|---|---|---|---|---|
| 4,309,225 A | * | 1/1982 | Fan et al. | 438/487 |
| 4,692,623 A | * | 9/1987 | Roberts et al. | 250/349 |
| 4,733,944 A | | 3/1988 | Fahlen et al. | |
| 4,879,176 A | | 11/1989 | Ouderkirk et al. | |
| 4,916,319 A | | 4/1990 | Telfair et al. | |
| 4,970,546 A | | 11/1990 | Suzuki et al. | |
| 5,058,988 A | * | 10/1991 | Spence | 356/121 |
| 5,097,291 A | | 3/1992 | Suzuki | |
| 5,119,390 A | | 6/1992 | Ohmori | |
| 5,140,600 A | | 8/1992 | Rebhan | |
| 5,162,239 A | | 11/1992 | Winer et al. | |
| 5,210,766 A | | 5/1993 | Winer et al. | |
| 5,212,116 A | | 5/1993 | Yu | |
| 5,244,819 A | | 9/1993 | Yue | |
| 5,266,532 A | | 11/1993 | Russell et al. | |
| 5,323,267 A | * | 6/1994 | Galarneau et al. | 359/574 |

(Continued)

FOREIGN PATENT DOCUMENTS

EP  0 651 431  5/1995

(Continued)

OTHER PUBLICATIONS

Computer translation of Japan Patent No. 2005-116729 on Feb. 10, 2009 by the Japanese Patent Office.*

(Continued)

*Primary Examiner*—Geoffrey S Evans
(74) *Attorney, Agent, or Firm*—Eric J. Robinson; Robinson Intellectual Property Law Office, P.C.

(57) ABSTRACT

Since the size of a plate for issuing gas used for a conventional laser irradiation apparatus is large and the distance between an optical system through which a laser light lastly passes and the plate is not enough, it is difficult to check the state of laser light delivered from the optical system which the laser light lastly passes through. A laser irradiation apparatus includes a laser oscillator, an optical system shaping laser light produced by the laser oscillator, a plate having an opening for issuing a gas, a stage provided below the blower, means for maintaining a constant distance between the blower and the stage above the stage, and means provided between the optical system and the blower for observing the laser light transmitted through the optical system are provided.

26 Claims, 31 Drawing Sheets

U.S. PATENT DOCUMENTS

| | | | |
|---|---|---|---|
| 5,329,350 A * | 7/1994 | Wright et al. ............... 356/218 |
| 5,352,291 A | 10/1994 | Zhang et al. |
| 5,383,199 A | 1/1995 | Laudenslager et al. |
| 5,404,366 A | 4/1995 | Wakabayashi et al. |
| 5,436,645 A * | 7/1995 | Uemura et al. ........... 346/107.1 |
| 5,463,650 A | 10/1995 | Ito et al. |
| 5,473,412 A | 12/1995 | Ozawa |
| 5,525,550 A | 6/1996 | Kato |
| 5,529,937 A | 6/1996 | Zhang et al. |
| 5,529,951 A | 6/1996 | Noguchi et al. |
| 5,544,182 A | 8/1996 | Nagaishi et al. |
| 5,578,520 A | 11/1996 | Zhang et al. |
| 5,604,153 A | 2/1997 | Tsubouchi et al. |
| 5,608,232 A | 3/1997 | Yamazaki et al. |
| 5,608,492 A | 3/1997 | Sato |
| 5,609,780 A * | 3/1997 | Freedenberg et al. .. 219/121.83 |
| 5,643,826 A | 7/1997 | Ohtani et al. |
| 5,776,812 A | 7/1998 | Takahashi et al. |
| 5,789,284 A | 8/1998 | Yamazaki et al. |
| 5,795,795 A | 8/1998 | Kousai et al. |
| 5,808,321 A | 9/1998 | Mitanaga et al. |
| 5,811,754 A * | 9/1998 | Nakatani et al. ....... 219/121.83 |
| 5,815,494 A | 9/1998 | Yamazaki et al. |
| 5,843,833 A | 12/1998 | Ohtani et al. |
| 5,854,803 A | 12/1998 | Yamazaki et al. |
| 5,858,473 A | 1/1999 | Yamazaki et al. |
| 5,861,337 A | 1/1999 | Zhang et al. |
| 5,869,803 A | 2/1999 | Noguchi et al. |
| 5,899,709 A | 5/1999 | Yamazaki et al. |
| 5,923,962 A | 7/1999 | Ohtani et al. |
| 5,937,282 A | 8/1999 | Nakajima et al. |
| 5,956,579 A | 9/1999 | Yamazaki et al. |
| 5,956,581 A | 9/1999 | Yamazaki et al. |
| 5,960,323 A | 9/1999 | Wakita et al. |
| 6,008,101 A | 12/1999 | Tanaka et al. |
| 6,027,960 A | 2/2000 | Kusumoto et al. |
| 6,048,588 A | 4/2000 | Engelsberg |
| 6,066,516 A | 5/2000 | Miyasaka |
| 6,071,796 A | 6/2000 | Voutsas |
| 6,072,194 A | 6/2000 | Wakita et al. |
| 6,096,581 A | 8/2000 | Zhang et al. |
| 6,124,154 A | 9/2000 | Miyasaka |
| 6,143,661 A | 11/2000 | Kousai et al. |
| 6,162,667 A | 12/2000 | Funai et al. |
| 6,191,848 B1 * | 2/2001 | Armitage .................... 356/213 |
| 6,210,996 B1 | 4/2001 | Yamazaki et al. |
| 6,242,291 B1 | 6/2001 | Kusumoto et al. |
| 6,242,292 B1 | 6/2001 | Yamazaki et al. |
| 6,285,042 B1 | 9/2001 | Ohtani et al. |
| 6,300,176 B1 | 10/2001 | Zhang et al. |
| 6,304,329 B1 | 10/2001 | Nitta et al. |
| 6,323,071 B1 | 11/2001 | Zhang et al. |
| 6,329,269 B1 | 12/2001 | Hamada et al. |
| 6,335,541 B1 | 1/2002 | Ohtani et al. |
| 6,337,259 B1 | 1/2002 | Ueda et al. |
| 6,341,042 B1 | 1/2002 | Matsunaka et al. |
| 6,348,369 B1 | 2/2002 | Kusumoto et al. |
| 6,436,745 B1 | 8/2002 | Gotou et al. |
| 6,444,507 B1 | 9/2002 | Miyasaka |
| 6,451,638 B1 | 9/2002 | Zhang et al. |
| 6,468,842 B2 | 10/2002 | Yamazaki et al. |
| 6,486,437 B2 | 11/2002 | Tanabe |
| 6,517,642 B2 | 2/2003 | Horie et al. |
| 6,528,359 B2 | 3/2003 | Kusumoto et al. |
| 6,534,353 B1 | 3/2003 | Kuramasu et al. |
| 6,559,036 B1 | 5/2003 | Ohtani et al. |
| 6,673,126 B2 | 1/2004 | Miyasaka |
| 6,706,568 B2 | 3/2004 | Nakajima |
| 6,803,296 B2 | 10/2004 | Miyairi |
| 6,855,584 B2 | 2/2005 | Yamazaki et al. |
| 6,906,344 B2 | 6/2005 | Yamazaki et al. |
| 6,998,639 B2 | 2/2006 | Ohtani et al. |
| 7,186,602 B2 * | 3/2007 | Jyumonji et al. ............. 438/166 |
| 2002/0043660 A1 | 4/2002 | Yamazaki et al. |
| 2002/0119609 A1 | 8/2002 | Hatano et al. |
| 2002/0153360 A1 | 10/2002 | Yamazaki et al. |
| 2003/0085894 A1 | 5/2003 | Tatsumi |
| 2003/0139066 A1 | 7/2003 | Kusumoto et al. |
| 2003/0147587 A1 | 8/2003 | Chao et al. |
| 2005/0019997 A1 | 1/2005 | Kusumoto et al. |
| 2005/0112850 A1 | 5/2005 | Yamazaki et al. |
| 2006/0043258 A1 * | 3/2006 | Jyumonji et al. ......... 250/201.4 |
| 2007/0117287 A1 * | 5/2007 | Miyairi ...................... 438/151 |

FOREIGN PATENT DOCUMENTS

| | | |
|---|---|---|
| GB | 2186973 A * | 8/1987 |
| JP | 57-180120 | 11/1982 |
| JP | 58-096883 | 7/1983 |
| JP | 62-021207 | 1/1987 |
| JP | 01-145532 | 6/1989 |
| JP | 01-179315 | 7/1989 |
| JP | 01-246829 | 10/1989 |
| JP | 1-246829 A * | 10/1989 |
| JP | 02-119128 | 5/1990 |
| JP | 02-177422 | 7/1990 |
| JP | 02-224346 | 9/1990 |
| JP | 03-286518 | 12/1991 |
| JP | 05-048190 | 2/1993 |
| JP | 5-115992 A * | 5/1993 |
| JP | 05-226790 | 9/1993 |
| JP | 5-228671 A * | 9/1993 |
| JP | 05-234885 | 9/1993 |
| JP | 05-315278 | 11/1993 |
| JP | 06-302897 | 10/1994 |
| JP | 07-183540 | 7/1995 |
| JP | 08-078329 | 3/1996 |
| JP | 09-102467 | 4/1997 |
| JP | 2001-015435 | 1/2001 |
| JP | 2001-060551 | 3/2001 |
| JP | 2001-077046 A | 3/2001 |
| JP | 2002-093738 | 3/2002 |
| JP | 2003-017411 | 1/2003 |
| JP | 2005-116729 A * | 4/2005 |

OTHER PUBLICATIONS machine translation of Japan Patent No. 5-228,761, Jan. 2010.*
Suga et al. "P-3: The Effect of Laser Annealing Ambient on the Morphology and TFT Performance of Poly-Si Films," SID Digest '00: Sid International Symposium Digest of Technical Papers, 2000, pp. 534-537.
Official Action (U.S. Appl. No. 11/595,965) date Jan. 15, 2008.
"Office Action (Application No. 200610163673.4) Dated Oct. 30, 2009,".

* cited by examiner

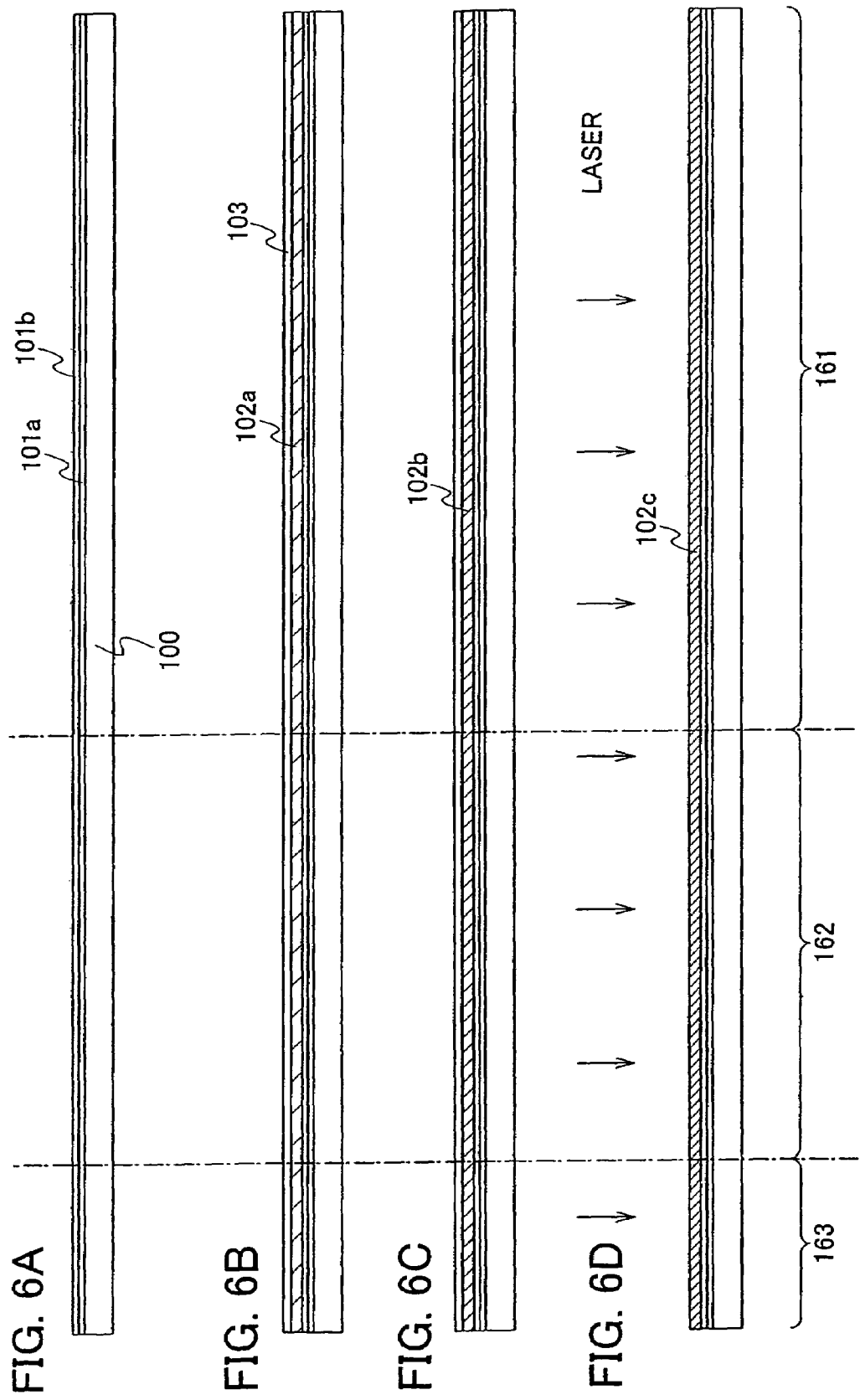

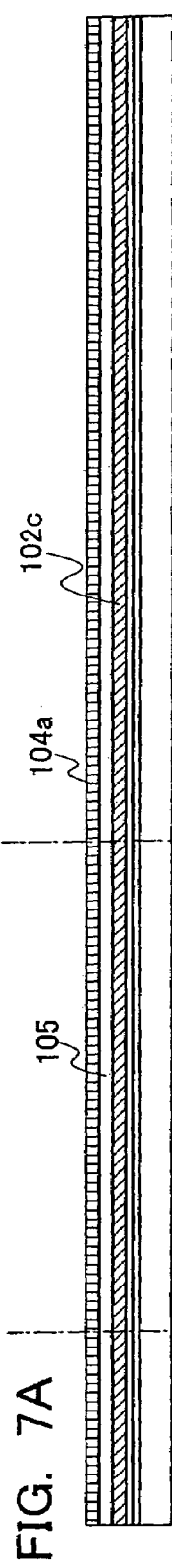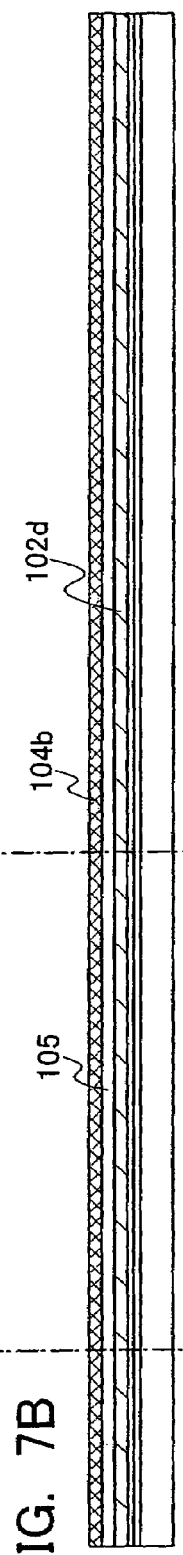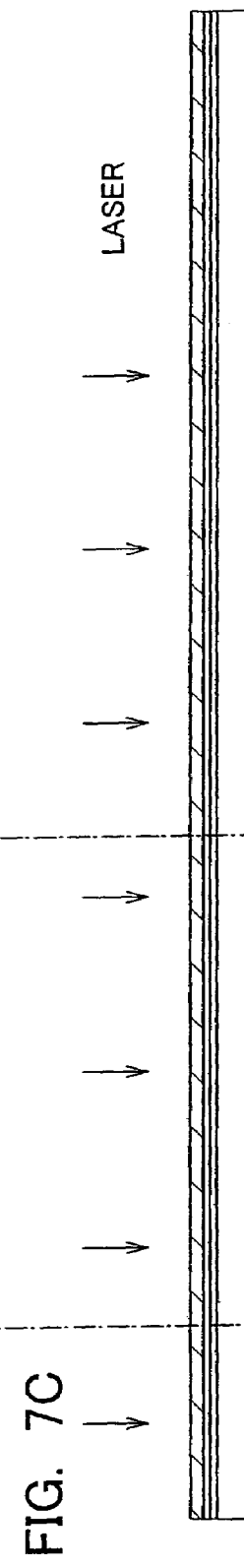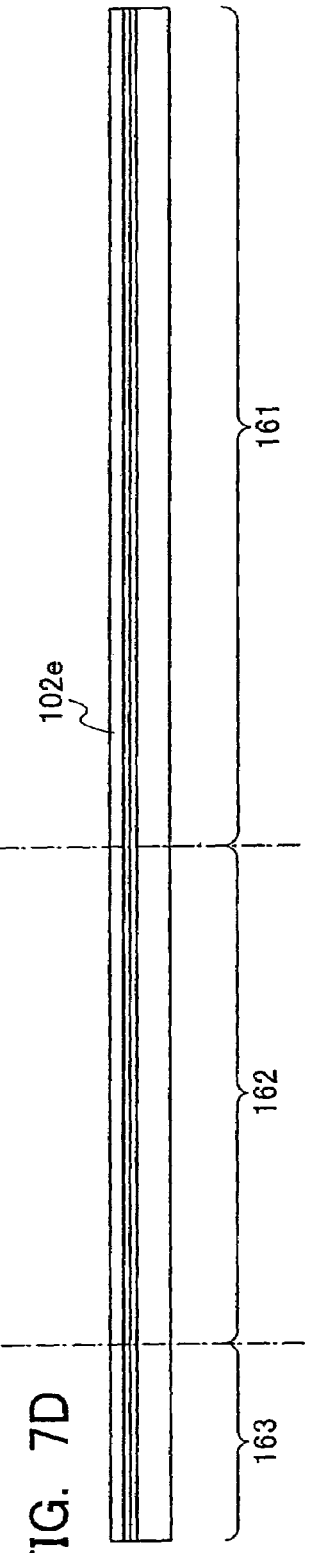

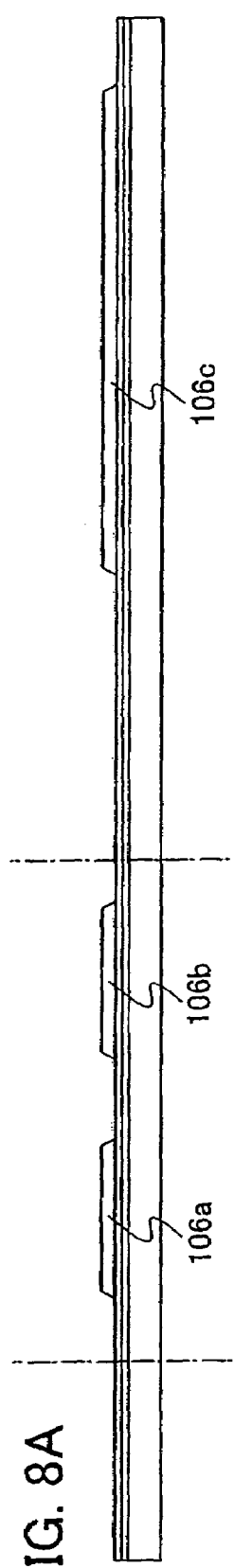
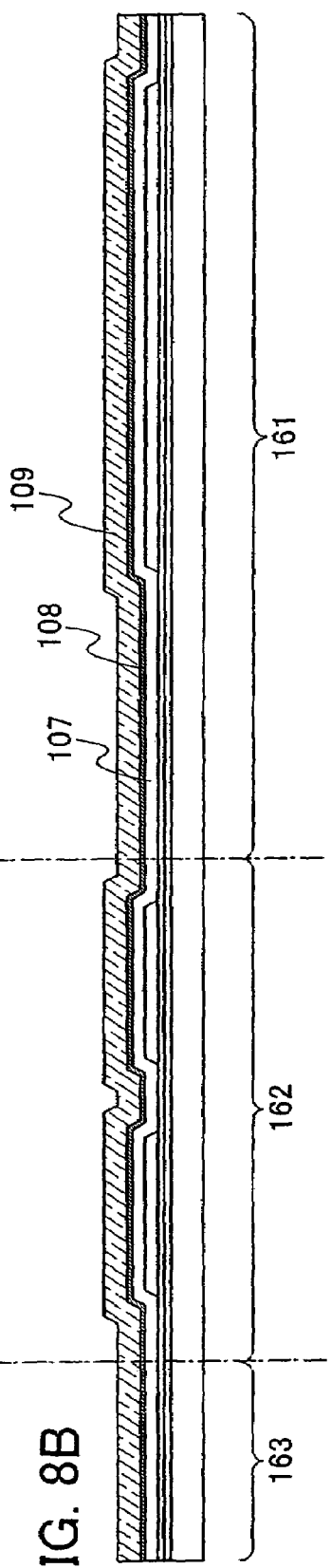

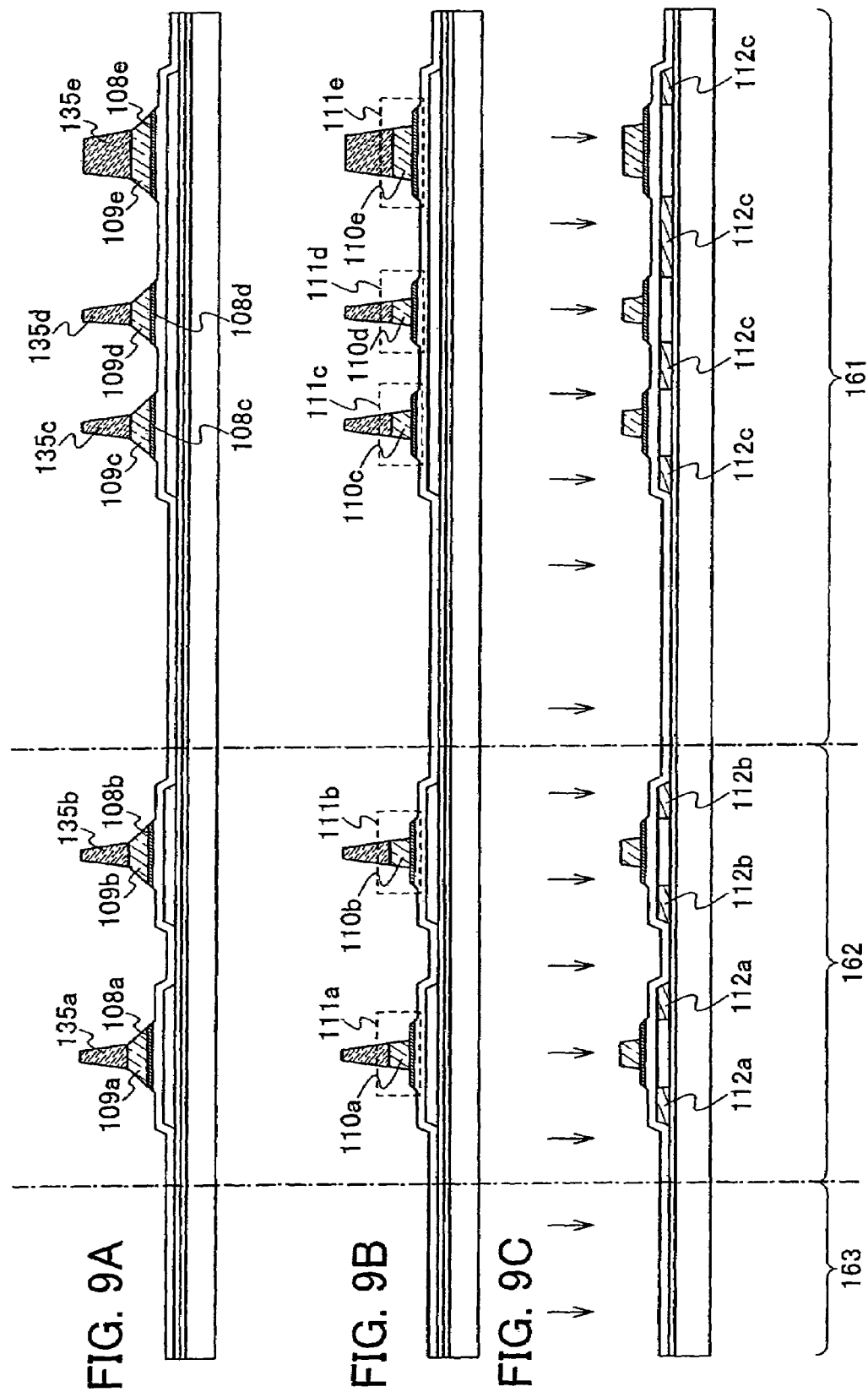

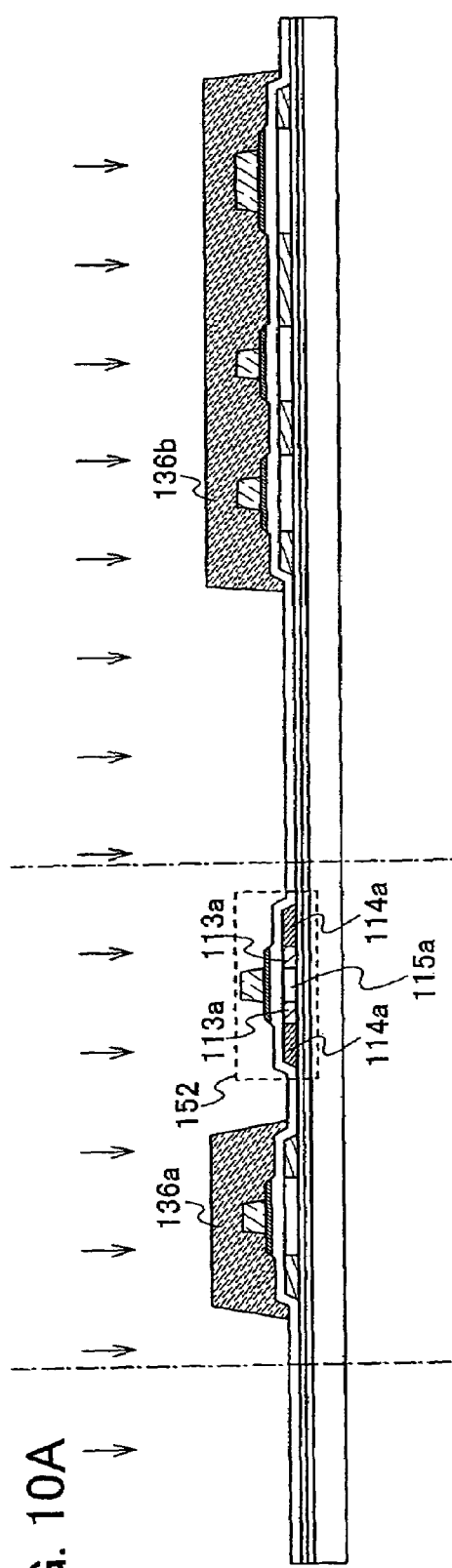
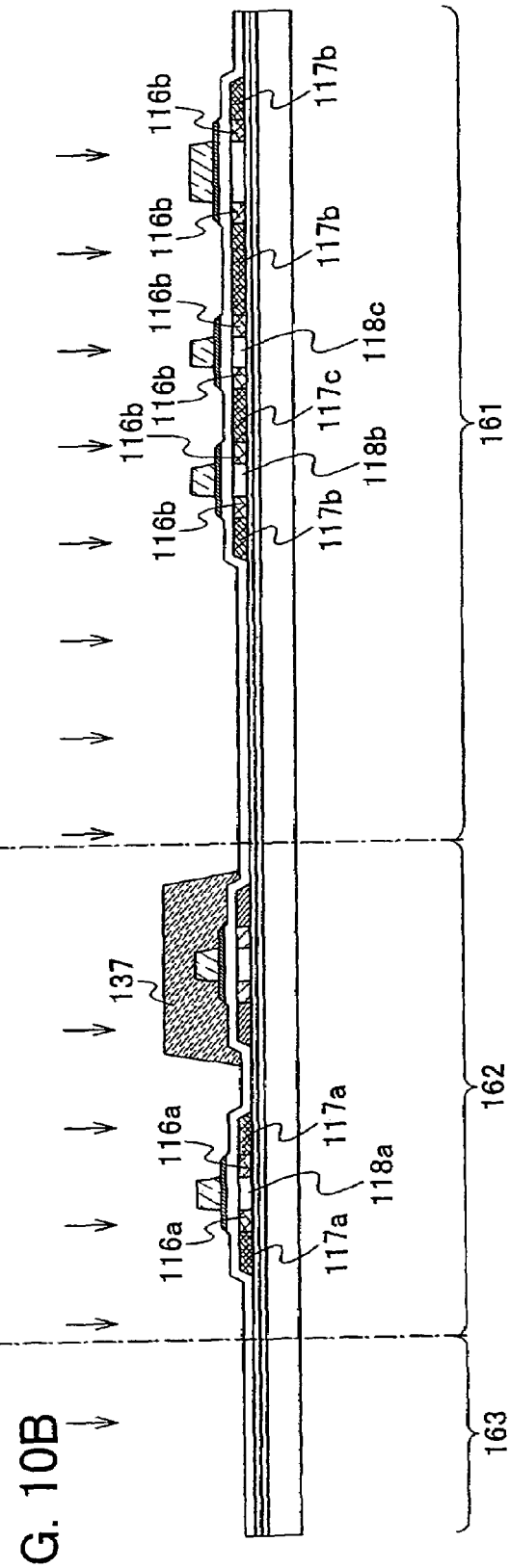

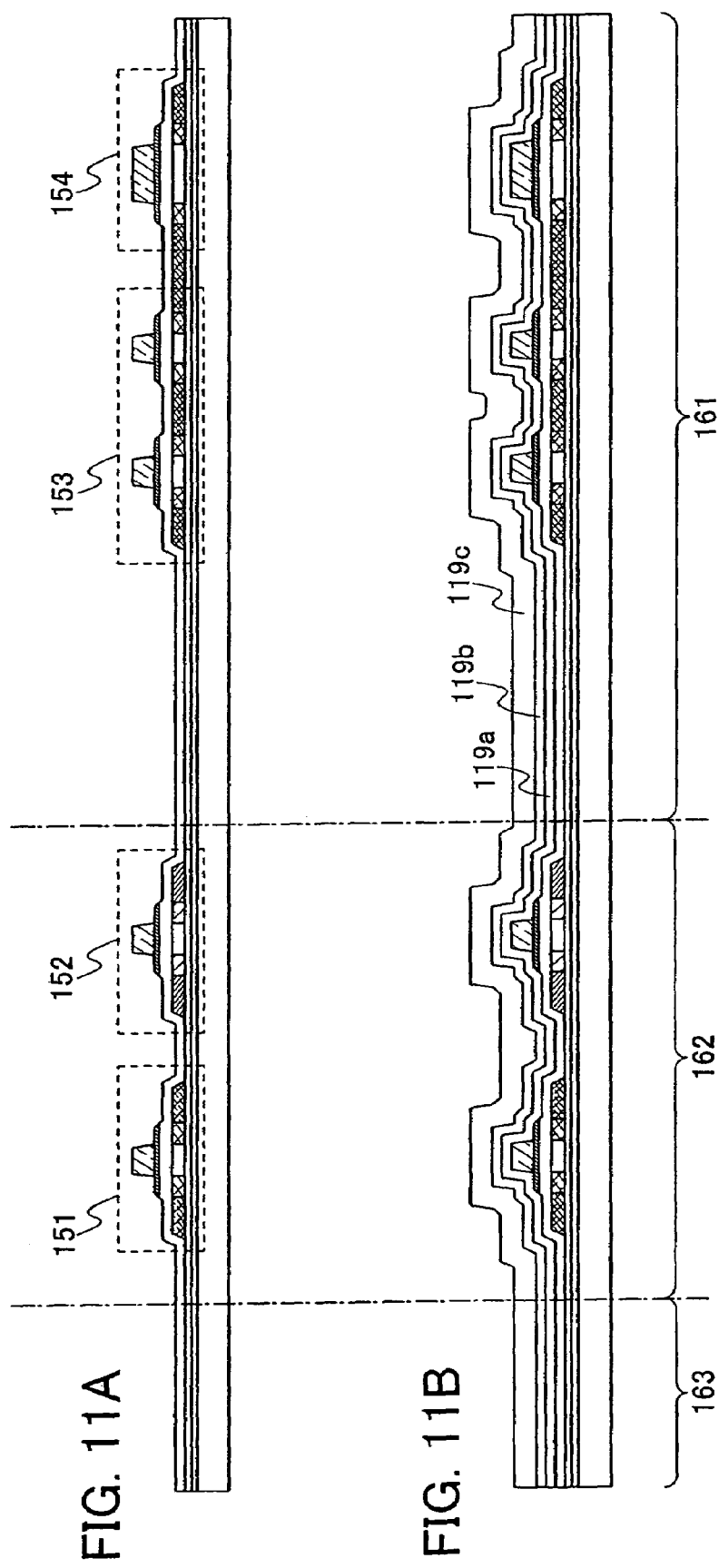

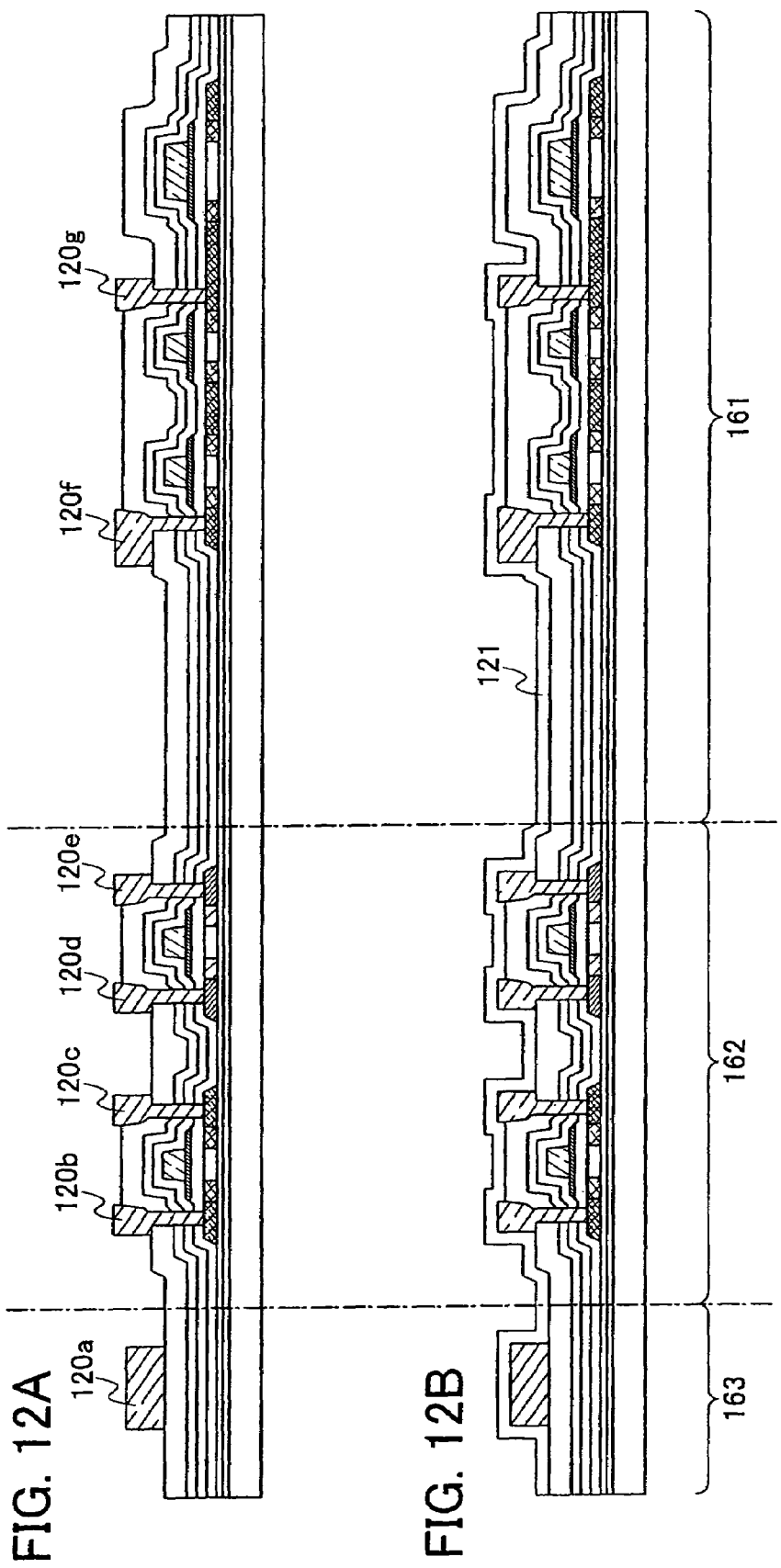

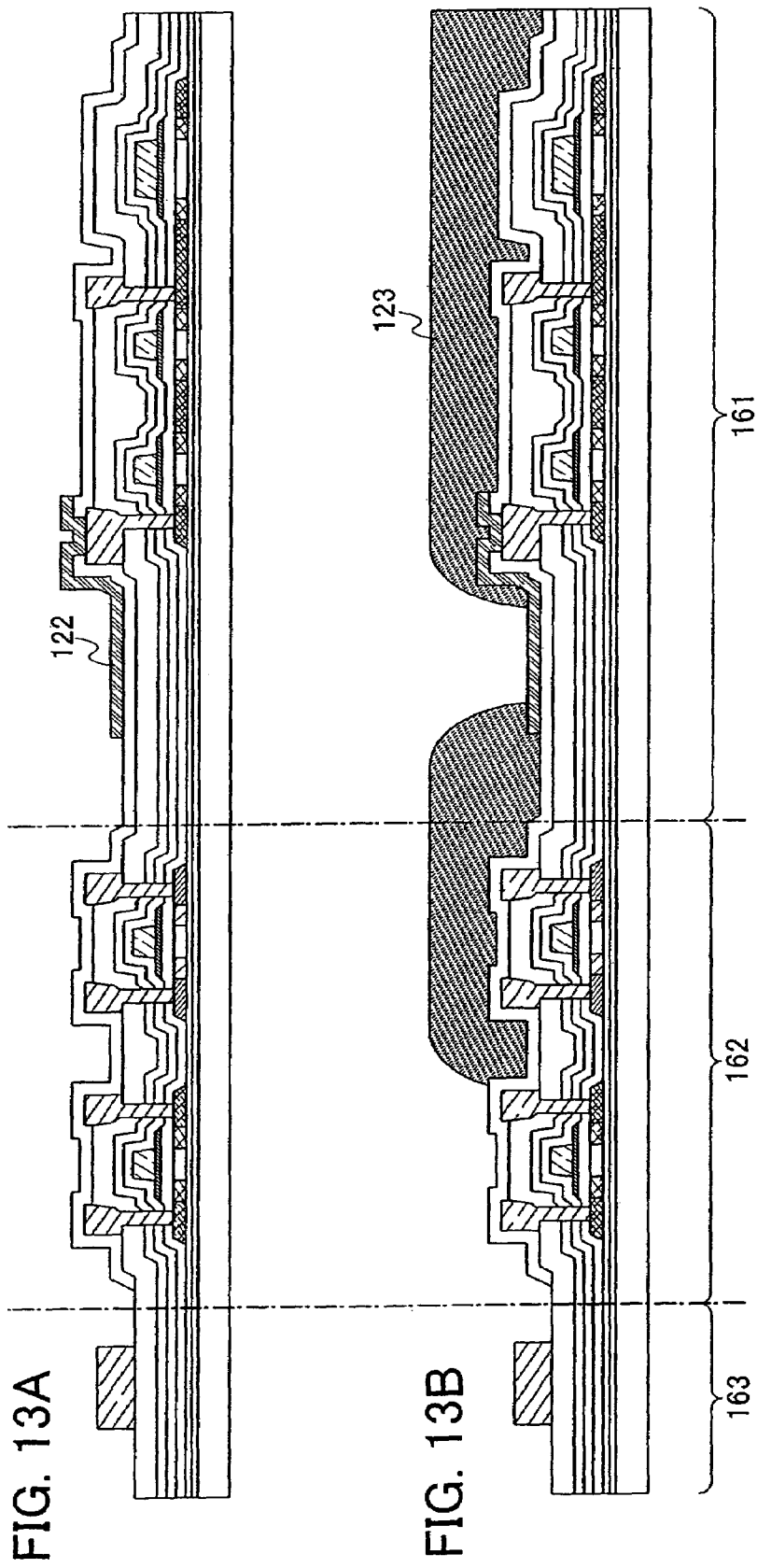

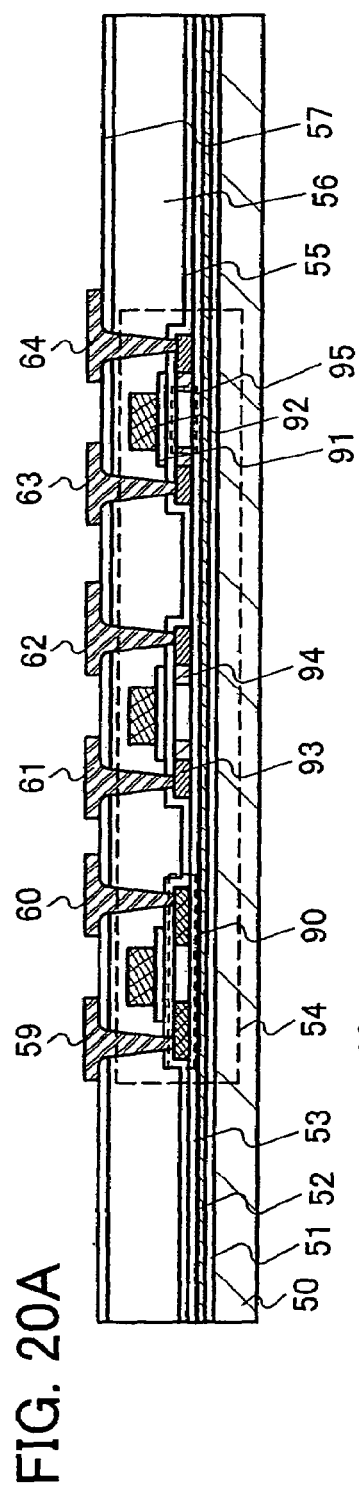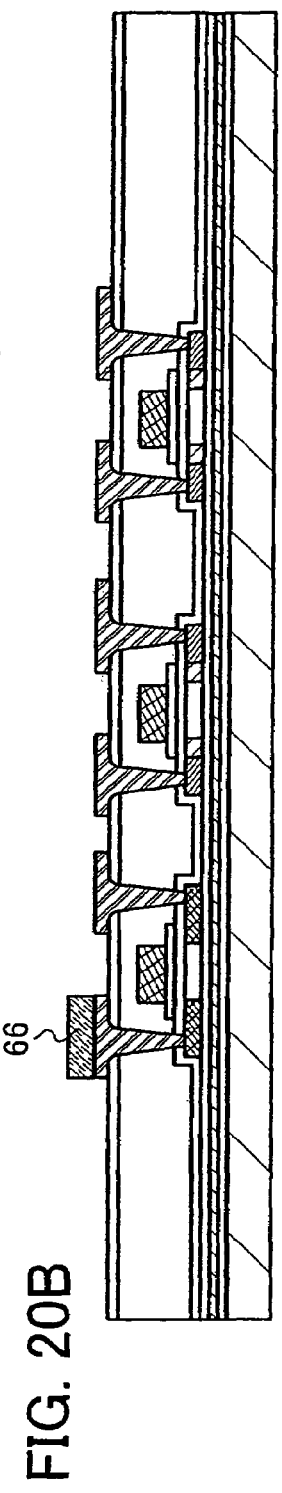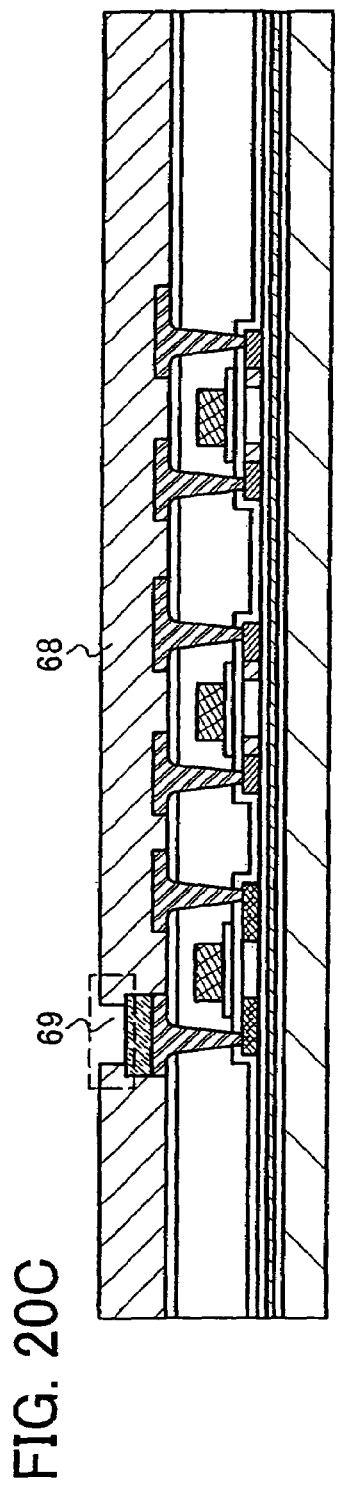

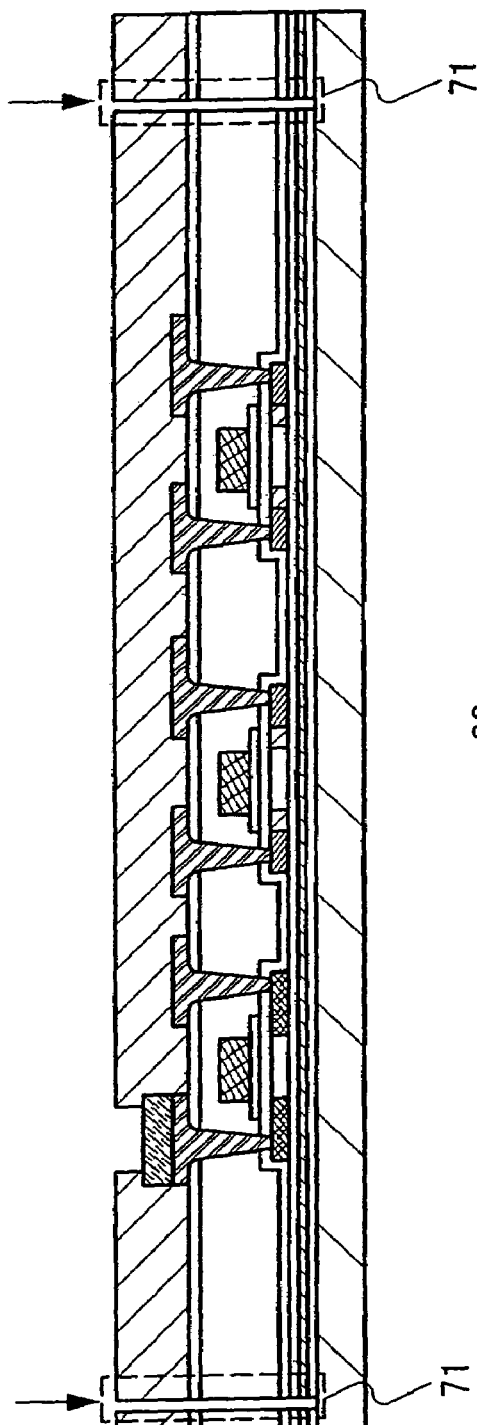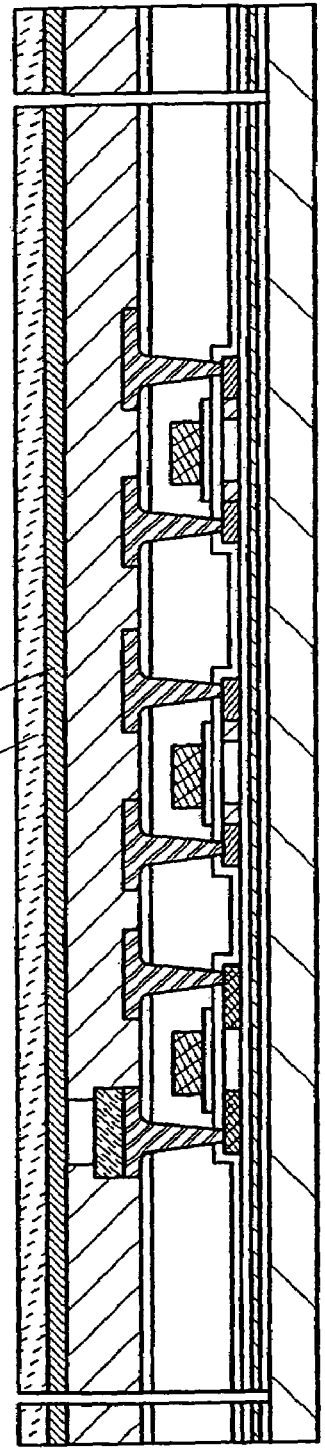
FIG. 21A
FIG. 21B

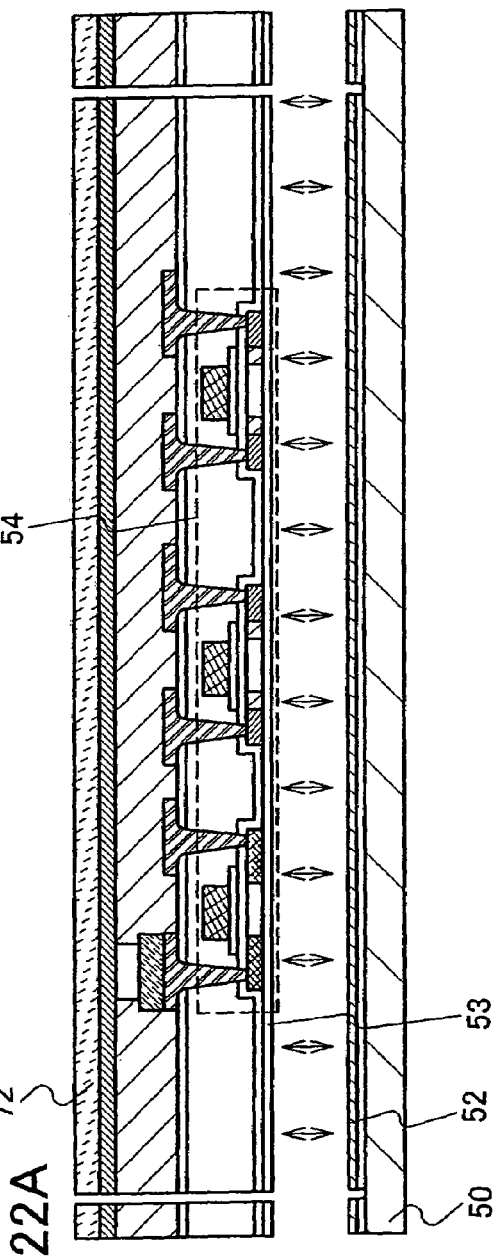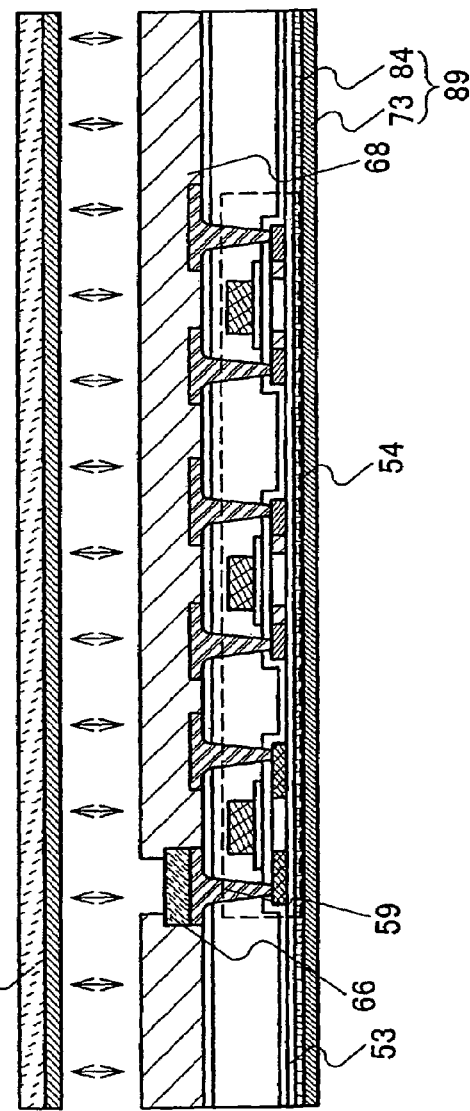

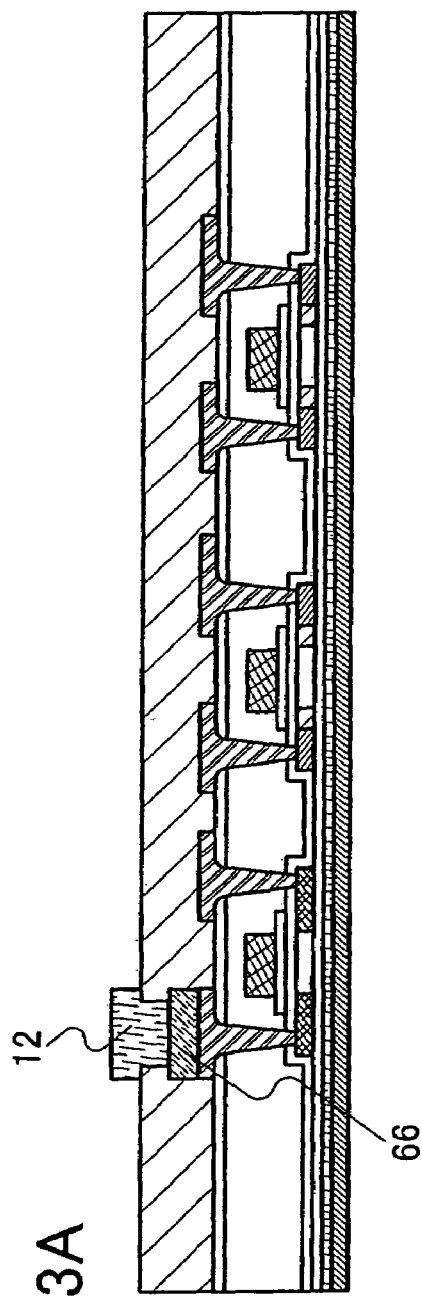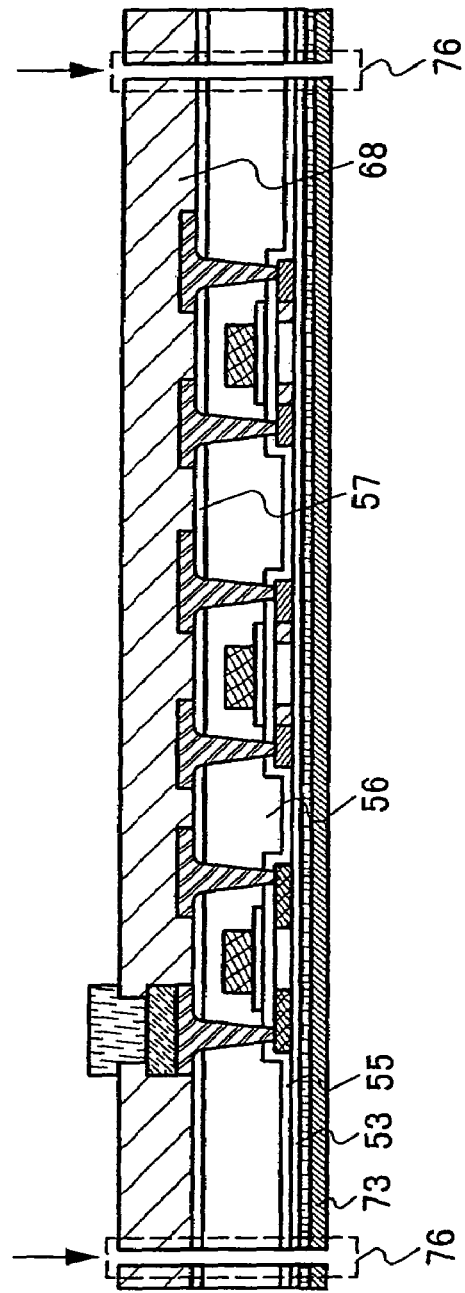
FIG. 23A
FIG. 23B

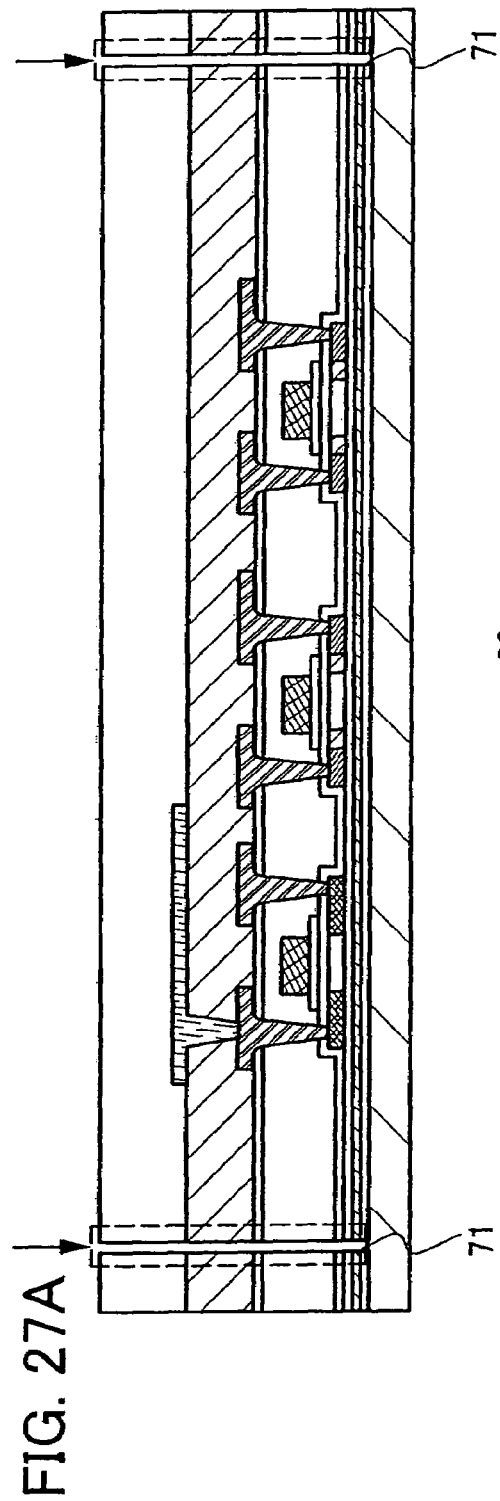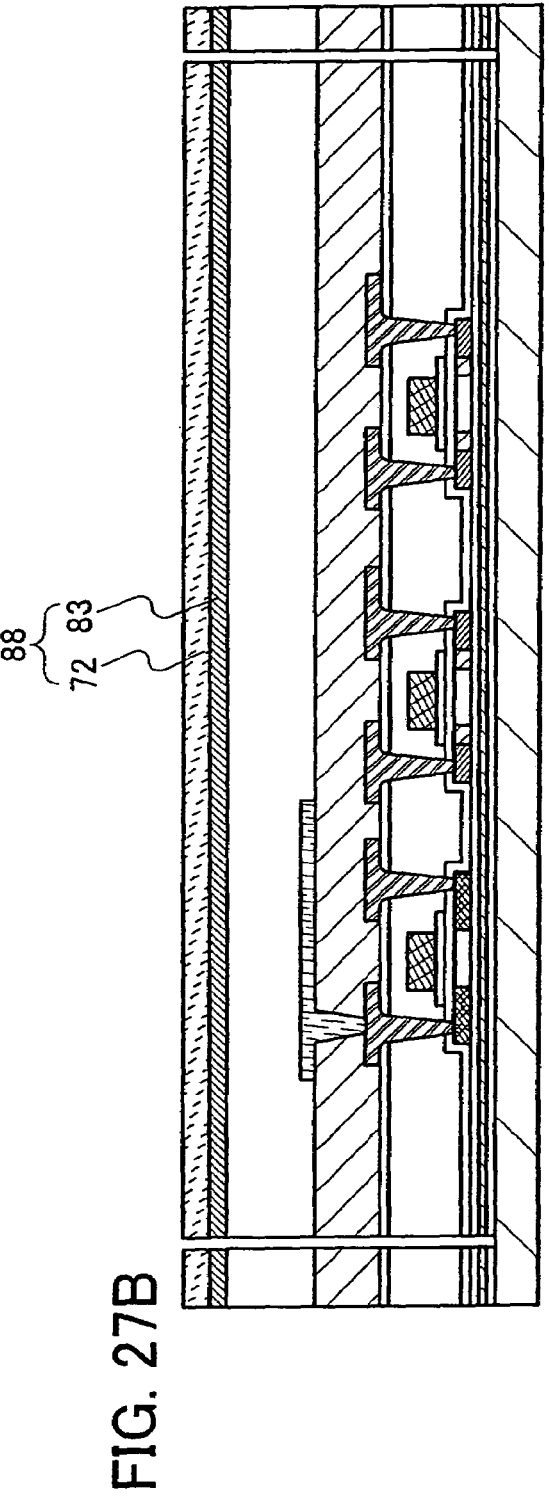
FIG. 27A
FIG. 27B

LASER IRRADIATION APPARATUS

BACKGROUND OF THE INVENTION

1. Field of the Invention

The present invention relates to a laser irradiation apparatus and a method of manufacturing a semiconductor device, including a step of crystallizing a semiconductor film with laser or strong light using a laser apparatus of the invention. The semiconductor apparatus refers to all of devices that can function by using semiconductor properties, for example, an electro-optical device such as a liquid crystal display device, an electric apparatus including an electro-optical device as its component, a light emitting device, and a device which receives/transmits data wirelessly, such as a wireless chip, a wireless IC, an RFID chip, an IC chip, or an IC tag.

2. Description of the Related Art

A technology is widely studied whereby laser irradiation is performed on a semiconductor film formed over an insulating substrate, for the crystallization, the improvement of crystalline characteristics, and/or the activation of a dopant added to the semiconductor film. A silicon film may be often used as the semiconductor film.

A glass substrate is often used as the insulating substrate because it can be processed into a large substrate. Other than the glass substrate, a quartz substrate may be used. However, it is significantly difficult to process a quartz substrate into a large substrate. It is very advantageous to use a glass substrate; however, the melting point of a glass substrate is problematic which is lower compared to that of the quartz substrate. Since a relatively high temperature is required for crystallizing a semiconductor film, there is a problem of deformation of a glass substrate at a time of crystallization. Correspondingly, crystallization using laser irradiation of the semiconductor film was devised in order to overcome the problems. By using laser, it is possible to only increase the temperature of the semiconductor film without increasing the temperature of the glass substrate. Accordingly, laser is preferably used for crystallizing a semiconductor film formed on a material having a low melting point such as a glass substrate or a plastic substrate.

A semiconductor film can be crystallized and/or the crystalline characteristics can be improved by irradiating a semiconductor film with laser. However, during the treatment, the semiconductor film is melted by laser energy and then returns to a solid state again. When it returns to the solid state, the semiconductor film forms innumerable nuclei. Each of the nuclei grows mainly in a direction parallel with a surface of the semiconductor film to form crystal grains. During the growth of the crystal grains, the adjacent crystal grains collide with each other. Thus, very high projecting portions are formed on the semiconductor film. Especially when the semiconductor film is irradiated with laser in an atmosphere containing oxygen, for example, in the atmospheric air, the projecting portion grows significantly and may reach to substantially the same height as the thickness of the semiconductor film. In this way, projections and depressions are formed on the surface of the semiconductor film having been irradiated with laser. Especially when a top gate TFT is manufactured, the surface having the projections and depressions becomes an interface against a gate insulating film. Therefore, the projections and depressions cause variation in device characteristics and/or increase in off current values.

It is known that the growth of the projecting portion can be suppressed significantly if oxygen is removed from the atmosphere for crystallizing the semiconductor film by irradiation with laser. Therefore, laser irradiation for crystallization is often performed in an atmosphere free from oxygen, for example, in a nitrogen atmosphere or in a vacuum. Thus, the projections and depressions of the semiconductor film may be suppressed. However, in order to have the atmosphere of nitrogen or the vacuum for the laser annealing, a rigid vacuum chamber, a vacuum system and/or supply of a large amount of nitrogen are required, which increases the cost.

In order to achieve the objects, an invention was disclosed by which only an atmosphere in close proximity to a semiconductor film irradiated with laser is made to be an atmosphere without oxygen, for example, a nitrogen atmosphere, a rare gas atmosphere, or a hydrogen atmosphere without using a expensive vacuum system, thereby forming an atmosphere locally containing small amount of oxygen (Reference 1: Japanese published patent application No. 2003-017411)

In the above reference, very strong airflow is formed, and a gas not containing oxygen is blown on an area of the semiconductor film which is irradiated with laser light during the laser irradiation. Alternatively, a flat plate capable of blowing a gas not containing oxygen is provided in close proximity to the semiconductor film and the semiconductor film is irradiated with laser light through the plate. In order to reduce the oxygen level to the minimum in the vicinity of the area of the semiconductor film which is irradiated with laser light, the plate blows a gas, so that the plate may be floated in the air above the semiconductor film.

When laser irradiation is performed in the atmosphere without oxygen, the depressions and projections of the surface of the semiconductor film can be reduced. On the other hand, the characteristics of the semiconductor may be deteriorated. In order to solve the problem, a method of irradiating a semiconductor film with first laser light in an atmosphere containing oxygen for crystallization, then removing an oxide film which is formed by the irradiation with the first laser light, and irradiating the semiconductor film with second laser light after that in an atmosphere not containing oxygen thereby reducing depressions and projections of the surface of the semiconductor film, that is, planarizing the surface of the semiconductor film is used. Through those steps, the surface of the semiconductor film can be planarized without large decrease in a current value of a TFT. Accordingly, the problems, especially, increase in an OFF current value can be suppressed.

By using a technology of reducing a time required for crystallizing a semiconductor film having an amorphous structure by adding a minute amount of a metal element such as nickel, palladium, or lead, a semiconductor film can be obtained which has a crystalline structure with good characteristics by performing heat treatment in a nitrogen atmosphere at 550° C. for four hours, for example (Reference 2: Japanese Published Patent Application No. 7-183540). The technology can not only reduce the heating temperature required for the crystallization but also increase the uniformity of the crystal orientation in a single direction. Producing a TFT based on the semiconductor film with such a crystal structure can not only enhance the field-effect mobility but also decrease the subthreshold coefficient (S value). Thus, the electrical characteristics can be improved significantly. When laser irradiation is performed in addition to the heat treatment, the characteristics as a semiconductor film can be improved as compared to a case where one of either heat treatment or laser irradiation is performed for the crystallization. The irradiation may be performed as irradiation with the first laser light and an oxide film formed by the irradiation can be removed. Further, after that, irradiation with the second laser light can be performed. Notably, in order to obtain higher performance, conditions for the heat treatment and the laser irradiation must be optimized.

SUMMARY OF THE INVENTION

However, since the size of a plate for issuing gas used for a conventional laser irradiation apparatus is large, when a measuring probe or a measurement apparatus is placed between a substrate and an optical system through which a laser light lastly passes through, the plate needed to be removed while being exposed to the atmosphere. In addition, the measurement system and the plate for issuing gas interfere with each other, and it has been difficult to balance laser light control with control of laser light irradiation atmosphere. In other words, there have been many operations of checking the state of laser light, and further the arrangement conditions of the plate should have been changed, it has not been easy to perform laser irradiation under controlled laser light irradiation atmosphere. In addition, the size of the plate is large, the total amount of gas flown for stabilizing the interior space of the plate before irradiation with laser light has been large.

It is an object of the present invention to perform laser irradiation under optimum conditions by making the operations simpler than conventional operations of checking the state of laser light.

In order to solve the problems, it is a feature of the present invention to provide means for checking irradiation status of laser between the plate and a lens through which the laser lastly passes through. Further, in order to provide the means for checking irradiation status of laser between the plate and a lens through which the laser lastly passes through, the size of the plate is miniaturized compared to a conventional plate.

It is a feature of the invention that a laser oscillator, an optical system shaping laser light produced by the laser oscillator, a plate having an opening for issuing a gas, a stage provided below the blower, means for maintaining a constant distance between the blower and the stage, and means provided between the optical system and the blower for observing the laser light transmitted through the optical system are provided.

It is a feature of the invention that a laser oscillator, an optical system shaping laser light produced by the laser oscillator, a plate having an opening for issuing a gas and a window transparent to the laser light shaped by the optical system, a stage provided below the plate, means for maintaining a constant distance between the plate and the stage, and means provided between the optical system and the plate for observing the laser light transmitted through the optical system are provided.

It is a feature of the invention that a laser oscillator, an optical system shaping laser light produced by the laser oscillator, a plate having an opening for issuing a gas, a stage provided below the plate, means for maintaining a constant distance between the plate and the stage, and means provided between the optical system and the plate for observing a shape or a focal point of the laser light transmitted through the optical system are provided.

It is a feature of the invention that a laser oscillator, an optical system shaping laser light produced by the laser oscillator, a plate having an opening for issuing a gas, a stage provided below the plate, means for maintaining a constant distance between the plate and the stage, and means provided between the optical system and the plate for observing energy of the laser light transmitted through the optical system are provided.

It is a feature of the invention that a laser oscillator, an optical system shaping laser light produced by the laser oscillator, a plate having an opening for issuing a gas, a stage provided below the plate, means for maintaining a constant distance between the plate and the stage, means provided between the optical system and the plate for observing a shape or a focal point of the laser light transmitted through the optical system, and means provided between the optical system and the plate for observing energy of the laser light transmitted through the optical system are provided.

It is a feature of the invention that in a laser irradiation apparatus having the above structure, the means for observing the shape or the focal point of the laser light includes an ND filter and a CCD camera.

It is a feature of the invention that in a laser irradiation apparatus having the above structure, the means for observing the energy of the laser light has a power meter.

It is a feature of the invention that in a laser irradiation apparatus having the above structure, the gas is an inert gas.

It is a feature of the invention that in a laser irradiation apparatus having the above structure, the plate contains a light-transmitting material.

Since a smaller plate is used in a laser irradiation apparatus of the invention as compared to that of a conventional one. Unlike a conventional irradiation apparatus, measurement can be conducted without removing the plate from the irradiation apparatus while being exposed to the atmosphere when a measurement apparatus is arranged under an optical. In other words, measurement of conditions of laser light irradiation can be simplified compared to a conventional laser irradiation apparatus. Therefore, time involved in measurement of laser light can be reduced. Further, since the space occupied by the interior of the plate is made smaller, the total amount of gas flown before laser irradiation can be reduced and the time of flowing gas before laser irradiation can be reduced. In addition, by using the laser irradiation apparatus of the invention, laser irradiation can be performed under a stable laser irradiation atmosphere; accordingly, variations in characteristics of TFTs can be reduced, and the characteristics of the TFTs can be improved.

In addition, when a laser irradiation apparatus of the invention is used, an expensive chamber which can withstand high pressure is not necessarily used, so that reduction in cost of an apparatus can be achieved.

BRIEF DESCRIPTION OF DRAWINGS

In the accompanying drawings;

FIGS. 6A to 6D are figures illustrating a manufacturing method of a semiconductor device;

FIGS. 7A to 7D are figures illustrating a manufacturing method of a semiconductor device;

FIGS. 8A and 8B are figures illustrating a manufacturing method of a semiconductor device;

FIGS. 9A to 9C are figures illustrating a manufacturing method of a semiconductor device;

FIGS. 10A and 10B are figures illustrating a manufacturing method of a semiconductor device;

FIGS. 11A and 11B are figures illustrating a manufacturing method of a semiconductor device;

FIGS. 12A and 12B are figures illustrating a manufacturing method of a semiconductor device;

FIGS. 13A and 13B are figures illustrating a manufacturing method of a semiconductor device;

FIGS. 20A to 20C are figures illustrating a manufacturing method of a semiconductor device;

FIGS. 21A and 21B are figures illustrating a manufacturing method of a semiconductor device;

FIGS. 22A and 22B are figures illustrating a manufacturing method of a semiconductor device;

FIGS. 23A and 23B are figures illustrating a manufacturing method of a semiconductor device;

FIGS. 27A and 27B are figures illustrating a manufacturing method of a semiconductor device;

DETAILED DESCRIPTION OF THE INVENTION

Embodiment Modes

Figure 1:
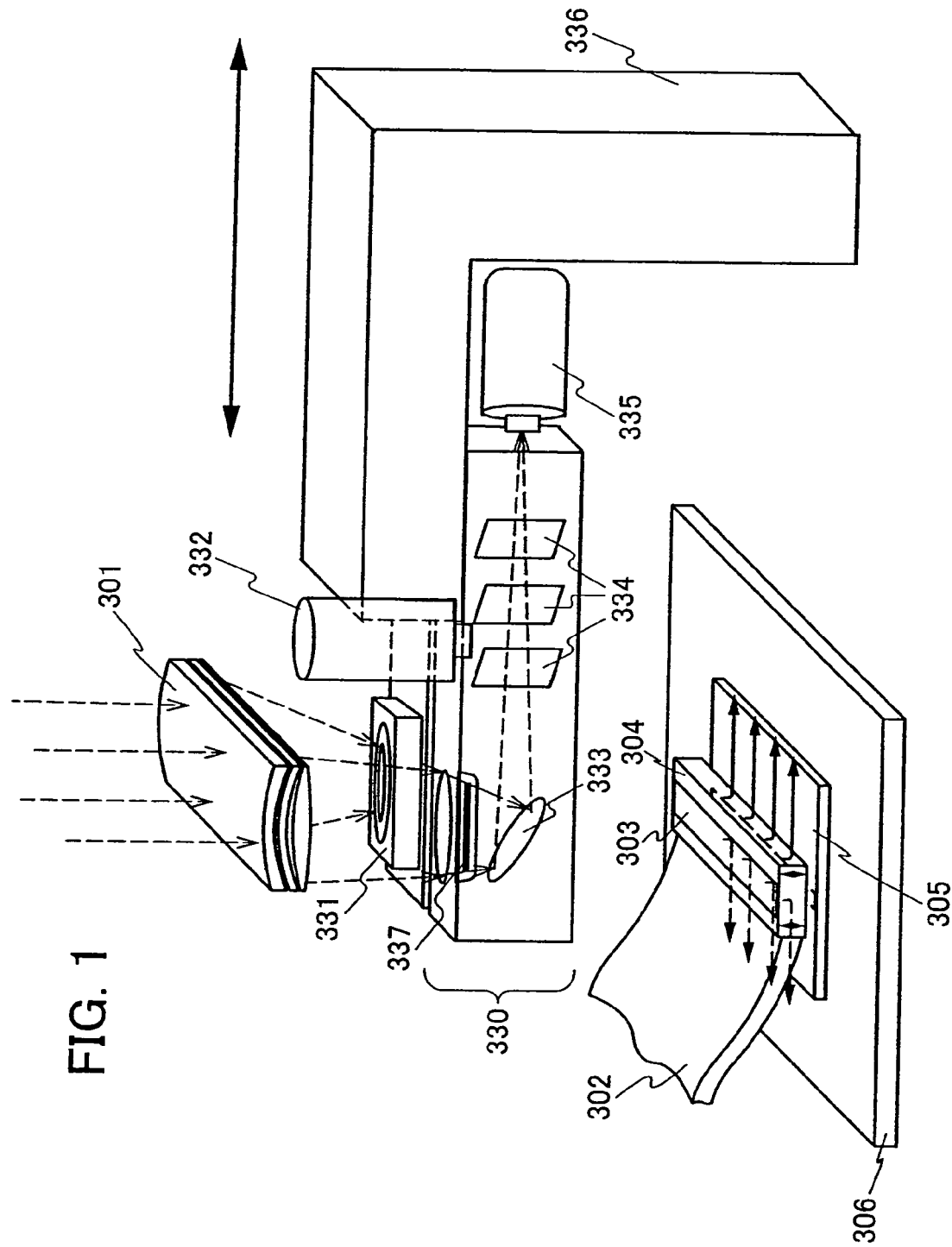
FIG. 1 is a figure illustrating an irradiation apparatus of the invention.

Embodiment Modes of the present invention will be described in detail with reference to the drawings. It is to be noted that the present invention is not limited to the following description, and it is easily understood by those skilled in the art that modes and details thereof can be modified in various ways without departing from the sprit and the scope of the invention. Therefore, the present invention should not be construed as being limited to the description of the embodiment modes to be given below. Further, in a structure of the present invention, which will be described below, the same reference numerals are used for the same portions or portions having the same functions in different drawings.

Embodiment Mode 1

Embodiment Mode 1 of the present invention will be described with reference to FIG. 1 and FIG. 2.

Figure 2:
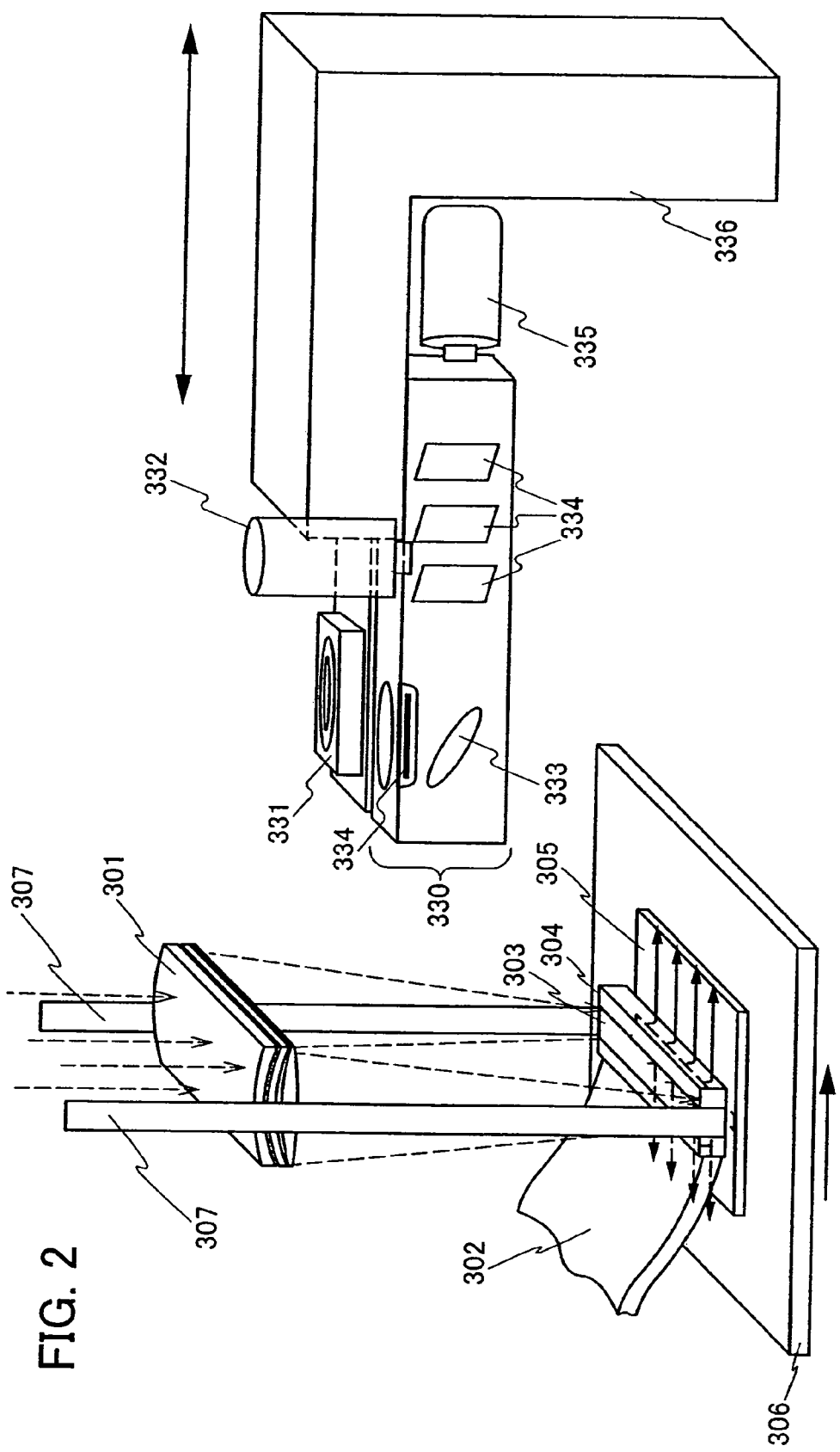
FIG. 2 is a figure illustrating an irradiation apparatus of the invention.

FIG. 1 and FIG. 2 each show an example of a laser irradiation apparatus of the invention. It is a feature that an irradiation apparatus of this embodiment mode includes a laser oscillator (not shown) for oscillating laser; an optical system for shaping a laser light, a plate for issuing gas onto a substrate surface; and a unit making it possible to monitor shape, the focal point, and energy of a laser light, which is provided between the optical system and the plate.

As a device making it possible to monitor shape, the focal point, and energy of a laser light, specifically, a power meter 331 measuring energy of laser light focused through an optical system and a beam profiler 330 used for checking the focal point and the shape of the focused laser light. In addition, the power meter 331 and the beam profiler 330 are held by the fixture 336. Optical systems other than a triplet cylindrical lens 301 that is used as the last lens are omitted here (FIG. 2). Further, the triplet cylindrical lens 301 is fixed with a supporting mechanism (not shown).

The beam profiler 330 includes an ND (Neutral Density) filter 337 for dimming focused laser light, a mirror 333 for reflecting laser light passed through the ND filter 337, ND filters 334 for dimming the laser light reflected by the mirror 333, and a CCD camera 335 for checking the shape and the focal point of the laser light passed through the ND filters 334.

For the ND filters 334 and 337, a type of controlling the amount of light by changing reflectance, or another type of controlling the amount of light by absorbing light may be used. In addition, three ND filters 334 are used here; however, the number is not limited thereto, and can be suitably selected. Further, the CCD camera 335 is used to check the shape and the focal point of laser light; however, it is not limited thereto, and any device can be used as long as the shape and the focal point of laser light can be checked by using it. Further, as shown in the drawing, a CCD camera 332 may be provided to monitor the substrate surface.

Note that the distance between the lens which laser light lastly passes through and the CCD camera 335 for checking the shape and the focal point of the laser light is made to be equal to the distance between the substrate to be irradiated with light and the lens which laser light lastly passes.

In the case of observing energy, shape, or the like of laser light, the fixture 336 may be moved to a place where the laser light passed through the triplet cylindrical lens 301 enters the beam profiler 330 and the power meter 331.

The case of irradiating a substrate 305 with laser light will be described with reference to FIG. 2. In the case of shining laser light onto the substrate 305, the fixture 336 is backed to be arranged in a position so that the laser light can be shone through a window 303 (FIG. 2). The substrate 305 is disposed on a stage 306. Then, nitrogen is, for example, supplied to the plate 304 for supplying gas from a gas supply pipe 302, and nitrogen is issued. The plate 304 supported by a supporting mechanism 307 is disposed immediately above the substrate 305, and the distance between the plate 304 and the stage (substrate) is fixed at a certain length. Note that the plate 304 may be floated over the substrate 305 by nitrogen issued from the plate. The supporting mechanism 307 supporting the plate 304 is not completely secured to the plate 304 so that the plate 304 can float. Note that the gas may be supplied when stabilizing the interior space of the plate before shining laser light and when shining light.

In a state where the plate 304 is disposed immediately above, laser light is collected in a linear shape, for example by the triplet cylindrical lens 301, and shone onto the substrate 305 through the window 303 which transmits laser light. The stage 306 is operated in a direction of the arrow in the figure, that is, a direction perpendicular to the lengthwise direction of the linear beam to irradiate the whole semiconductor film with the laser light. The window 303 is preferably a quartz window because transmittance of laser light through quartz is high. Through this process, an atmosphere of the vicinity of a part of the substrate 305 that is subjected to the laser light can be made to be substantially nitrogen atmosphere.

As to an optical system for collecting laser light, for example, the triplet cylindrical lens 301 shown in FIG. 1 and FIG. 2 is preferably used to collect laser light in a linear shape achieving high laser efficiency. The triplet cylindrical lens is a lens including three lenses for reducing spherical aberration. In the present invention, a singlet cylindrical lens (having one lens), a doublet cylindrical lens (having two lenses), or the like may be used. In order to obtain a beam with more uniform energy distribution at a semiconductor film surface, it is natural that a lens with less spherical aberration is preferably used.

Note that after the substrate 305 is disposed, the shape, focal point, and energy of laser light can be checked while gas is issued from the plate 304. In other words, as to a laser irradiation apparatus of the invention, conditions of the shape, focal point, energy of laser light, or the like can be checked even while a substrate is irradiated with laser.

As described above, since a smaller plate is used in a laser irradiation apparatus of the invention as compared to that of a conventional one. Unlike a conventional irradiation apparatus, measurement can be conducted without removing the plate from the irradiation apparatus while being exposed to the atmosphere when a measurement apparatus is arranged under an optical. In other words, measurement of conditions of laser light irradiation can be simplified compared to a conventional laser irradiation apparatus. Therefore, time involved in measurement of laser light can be reduced. Further, since the space occupied by the interior of the plate is made smaller, the total amount of gas flown before laser irradiation can be reduced and the time of flowing gas can be reduced. In addition, by using the laser irradiation apparatus of the invention, laser irradiation can be performed under a stable laser irradiation atmosphere; accordingly, variations in characteristics of TFTs can be reduced, and the characteristics of the TFTs can be improved.

Embodiment Mode 2

In this embodiment mode, an example of the structure of a plate for issuing gas will be described with reference to FIGS. 3A and 3B.

Figure 3A:
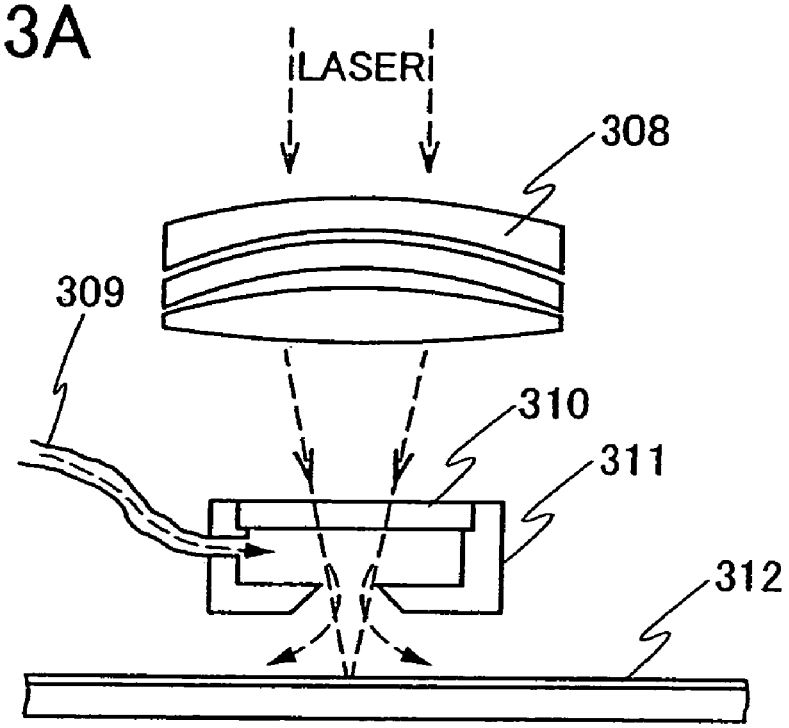
FIGS. 3A and 3B are figures illustrating irradiation apparatuses of the invention.

FIG. 3A shows an example of a plate for spray gas. A gas is supplied from a gas supply pipe 309 to the plate formed from a quartz window 310 and an aluminum alloy 311, and the gas is issued from a slit like hole provided at the bottom of the aluminum alloy. In this state, the plate is disposed immediately above a semiconductor film 312, and the distance between the plate and the semiconductor film is fixed at a certain length. Note that the plate may be floated bay the pressure of the issued gas. Note that although not shown in FIG. 3A, a supporting mechanism for stabilizing the position of the plate as the supporting mechanism 307 shown in FIG. 2 is necessarily provided. Using such a mechanism, the distance between the plate and the semiconductor film 312 can be fixed in a stable state. As shown as an example in the figure, a triplet cylindrical lens 308 is used to collect laser light in a linear shape. Thus, higher energy density can be obtained by focusing laser light onto the semiconductor film 312.

The quartz window 310 is provided to transmit laser light. The hole provided at the bottom of the aluminum alloy has functions of an opening used for issuing a gas and of transmitting laser light. Since the aluminum alloy used to obtain a lighter plate, another material may be used for forming the plate.

Figure 3B:
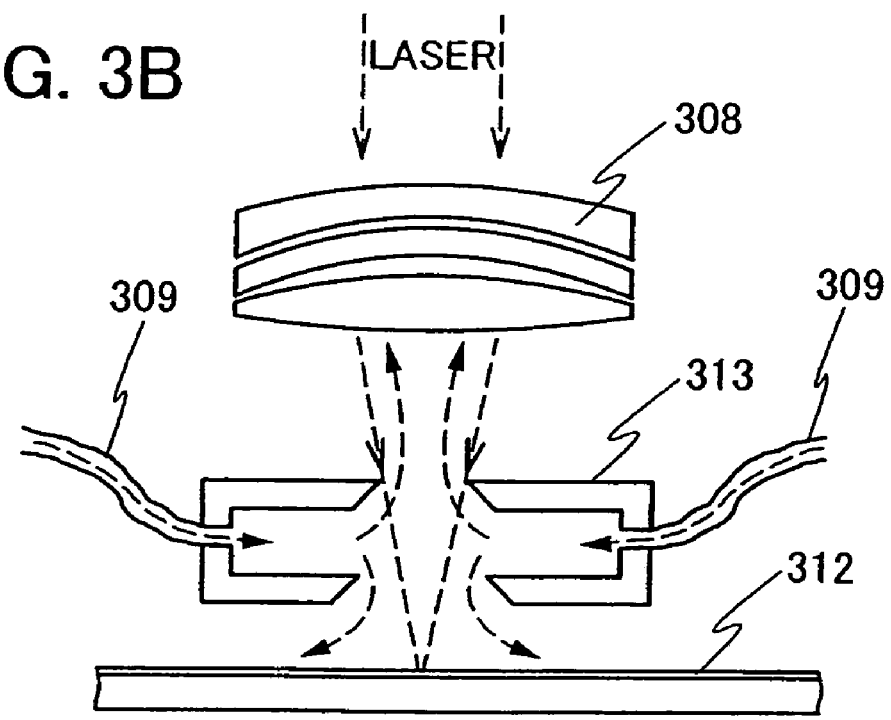

FIG. 3B shows another example of a plate for issuing gas. An inert gas, for example, nitrogen or the like is supplied as a gas from a gas supply pipe 309 to the plate formed from an aluminum alloy 313, and the gas is issued from the slit like hole provided at the bottom of the aluminum alloy. Gas supply pipes are preferably arranged on either side of the plate as shown in the figure so as to obtain a symmetrical structure with which a gas can be supplied more stably. Note that this structure may be replaced by the structure shown in FIG. 3A. In this state, the substrate is disposed immediately above the semiconductor film 312 so as to fix the distance between the semiconductor film and the plate at a certain length. Note that the plate may be floated by the pressure of issuing nitrogen. Since slit like holes are provided at the top and the bottom of the plate, nitrogen is issued from the slit of the top and the bottom of the plate. Nitrogen issued downward from the plate is also used for floating the plate. Nitrogen issued upward from the plate is blown onto an optical element, in this embodiment mode, the triplet cylindrical lens 308, so that dust can be prevented from attaching the triplet cylindrical lens. Note that the gas may be supplied when stabilizing the interior space of the plate before shining laser light and when shining light.

Note that although not shown in FIG. 3B, a supporting mechanism for stabilizing the position of the plate as the supporting mechanism 307 shown in FIG. 2 is necessarily provided. Using such a mechanism, the distance between the plate and the semiconductor film 312 can be fixed in a stable state. Thus, in a state where the plate is stabilized over the semiconductor film 102, the distance between the plate and the semiconductor film can be fixed. In an example of the figure, a triplet cylindrical lens 308 is used to collect laser light in a linear shape. Thus, higher energy density can be obtained by focusing laser light onto the semiconductor film 102.

In the example of FIG. 3B, the slits are provided at the top and the bottom of the plate, laser light may be transmitted through the both slits. An aluminum alloy is used for the plate in order to reduce weight; accordingly, another material can be used.

Note that the case of using an inert gas as a gas used in this embodiment mode for a gas has been described; however, the gas is not limited thereto. Accordingly, oxygen containing gas or a mixed gas of nitrogen and oxygen may be used instead.

Embodiment Mode 3

Figure 4A:
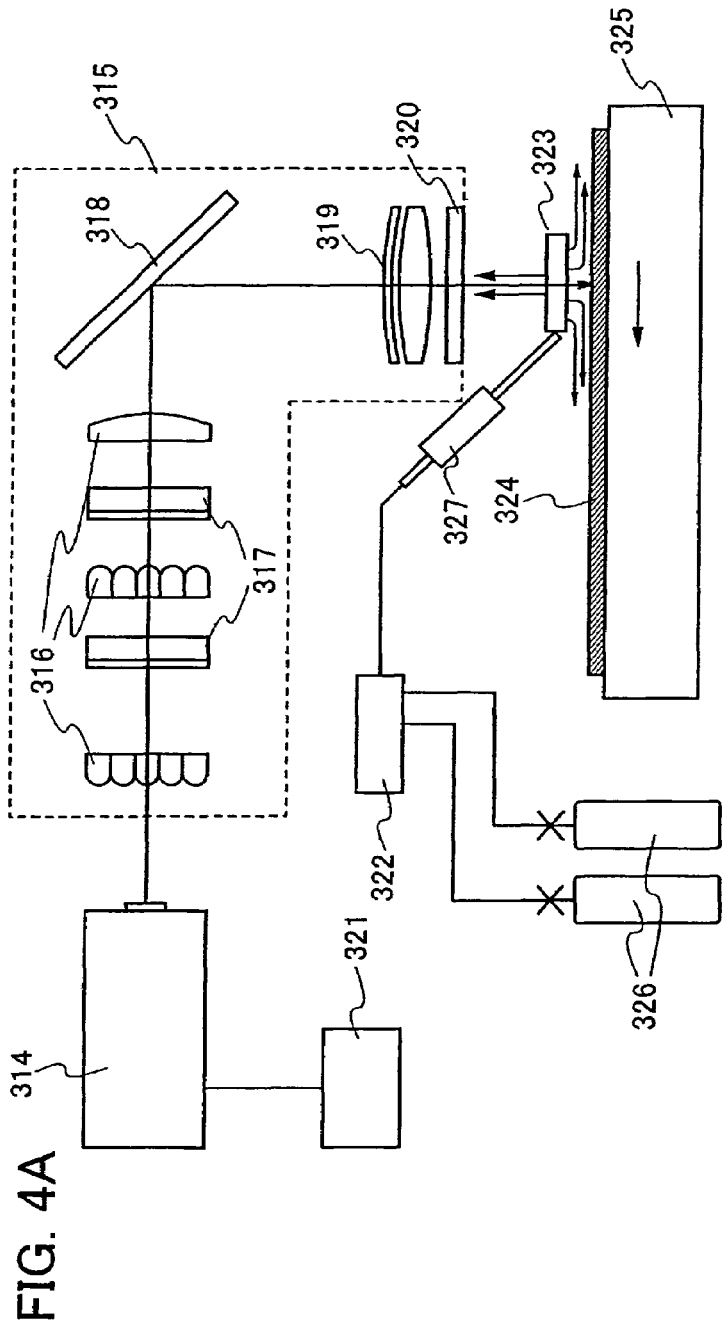
FIGS. 4A and 4B are figures illustrating an irradiation apparatus of the invention.

In this embodiment mode, an example of implementing the present invention in a mass production process will be described with reference to FIGS. 4A and 4B.

An optical system 315 for forming a linear beam will be explained. The optical system 315 has a homogenizing mechanism for obtaining a linear beam having uniform energy distribution at an irradiated surface. In optical elements 316, a cylindrical lens arrays and a cylindrical lens are combined to homogenize the widthwise energy distribution of a linear beam. As shown in FIG. 4A, two cylindrical lens arrays may be used to make the width of the linear beam variable. In order to change the width of the linear beam, the distance from the cylindrical lens arrays may be changed. Further, optical elements 317 homogenize the lengthwise energy distribution of the linear beam by similarly combining the cylindrical lens arrays and the cylindrical lens.

Figure 4B:
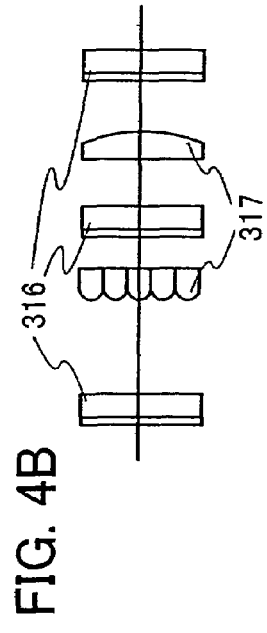

FIG. 4B shows the optical elements 316 and 317. In the figure, the optical elements 317 have one cylindrical lens array; however, two cylindrical lens arrays may be used to make the length of the linear beam variable. The mirror 318 has a function of bending in a vertical direction laser light traveling in a horizontal direction (FIG. 4A). Thus, a linear beam can be formed on a horizontal surface, so that the semiconductor film to be irradiated can be arranged horizontally. The width of the linear beam may be made further shorter using a doublet cylindrical lens 319 to obtain higher energy density at the irradiated surface. Thus, the length of the linear beam can be made longer, so that even a large area substrate can be efficiently irradiated with laser light. The atmosphere around a part of the semiconductor film that is to be irradiated with laser light may be separated from the atmosphere of the optical system 315 by surrounding the optical system 315 with a partition and providing a quartz window 320 for transmitting the laser light. For example, by purging nitrogen from the optical system 315, the deterioration of the optical system can be suppressed.

Next, a process of irradiating the semiconductor film with laser light will be described. The substrate 324 is disposed over a stage 325 using a robotic arm which is not shown or the like. After that, nitrogen is supplied to a plate for issuing gas, by a gas supply device 322 connected to a nitrogen supply source 326, and nitrogen is issued at a suitable flow rate from the plate 323. Next, the plate 323 is disposed immediately above the semiconductor film, and the distance between the plate and the stage (semiconductor film) is fixed at a certain length. Note that the plate may be floated above the semiconductor film by issuing of nitrogen. When nitrogen gas is heated by a heating device 327, lack of laser energy can be complemented. This state is maintained while shining laser light and moving the stage 325 in a direction perpendicular to the lengthwise direction of the linear beam, thereby irradiating the semiconductor film with the laser light. A laser oscillator 314 is controlled by a controller 321, and the energy, the frequency, and the like of the oscillation can be inputted. The plate for issuing gas is connected to a suitable operation mechanism, and before the substrate 324 is set on the stage 325, the plate is preferably held at a suitable position, so that possibility of interference between the substrate and the plate is low. By repeating the series of operations, multiple semiconductor film can be treated with laser light.

Embodiment Mode 4

An example of the present invention will be described with reference to FIGS. 5A to 5G. Here, a method of crystallizing a semiconductor film provided on an insulating substrate will be described in detail.

First, a base insulating film 501 is formed over a glass substrate 500 in a manner shown in the above embodiment mode. In this embodiment mode, a two-layer structure is used for the base insulating film 501 provided over the glass substrate. However, a single layer film or a structure in which two or more layers are stacked may be used for the base insulating film. As a first layer of the base insulating film 501, a first silicon oxynitride film (composition ratio: Si=32%, O=27%, N=24%, and H=17%) is formed to a thickness of 50 nm by plasma CVD using $SiH_4$, $NH_3$, and $N_2O$ as a reaction gas. Next, as a second layer of the base insulating film 501, a second silicon oxynitride film (composition ratio: Si=32%, O=59%, N=7%, and H=2%) is formed to a thickness of 100 nm by plasma CVD using $SiH_4$ and $N_2O$ as a reaction gas.

Figure 5A:
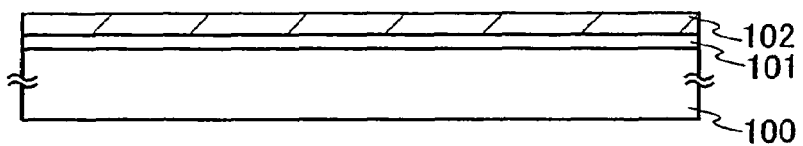
FIGS. 5A to 5G are figures illustrating an irradiation method.

Next, an amorphous semiconductor film 502 is formed to a thickness of 50 nm over the base insulating film 501 by plasma CVD. Here, in general, a silicon film, which is formed by plasma CVD, may contain hydrogen to a large extent. The large amount of hydrogen contained extremely decreases the durability of the silicon film against laser. Therefore, thermal processing (at 500° C. in a nitrogen atmosphere for one hour) is performed for dehydrogenation. Notably, the dehydrogenation is performed by thermal processing using a furnace here. Alternatively, the dehydrogenation may be performed by using a lamp annealing device (FIG. 5A).

Figure 5B:
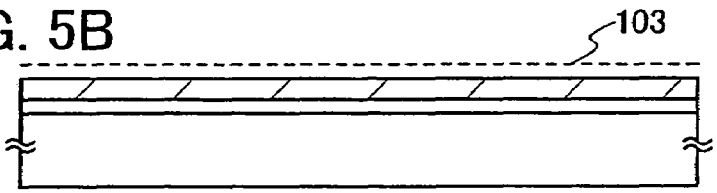
Figure 5C:
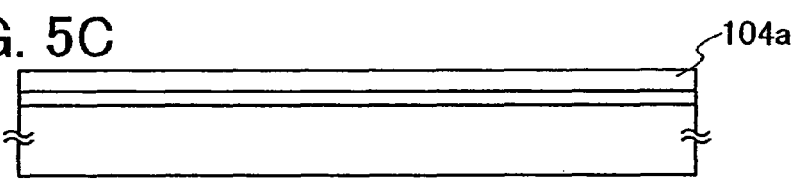
Figure 5D:
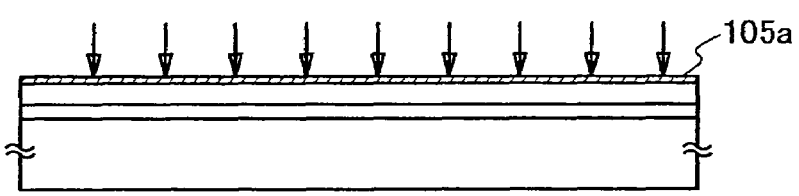
Figure 5E:
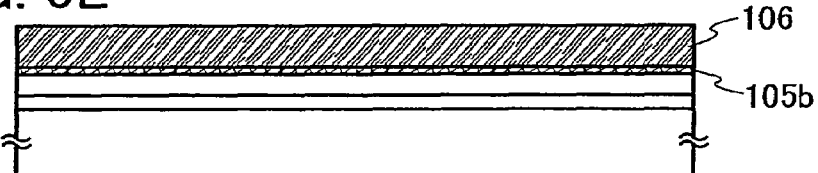
Figure 5F:
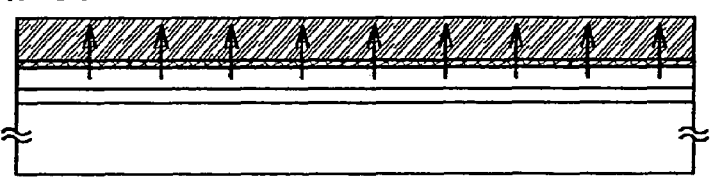
Figure 5G:
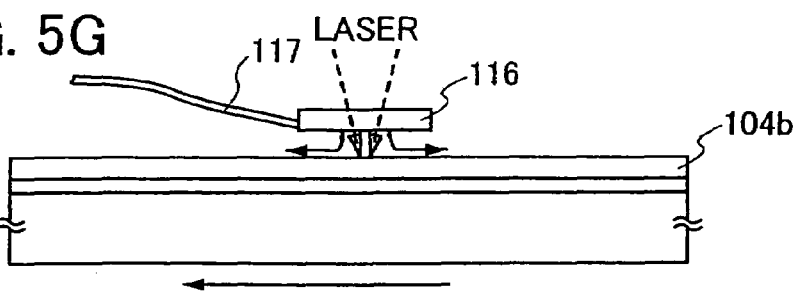

Next, the amorphous semiconductor film 502 is irradiated with laser light (XeCl: wave length of 308 nm) in the atmosphere to crystallize the semiconductor film 502. The laser light may be excimer laser light with a wavelength of 400 nm or less, the second harmonic or the third harmonic of YAG laser. In either case, pulsed laser light with repetition rate of the order of 10 Hz to 1000 Hz may be used. Then, the laser light is focused into a rectangular shape with an energy density of 100 mj/cm² to 500 mj/cm² using an optical system. The laser light may be shone with an overlap ratio of 90% to 95% and may scan the surface of the semiconductor film. Here, the laser light is shone in the atmosphere with a repetition rate 30 Hz and an energy density of 476 mj/cm². The optical system for focusing laser light may be a triplet cylindrical lens 301, for example. The laser light is preferably focused into a linear shape because the efficiency of laser treatment is increased. The triplet cylindrical lens is a lens constructed by three lenses in order to suppress spherical aberration. In the present invention, a singlet cylindrical lens (having a single lens), a doublet cylindrical lens, or the like may be used. In order to obtain beams achieving more uniform energy distribution on the surface of the semiconductor film, lens with smaller spherical aberration is preferably used. Through this process, a silicon film 502a having a crystalline structure is obtained. Since this process is performed in the atmosphere, an oxide film 505a is formed (FIG. 5B). The oxide film 505a is removed using an etchant such as hydrofluoric acid before the-irradiation with the second laser light (FIG. 5C).

Next, details of a process of irradiating with the second laser light the silicon film 502b, from which the oxidized film is removed, will be described with reference to FIG. 2. First, a substrate 305 (corresponding to the substrate 500 in FIG. 5A) over which a silicon film 502b is formed is set on a stage 306. Then, nitrogen, for example, is supplied from a gas supply pipe 302 to a plate 304, and the nitrogen is issued from the plate 304 to the silicon film. The plate 304 held by a supporting mechanism 307 is disposed immediately above the semiconductor film 102 to maintain a constant distance between the plate and the stage (semiconductor film). The plate 304 may be floated above the semiconductor film by the issued nitrogen. The supporting mechanism 307 is not completely secured to the plate 304, so that the plate 304 can float. An inert gas such as a rare gas may be used as the gas. The use of hydrogen can suppress the reaction caused between oxygen and the semiconductor film.

In a state where a certain distance is maintained between the plate 304 and the semiconductor film, laser light is focused into a linear shape using the triplet cylindrical lens 301. Then, the silicon film 1102 is irradiated with the laser light through a window 303 which transmits laser light. Then, the stage 306 is moved in the direction indicated by arrows in the figure, namely, in the direction perpendicular to the direction of the length of linear beams. Then, laser light is shone on all over the silicon film 1102. A quartz window is preferably used for the window 303 because it has high transparency to laser light. Through this process, an atmosphere in the vicinity of a part of the silicon film that is subjected to the laser light can be made to be substantially a nitrogen atmosphere. Thus, the oxidation of the semiconductor film can be prevented, so that depressions and projections generated on the surface of the semiconductor film can be reduced, which is preferable.

Through the process, a crystalline silicon film 502c can be obtained with extremely small depressions and projections on the surface.

This process is preferably used for the irradiation of the second laser light because the semiconductor properties can be raised and the depressions and projections caused on the surface of the semiconductor film can be reduced. However, when a semiconductor film with high quality is not particularly required, the irradiation with the first laser light can be omitted and only the second laser light may be shone in order to reduce the depressions and projections formed on the surface of the semiconductor film. The reduction of the depressions and projections may contribute to the improvement in yield of the semiconductor apparatus. In this embodiment mode, the amorphous silicon film is irradiated with the laser light. However, the laser light can be shone similarly on a crystalline semiconductor film having undergone a crystallization process of the semiconductor film using the above-described metal element.

As described above, since a smaller plate is used in a laser irradiation apparatus of the invention as compared to that of a conventional one. Unlike a conventional irradiation apparatus, measurement can be conducted without removing the plate from the irradiation apparatus while being exposed to the atmosphere when a measurement apparatus is arranged under an optical. In other words, measurement of conditions of laser light irradiation can be simplified compared to a conventional laser irradiation apparatus. Therefore, time involved in measurement of laser light can be reduced. Further, since the space occupied by the interior of the plate is made smaller, the total amount of gas flown before laser irradiation can be reduced and the time of flowing gas can be reduced. In addition, by using the laser irradiation apparatus of the invention, laser irradiation can be performed under a stable laser irradiation atmosphere; accordingly, variations in characteristics of TFTs can be reduced, and the characteristics of the TFTs can be improved.

Embodiment Mode 5

One mode of a semiconductor device of the present invention and a method for manufacturing a light emitting device using the semiconductor device will be explained with reference to FIGS. 6A to 16C.

An insulating layer 101a is formed over a substrate 100. An insulating layer 101b is formed over the insulating layer 101a. The insulating layer 101a is preferably provided so as to prevent impurities from diffusing from the substrate. For example, a layer also containing silicon nitride or silicon nitride containing oxygen is preferably used as the insulating layer 101a. As the insulating layer 101b, a layer which makes stress difference between the insulating layer and a semiconductor layer which will be formed in the subsequent process be small is preferably used. For example, a layer including silicon oxide or silicon oxide containing a minute amount of nitrogen is preferably used. A method for forming the insulating layers 101a, 101b is not particularly limited; a plasma CVD method, a low pressure CVD method, a sputtering method, a PVD method, or the like can be used. The substrate 100 is not particularly limited. A substrate made from an insulator such as glass or quartz, or a substrate provided with an insulating layer made from silicon, stainless steel, or the like can be used as the substrate 100. Alternatively, a substrate made from flexible plastic or the like such as polyethylene terephthalate (PET) or polyethylene naphthalate (PEN) can be used. Note that when a substrate containing extremely small amount of impurities, such as a substrate made of quartz is used, the insulating layers 101a and 101b are not necessarily formed (FIG. 6A).

Then, semiconductor layers (semiconductor layers 106a to 106c (See FIG. 8A)) which are used as active layers of transistors are formed over the insulating layer 101b. The semiconductor layers used as active layers of the transistors are preferably formed of a crystalline semiconductor. The method for manufacturing a crystalline semiconductor will be described below.

First, an amorphous semiconductor layer 102a containing a semiconductor such as silicon, silicon germanium is formed over an insulating layer 101b. The thickness of the amorphous semiconductor layer 102a is preferably 40 nm to 60 nm. It is to be noted that the amorphous semiconductor layer 102a may be formed continuously after forming the base insulating layers 101a and 101b using the same film formation apparatus as the base insulating layers 101a and 101b; that is, the amorphous semiconductor layer 102a may be formed continuously after forming the base insulating layers 101a and 101b without exposing the substrate to the atmosphere. Thus, impurities contained in the atmosphere can be prevented from attaching to the insulating layer 101b.

Next, after forming a thin oxide film 103 having a thickness of 1 nm to 10 nm over the surface of the amorphous semiconductor layer 102a, a metal element which promotes crystallization is held over the oxide film 103. A method for forming the oxide film is not particularly limited, and the oxide film may be formed by treating the surface of the amorphous semiconductor layer 102a with ozone water or an oxidizing solution such as a hydrogen peroxide solution, or may be formed using a method for generating ozone by ultraviolet irradiation in an oxygen atmosphere, or the like. As the element which promotes crystallization, nickel, palladium, or the like can be used. Alternatively the method of holding the element which promotes crystallization is not particularly limited. A surface of the oxide film 103 may be treated with a solution containing the metal element which promotes crystallization so as to attach the metal element to the oxide film 103 to hold it. Alternatively, a layer or a cluster which contains the metal element promoting crystallization may be formed on the oxide film 103 by sputtering or the like to hold the metal element. Note that as the solution containing the metal element which promotes crystallization, for example, a metal salt solution such as a nickel acetate solution can be used (FIG. 6B).

Next, the amorphous semiconductor layer 102a is crystallized by heat treatment using rapid thermal annealing (RTA), or an annealing furnace, or the like to form a crystalline semiconductor layer 102b which has an amorphous component and a crystalline component (FIG. 6C). The RTA may be either a lamp system of heating by light irradiation or a gas system of heating using a hot gas. The heat treatment is preferably performed in an atmosphere of a gas of low reactivity such as nitrogen gas or rare gas. Further, in the case of using an RTA method, heat treatment temperature is preferably 600° C. to 800° C., and heat treatment time is 3 to 9 minutes. Further, in the case of using an RTA method, a heat treatment temperature may be 600° C. to 800° C., and heat treatment time may be 3 to 9 minutes. In a case of carrying out heat treatment by using a furnace, a heat treatment temperature may be 500° C. to 600° C., and beat treatment time may be 3 to 6 hours. It is to be noted that, in a case where hydrogen is contained to a large extent in the amorphous semiconductor layer 102a, hydrogen may be discharged from the amorphous semiconductor layer 102a by heat treatment at a temperature of 350° C. to 500° C. so as to obtain a hydrogen concentration of $1\times10^{20}$ atoms/cm$^3$ or lower, and thereafter, heat treatment for crystallization may be carried out.

Next, the crystalline semiconductor layer 102b is irradiated with first laser light in the atmosphere to be recrystallized to form a crystalline semiconductor layer 102c (FIG. 6D). The first laser light is preferably shaped with an optical system to obtain a rectangular beam spot. Intensity of the first laser light to be shone may be 300 mJ/cm$^2$ to 450 mJ/cm$^2$. Further, laser used for the first laser light is preferably pulsed laser having, for example, a repetition rate of 60 Hz to 120 Hz. Irradiation with the laser light is preferably performed by scanning either the substrate 100 over which the crystalline semiconductor layer 102b is formed or the first laser light so that the first laser light moves relatively to the substrate 100. A scanning rate of the substrate 100 or the first laser light is not particularly limited and may be adjusted so that 11 or 12 shots of irradiation are performed at an arbitrary point of the crystalline semiconductor layer 102b. It is to be noted that the number of shots (unit: shot) of the first laser light that is shone onto an arbitrary point can be calculated from the Equation 1.

$$\text{Number\_of\_Shots} = \frac{\text{Beam\_Width}(\mu m)\times 10^{-3} \times \text{Frequency\_of\_Laser\_Light}(Hz)}{\text{Scanning\_Verocity\_of\_Laser\_Light\_or\_Substrate}(mm/sec)} \quad [\text{Equation 1}]$$

In addition, a laser medium is not particularly limited, and lasers using various laser mediums such as an excimer laser, an argon laser, a krypton laser, a He—Cd laser, a YAG laser, a YVO$_4$, a YLF laser, a YAlO$_3$ laser, a Y$_2$O$_3$ laser GdVO4, a glass laser, a ruby laser, a Ti:sapphire laser, and the like a copper vapor laser; and a gold vapor laser can be used. Note that the crystalline semiconductor layer 102b is preferably treated with a solution containing fluoric acid to remove an oxide film formed on a surface of the crystalline semiconductor layer 102b before the irradiation with the first laser light.

Next, an amorphous semiconductor film 108 containing a semiconductor such as silicon or silicon germanium and a rare gas element such as argon (Ar) is formed over the crystalline semiconductor layer 102c, and heat treatment is carried out after (see FIG. 7A). Here, a thin oxide film 105 having a thickness of 1 nm to 10 nm is preferably formed between the crystalline semiconductor layer 102c and the amorphous semiconductor layer 104a. The oxide film 105 may be an oxide film which is formed when forming the crystalline semiconductor layer 102c by the foregoing laser light irradiation or the oxide film may be formed by treating the surface of the crystalline semiconductor layer 102c with ozone water or the like. A method for forming the amorphous semiconductor layer 104a is not particularly limited, and plasma CVD, LPCVD, sputtering, PVD, or the like may be used. The thickness of the amorphous semiconductor layer 104a is preferably 20 nm to 40 nm. Further, in the case of using an RTA method, preferably, a heat treatment temperature may be 600° C. to 800° C., and heat treatment time may be 3 to 9 minutes. In the case of carrying out beat treatment by using a furnace, a heat treatment temperature may be 500° C. to 600° C., and heat treatment time may be 3 to 6 hours. By carrying out heat treatment, the metal which promotes crystallization which is contained in the crystalline semiconductor layer 102c is gettered to the amorphous semiconductor layer 104a from the crystalline semiconductor layer 102c (The crystalline semiconductor layer 102c after the gettering is referred to as a crystalline semiconductor layer 102d). The gettering of the metal element which promotes crystallization to the amorphous semiconductor layer 104a makes the amorphous semiconductor layer 104a be a semiconductor layer 104b containing a crystal component (FIG. 7B). The semiconductor layer 104b selectively etched away. A method of etching the semiconductor layer 104b is not particularly limited; however, by using a solution such as a solution of tetramethylammonium hydroxide (TMAH), choline, or the like, etching can be carried out with high selectivity to the oxide film 105. Thus, the oxide film 105 serves as a stopper for preventing the crystalline semiconductor layer 102d from etched away when etching the semiconductor layer 104b. Note that in the case where an oxide film such as a natural oxide film is formed on a surface of the semiconductor layer 104b, it is preferable to etching the semiconductor layer 104b after removing the oxide film in advance using a solution containing hydrofluoric acid or the like. After removing the semiconductor layer 104b, the oxide film 105 is removed using a solution containing hydrofluoric acid or the like.

Next, the crystalline semiconductor layer 102d is recrystallized by shining second laser light while blowing nitrogen gas (FIG. 7C) to form a crystalline semiconductor layer 102e (FIG. 7D). The second laser light is preferably shaped to have a rectangular beam spot using an optical system. Further, the intensity of the second laser light to be shone is preferably 340 mJ/cm$^2$ to 400 mJ/cm$^2$. In addition, the second laser light to be used for irradiation is preferably pulsed laser having, for example, a repetition rate of 60 Hz to 120 Hz. Irradiation with the second laser light is preferably performed by scanning either the substrate 100 over which the crystalline semiconductor layer 102e is formed or the second laser light so that the second laser light moves relatively to the substrate 100. A scanning rate of the substrate 100 or the second laser light is not particularly limited and may be adjusted so that 5 or 6 shots of irradiation are performed at an arbitrary point of the crystalline semiconductor layer 102e. Thus, the number of shots of the second laser light is preferably half the number of shots of the first laser light. It is to be noted that the number of shots (unit: shot) of the second laser light that is shone onto an arbitrary point can be calculated from the above Equation 1.

Through the above process, the crystalline semiconductor layer 102e having an extremely small average roughness of the surface can be obtained.

Then, the crystalline semiconductor layer 102e is processed into a desired shape to obtain semiconductor layers 106a, 106b, and 106c are obtained (FIG. 8A). A method for processing the crystalline semiconductor layer 102e is not particularly limited, and for example, a method can be used, by which, after forming a resist mask over the crystalline semiconductor layer 102e, an unnecessary portion is removed by etching. A method for forming a resist mask is not particularly limited either, and in addition to a photolithography method, a method may be used, by which a mask with a desired shape is formed by drawing while controlling a timing and position of discharging a droplet as in an ink jet method. Further, an etching method is not particularly limited, and either a dry etching method or a wet etching method may be used.

It is to be noted that the semiconductor layers 106a to 106c may be doped with an impurity to control a threshold voltage of a transistor. An impurity that is added is not particularly limited, and an impurity imparting n-type conductivity such as phosphorus or arsenic, or an impurity imparting p-type conductivity such as boron may be used. Further, a timing of adding an impurity to control the threshold voltage is not particularly limited, and the impurity may be added after forming the crystalline semiconductor layer 102e and before forming the semiconductor layers 106a to 106c, or after forming the semiconductor layers 106a to 106c and before forming a gate insulating film 107 which is formed in a subsequent step. In addition, in this step, the impurity may be entirely added to the semiconductor layers 106a to 106c (or the crystalline semiconductor layer 102e), or partially added by covering part of the semiconductor layers using a resist or the like.

Next, the gate insulating layer 107 is formed so as to cover the island-shaped semiconductor layers 106a to 106c (see FIG. 8B). A method for forming the gate insulating layer 107 is not particularly limited, and the gate insulating layer 107 may be formed by a plasma CVD method, a low pressure CVD method, a sputtering method, a PVD method, or the like. In addition, the surfaces of the semiconductor layers 106a to 106c may be oxidized to form the gate insulating layer 107. The gate insulating film 307 may be formed from silicon oxide, silicone nitride, silicon oxide containing nitrogen, silicon nitride containing oxygen, or the like. Further, the gate insulating layer 107 may be a single layer or have a stacked layer structure including layers formed using different substances.

Next, gate electrodes 111a to 111d and a capacitor electrode 111e are formed over the gate insulating layer 107 (FIG. 9B). A structure of the gate electrode and a method for forming the gate electrode are not particularly limited. In this embodiment mode, a method for forming the gate electrodes 111a to 111d and the capacitor electrode 111e which are formed by stacking the first conductive layer and the second conductive layer will be described hereinafter.

First, the first conductive layer 108 is formed over the gate insulating layer 107, and the second conductive layer 109 is formed over the first conductive layer 108 (see FIG. 8B). Preferably, the first conductive layer 108 and the second conductive layer 109 are respectively formed using different conductive substances. The first conductive layer 108 is preferably formed using a conductive substance having good adhesion to the gate insulating layer 107, and for example, titanium nitride, tantalum nitride, titanium, tantalum, or the like is preferably used. Further, the second conductive layer 109 is preferably formed using a conductive substance of which resistivity is low, and for example, tungsten (W), molybdenum (Mo), aluminum (Al), copper (Cu), an alloy or a metal compound which contains these metals as its main component, or the like is preferably used. As the alloy, an alloy of aluminum and silicon, an alloy of aluminum and neodymium, or the like can be given. As the metal compound, tungsten nitride or the like can be given. A method for forming the first conductive layer 108 and the second conductive layer 109 is not particularly limited, and a sputtering method, an evaporation method, or the like can be used.

Then, masks 135a, 135b, 135c, 135d, and 135e are formed over the second conductive layer 109. Then, the first conductive layer 108 and the second conductive layer 109 are etched, and first conductive layers 108a, 108b, 108c, 108d, and 108e, and second conductive layers 109a, 109b, 109c, 109d, and 109e are formed so that a sidewall of each conductive layer has an inclination with respect to a horizontal plane of each conductive layer (FIG. 9A).

Next, with the masks 135a to 135e provided, the second conductive layers 109a to 109e are selectively etched, and second conductive layers 110a, 110b, 110c, 110d, and 110c are formed. At this time, it is preferable that etching be carried out under a condition with a high anisotropic property so that a sidewall of each of the second conductive layers 110a to 110e is perpendicular with respect to a horizontal-plane of each conductive layer. Accordingly, inclined portions on the sidewalls of the second conductive layers 109a to 109e are removed. In this manner, the second conductive layers 110a to 110e each having a shorter width than each of the first conductive layers 108a to 308e are formed over the first conductive layers 108a to 108e respectively, and thus, the gate electrodes 111a to 111d and the capacitor electrode 111e, which are formed by combining the first conductive layers 108a to 108e with the third conductive layers 110a to 110e respectively, can be formed.

It is to be noted that each of the masks 135a to 135e may be a mask obtained by being formed into a desired shape and further narrowed by ashing. By using such a mask, an electrode having a more minute shape can be formed, and as a result, a transistor having a shorter channel length can be obtained. When a transistor having a shorter channel length is manufactured, a circuit which operates with higher speed can be obtained.

Then, by using the gate electrodes 111a to 111d and the capacitor electrode 111e as masks, an impurity element imparting n-type conductivity is added to provide first n-type impurity regions 112a, 112b, and 112c. The impurity element imparting n-type conductivity is not particularly limited, and phosphorus, arsenic, or the like can be used. After providing the first n-type impurity regions 112a to 112d, the masks 135a to 135e are removed (FIG. 9C)

After removing the masks 135a to 135e, a mask 136a covering the semiconductor layer 106a and a mask 136b covering the semiconductor layer 106c are formed. Using the masks 136a and 136b and the first conductive layer 108b and the second conductive layer 110b as masks, an impurity element imparting n-type conductivity is further added to the semiconductor layer 106b; therefore, second n-type impurity regions 113a are each provided in a region overlapped with the first conductive layer 108b, and third n-type impurity regions 114a are each provided in a region overlapped with neither the first conductive layer 108b nor the second conductive layer 110b (FIG. 10A). The thus formed third n-type impurity region 114a functions as a source or a drain of a transistor. In other words, the third n-type impurity region 114a functions to connect the transistor to a capacitor. Further, by providing the second n-type impurity region 113a, which is overlapped with the gate electrode 111b between the third n-type impurity region 114a serving as a source or a drain and a channel formation region 115a, has the same conductivity type as that of the third n-type impurity region 114a, and has a lower concentration than that of the third n-type impurity region 114a; an n-channel transistor 152 having excellent resistance to hot carrier deterioration can be obtained. It is to be noted that a region interposed between the second n-type impurity regions 113a serves as the channel formation region 115a.

Figure 16A:
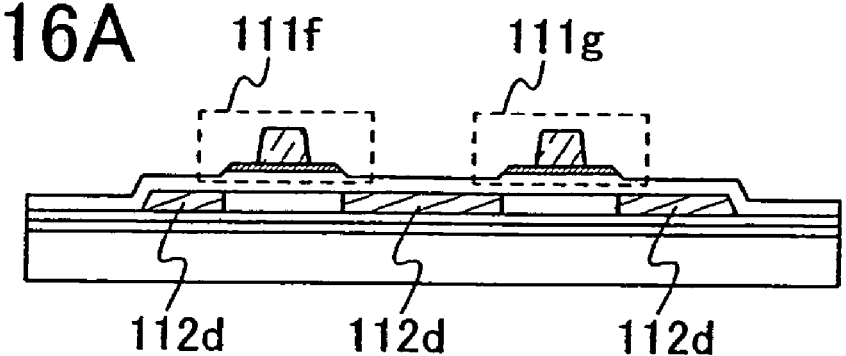
FIGS. 16A to 16C are figures illustrating a manufacturing method of a semiconductor device.
Figure 16B:
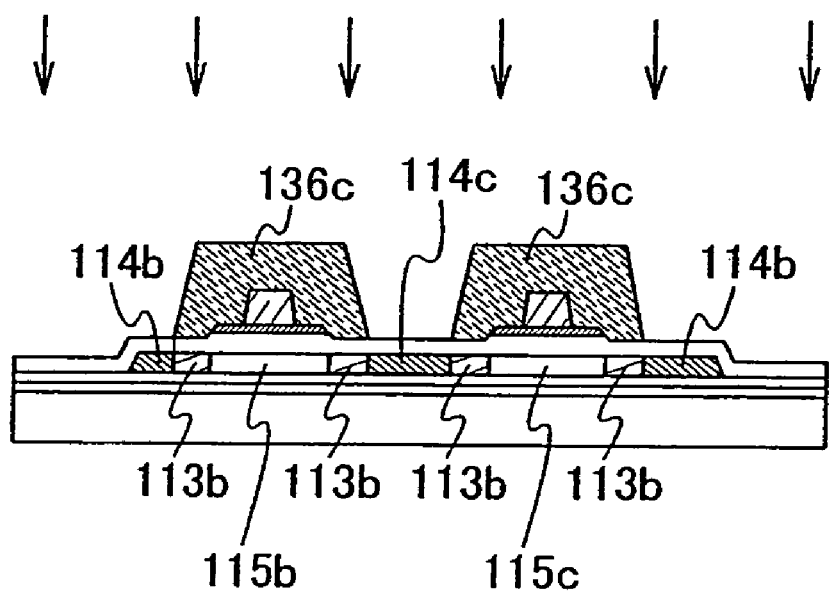
Figure 16C:
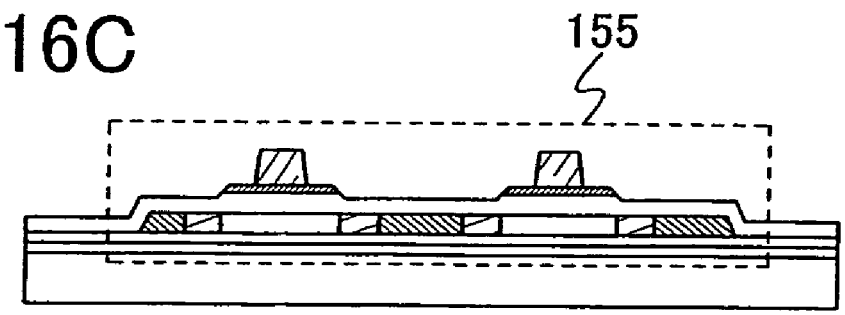

As shown in FIGS. 16A to 16C, when regions in first n-type impurity regions 112d which do not overlap with gate electrodes are partially covered with masks, second n-type impurity regions 113b, which have the same conductivity type as that of third n-type impurity regions 114b and 114c and a lower concentration than that of the third n-type impurity regions 114b and 114c, are provided between the third n-type impurity regions 114b serving as a source or a drain and a channel formation region 115b, and between the third n-type impurity region 114b and the channel formation region 115c. Accordingly, an n-channel transistor 155 in which off leakage current can be reduced can be obtained. In addition, in the transistor 155, the gate electrodes 111f and 111g are electrically connected to each other so that the same voltage is applied at the same timing. The transistor 155 is a double gate transistor having two channel formation regions 115b and 115c.

As shown in FIG. 10B, after removing the masks 136a and 136b, a mask 137 covering the semiconductor layer 106b is formed. By using the mask 137 and the third conductive layers 110a, and 110b to 110e as masks, an impurity element imparting p-type conductivity is added to the semiconductor layers 106a and 106c; therefore, first p-type impurity regions 116a and 116b are provided in regions overlapped with the first conductive layers 108a, and 108c to 108e respectively, and second p-type impurity regions 117a, 117b, and 117c are provided in regions not overlapped with the first conductive layers 108a, 108c to 108e. The thus formed second p-type impurity regions 117a, 117b, and 117c each serve as a source or a drain of a transistor, or have a function of connecting a transistor to a capacitor. In such a manner, p-channel transistors 151 and 153, and a capacitor 154 can be obtained (FIG. 11A). It is to be noted that a region interposed between the first p-type impurity regions 116a of the transistor 151 serves as a channel forming region 118a. In addition, in the transistor 153, the gate electrodes 111c and 111d are electrically connected to each other so that the same voltage is applied at the same timing. The transistor 153 is a double gate transistor having two channel forming regions 118b and 118c. Further, when an impurity element imparting p-type conductivity is added in this step, an impurity element imparting p-type conductivity is added at a higher concentration than the impurity element contained in the first n-type impurity regions 112a and 112c which are formed beforehand; therefore, the n-type conductivity is lost.

Next, the mask 137 is removed. As described above, a semiconductor device including the transistor 153 and the capacitor 154 used in a pixel area 161, and the transistors 151 and 152 used in a driver circuit area 162 can be manufactured (FIG. 11A). The semiconductor device is provided with a terminal area 163 for inputting a signal from outside through a subsequent step, in addition to the pixel area 161 and the driver circuit area 162. It is to be noted that a structure of the transistor is not particularly limited. For example, a multi-gate transistor having a structure in which a semiconductor layer is interposed between two gate electrodes, a single drain transistor having a structure in which an impurity region serving as a source or a drain and a channel formation region are adjacent to each other (a region having a lower concentration than that of the impurity region serving as a source or a drain is not provided therebetween), or the like may be employed.

Then, first interlayer insulating layers 119a, 119b, and 119c are sequentially formed so as to cover the transistors (see FIG. 11B). The first interlayer insulating layer 119a can be formed using an insulating substance such as silicon oxide or silicon nitride. Here, each of silicon oxide and silicon nitride may contain nitrogen or oxygen. Further, in addition to an inorganic insulating substance such as silicon oxide or silicon nitride, one or more compounds selected from organic insulating substances such as acrylic or polyimide, a material containing a Si—O—Si bond which is formed from a siloxane based material as a starting material may be used. Siloxane has a skeletal structure including a bond of silicon (Si) and oxygen (O). An organic group (for example, an alkyl group or aromatic hydrocarbon) which at least contains hydrogen is used as a substituent. Alternatively, a fluoro group may be used as a substituent. As a substituent, an organic group at least containing hydrogen and a fluoro group may also be used. Further, a method for forming the first interlayer insulating layers 119a to 119c is not particularly limited, and a plasma CVD method, a low pressure CVD method, a sputtering method, a PVD method, or the like may be used. In addition, in this embodiment mode, a multilayer film in which three layers of the first interlayer insulating layers 19a, 119b, and 119c, are stacked, is employed. However, the number of stacked first interlayer insulating layers is not particularly limited, and a single layer or a multilayer including two or more layers may be used. It is preferable that at least one of the first interlayer insulating layers 119a, 119b, and 119c be an insulating layer containing hydrogen. As the insulating layer containing hydrogen, for example, an insulating layer formed from silicon nitride, which is formed by using a $SiH_4$ gas, an $NH_3$ gas, an $N_2O$ gas, and an $H_2$ gas as a raw material gas by a plasma CVD method, can be given. The thus formed silicon nitride contains oxygen as well as hydrogen. When at least one of the first interlayer insulating layers 119a, 119b, and 119c is to be an insulating layer containing hydrogen, hydrogenation can be carried out to terminate a dangling bond contained in the semiconductor layers 106a to 106c by utilizing hydrogen contained in the insulating layer. Therefore, for example, it is not necessary to carry out hydrogenation in an atmosphere where a furnace is filled with a hydrogen gas, and hydrogenation can be easily carried out. In addition, when silicon nitride containing hydrogen is used as the first interlayer insulating layer, a layer formed from silicon oxide or silicon oxide containing nitrogen is preferably provided between the layer formed from silicon nitride containing hydrogen and a transistor. As in this mode, when the first interlayer insulating film includes three layers, 119a, 119b, and 119c, the first interlayer insulating layer 119a may be formed from silicon oxide or silicon oxide containing nitrogen, the first interlayer insulating layer 119b may be formed from silicon nitride containing hydrogen (oxygen may be further contained), and the first interlayer insulating layer 119c may be formed from silicon oxide or silicon oxide containing nitrogen. In a case where, for example, light from a light-emitting element is extracted to the outside through the first interlayer insulating layers 119a to 119c, the first interlayer insulating layers 119a to 119 can be used to adjust the length of a light path through which light passes.

It is to be noted that, before or after forming any of the first interlayer insulating layers 119a, 119b, and 119, treatment for activating the impurity element imparting n-type or p-type conductivity, which is added beforehand, is preferably carried out. Treatment for activation is not particularly limited and may be carried out by using a furnace, RTA, laser light irradiation, or the like.

Subsequently, openings which reach the semiconductor layers 106a to 106c are formed in the first interlayer insulating layers 119a to 119. Further, after forming a conductive layer covering the openings and the first interlayer insulating layer 119c, the conductive layer is processed into a desired shape. Thus, wirings 120f and 120g are formed in the pixel area 161, wirings 120b, 120c, 120d, and 120e are formed in the driver circuit area 162, and a wiring 120a is formed in the terminal area 163, respectively (FIG. 12A). A method for forming the openings is not particularly limited, and the openings may be formed by providing a mask formed of a resist or the like over the first interlayer insulating layer 119c and then etching the first interlayer insulating layers 119a to 119. Here, an etching method is not particularly limited, and either a wet etching method or a dry etching method may be used. In addition, the conductive layer may be a single layer or a multilayer, and it is preferable that at least one layer be formed using a metal having high conductivity such as aluminum or copper, or a highly conductive alloy of aluminum and neodymium, or the like. Further, aluminum may contain silicon or the like. In a case of a multilayer, layers formed using metal nitride such as titanium nitride or tantalum nitride are preferably provided so as to interpose the layer containing a metal having high conductivity. It is to be noted that the wirings 120a to 120g include a conductive layer serving as a connection portion for electrically connecting a wiring or an electrode provided in a different layer.

Next, a second interlayer insulating layer 121 is formed so as to cover the wirings 120a to 120g (FIG. 12B). The second interlayer insulating layer 121 can be formed using an insulating substance such as silicon oxide or silicon nitride. Here, each of silicon oxide and silicon nitride may contain nitrogen or oxygen. Further, in addition to an inorganic insulating substance such as silicon oxide or silicon nitride, one or more compounds of organic insulating substances such as acrylic or polyimide and siloxane may be used. In addition, a method for forming the second interlayer insulating layer 121 is not particularly limited, and a plasma CVD method, a low pressure CVD method, a sputtering method, a PVD method, or the like may be used. In addition, in this embodiment mode, the second interlayer insulating layer 121 is a single layer, but a multilayer including two or more layers may be employed without being limited to the single layer.

Next, an opening which reaches the wiring 120f through the second interlayer insulating layer 121 is formed, and the second interlayer insulating layer 121 is etched so as to expose the wiring 120a. Etching may be carried out by a wet etching method, a dry etching method, or the like after providing a mask formed of a resist or the like over the second interlayer insulating layer 121.

Then, an electrode 122 of a light-emitting element is formed over the second interlayer insulating layer 121 (see FIG. 13A). A material used for forming the electrode 122 of the light-emitting element is not particularly limited, and an oxide semiconductor such as indium tin oxide, indium zinc oxide, or zinc oxide, or a conductive material such as aluminum, gold, or platinum may be used. A method for forming the electrode 122 of the light-emitting element is not particularly limited either, and for example, a layer may be formed using the oxide semiconductor or the conductive material over the second interlayer insulating layer 121, a mask formed of a resist or the like may be provided over the layer that is formed, and the layer formed using the oxide semiconductor or the conductive material may be etched into a desired shape.

Then, an insulating layer 123 covering an end portion of the electrode 122 of the light-emitting element is formed (see FIG. 13B). The insulating layer 123 can be formed from an inorganic insulating substance such as silicon oxide or silicon nitride, an organic insulating substance such as acrylic, polyimide, or resist, siloxane, or the like. In particular, a photosensitive resin such as photosensitive acrylic, photosensitive polyimide, or resist is preferably used. When the insulating layer 123 is formed from a photosensitive resin by photolithography so as to have a desired shape, the insulating layer 123 can have an edge of a round shape, and consequently, deterioration of the light-emitting element can be reduced.

Subsequently, a light-emitting layer 124 is formed over the electrode 122 and the insulating layer 123 of the light-emitting element. The light-emitting layer 124 may be formed by using either an organic substance or an inorganic substance, or both an organic substance and an inorganic substance. In addition, the light-emitting layer 124 may be a single layer or a multilayer having a hole-transporting layer, an electron transporting layer, a hole-injecting layer, an electron injecting layer, and the like in addition to a layer containing a substance which emits light of a desired wavelength (a light-emitting substance). In the case of a multilayer, over the electrode 122 of the light-emitting element, a layer formed using an organic substance having high conductivity such as PEDOT, a layer formed using a mixture of a substance having a high hole-transporting property and a substance showing an electron accepting property to the substance, or a layer formed using a mixture of a substance having a high electron-transporting property and a substance showing an electron donating property to the substance may be provided, and thereafter, other layers such as a layer containing a light-emitting substance, a hole transporting layer, and an electron transporting layer may be provided. As for the layer formed using an organic substance having high conductivity such as PEDOT, the layer formed using a mixture of a substance having a high hole-transporting property and a substance showing an electron accepting property to the substance, and the layer formed using a mixture of a substance having a high electron-transporting property and a substance showing an electron donating property to the substance, a drive voltage of the light-emitting element is hardly increased even when these layers are thickly made. Therefore, when these layers are thickly made, unevenness formed on the surface of the electrode 122 of the light-emitting element is relieved, thereby preventing a short-circuit or the like between electrodes of the light-emitting element. It is to be noted that the light-emitting substance may be a substance which emits fluorescence or a substance which emits phosphorescence.

The light-emitting layer 124 may be formed for each light-emitting element of a different emission color, or may be formed as one layer which emits the same emission color. In the case of the same emission color, the light emitting element may be combined with a color filter or the like, and light emission extracted to outside a light emitting device may have a different color depending on the pixel.

Figure 14A:
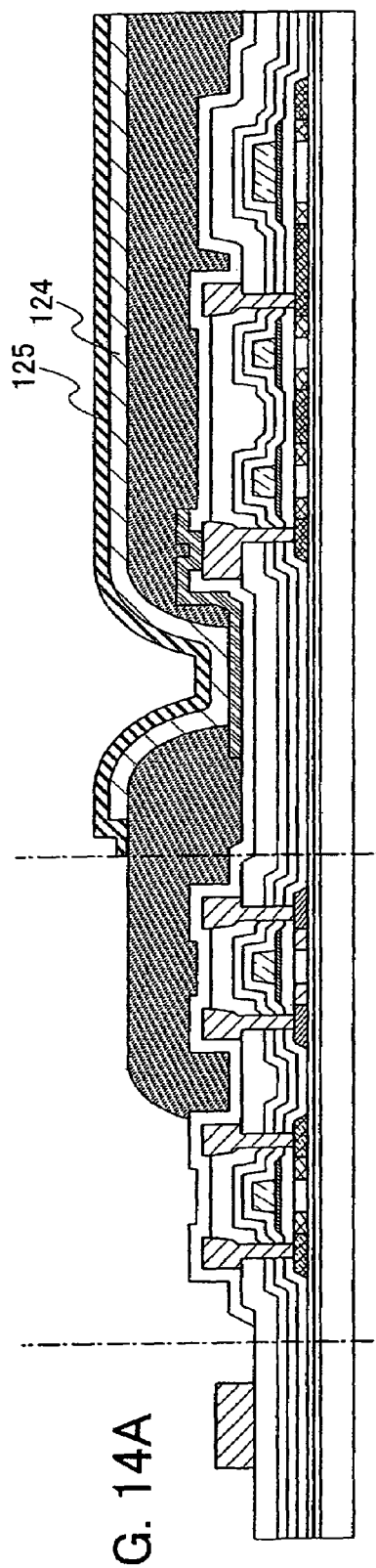
FIGS. 14A and 14B are figures illustrating a manufacturing method of a semiconductor device.

Next, an electrode 125 of the light-emitting element is formed over the light-emitting layer 124 (FIG. 14A). A material used for forming the electrode 125 of the light-emitting element is not particularly limited, and an oxide semiconductor such as indium tin oxide, indium zinc oxide, or zinc oxide, or a conductive material such as aluminum, gold, or platinum may be used. It is to be noted that at least one of the electrode 122 and the electrode 125 of the light-emitting element is formed using indium tin oxide, indium zinc oxide, zinc oxide, or the like so that light emission from the light-emitting layer 124 can be transmitted.

Figure 15:
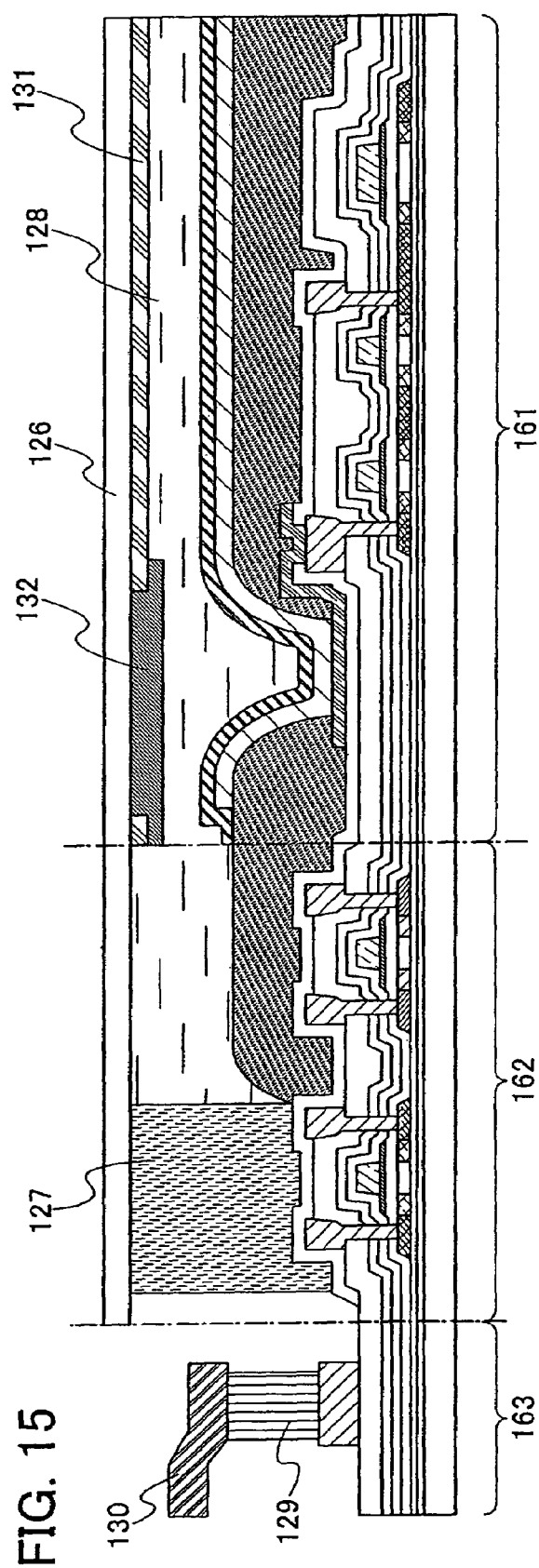
FIG. 15 is a figure illustrating a manufacturing method of a semiconductor device.

Then, the substrate 100 and a substrate 126 are attached to each other by using a sealing material 127 so that the transistors and the light-emitting element which are formed beforehand are sealed. As shown in FIG. 15, the substrate 126 may be provided with a light-shielding layer 131 and a color filter 132. Further, a space 128 sealed with the substrate 100 and the substrate 126 may be filled with an inert gas such as nitrogen or argon, or filled with a resin material or the like. The resin material that is used for the filling may contain a drying agent.

Figure 14B:
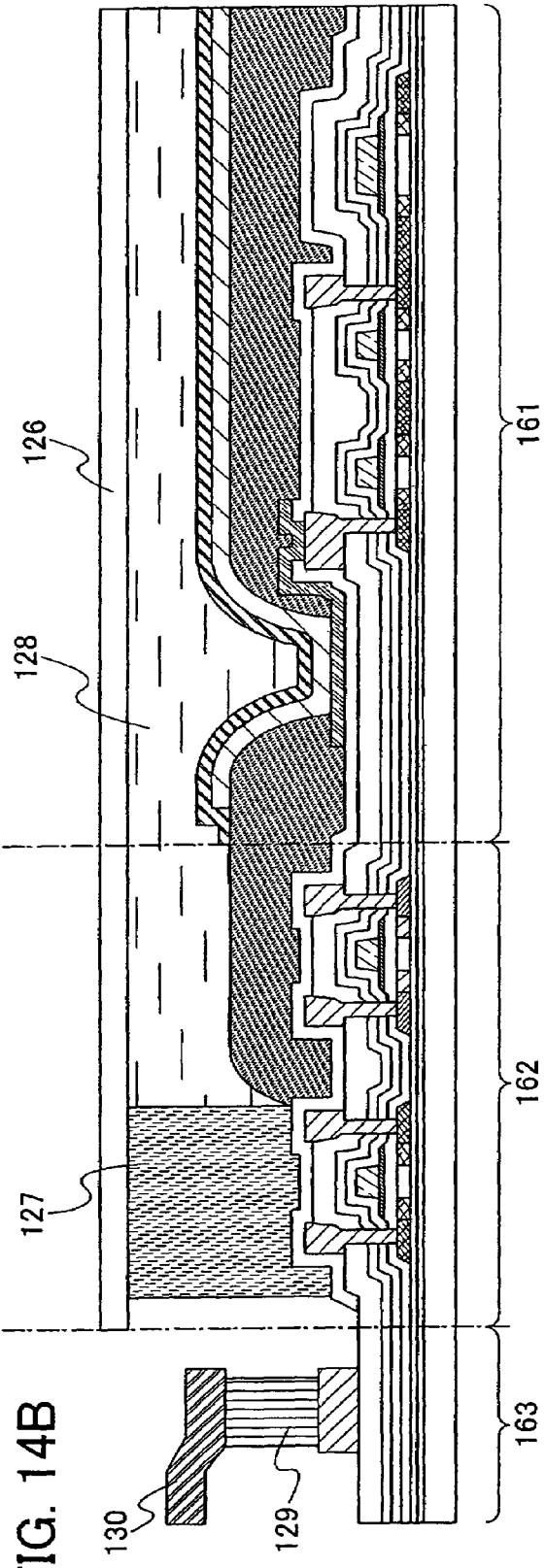

Then, an FPC (flexible printed circuit) 130 is connected to the wiring 120a by using a conductive adhesive 129 or the like (FIGS. 14B and 15).

As described above, a light emitting device including a semiconductor device according to the present invention can be manufactured. In this mode, a method for manufacturing a light emitting device is described, but a liquid crystal display device or the like can be manufactured by appropriately changing a step after the step of forming the electrode 122 of the light-emitting element and a circuit configuration.

Embodiment Mode 6

One mode of a pixel area of a light emitting device which is manufactured in accordance with the manufacturing method described in Embodiment Mode 5 will be described with reference to a top view of FIG. 17.

Figure 17:
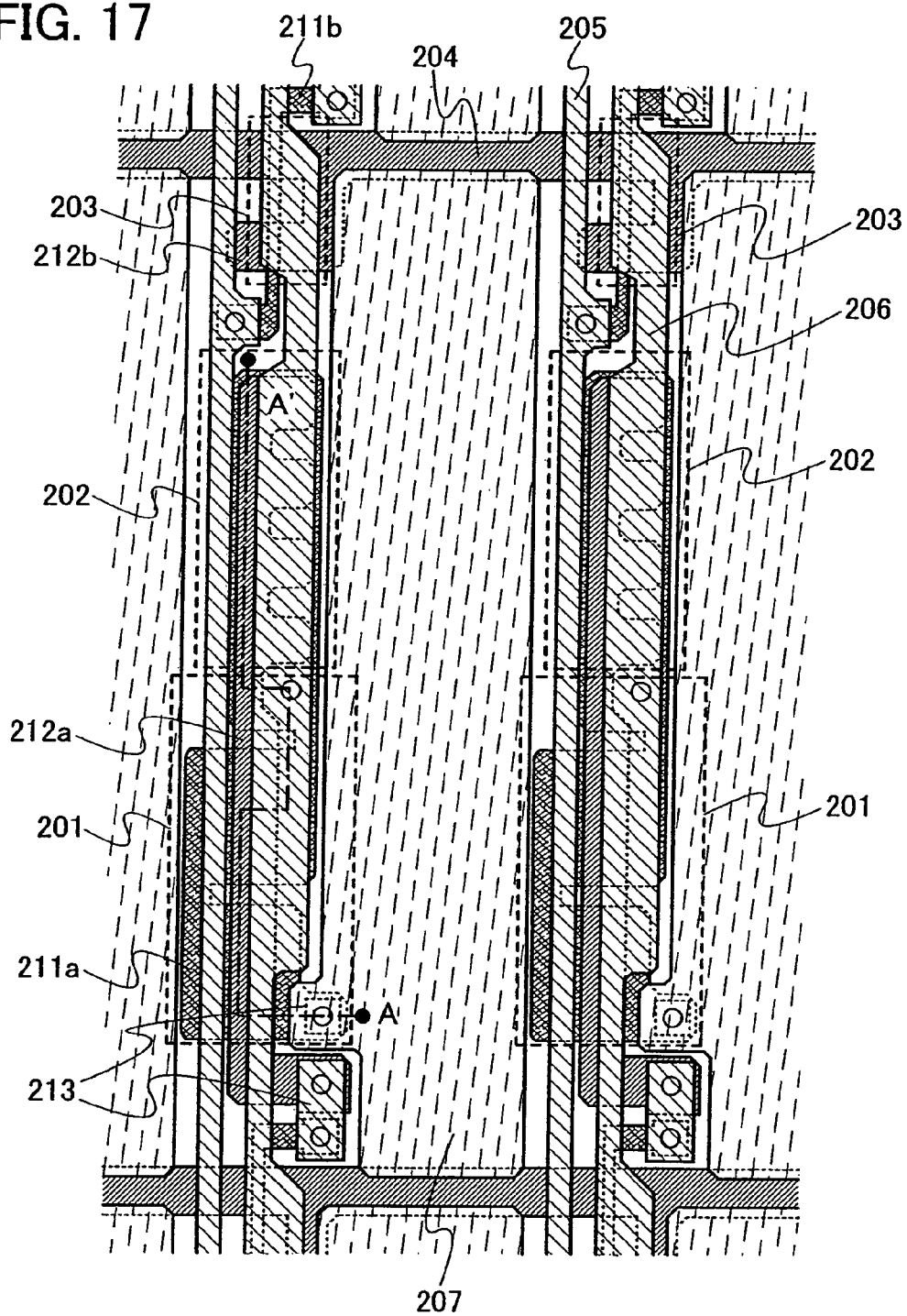
FIG. 17 is a figure illustrating a manufacturing method of a semiconductor device of the present invention.

A cross-section taken along a dashed line A-A' in FIG. 17 corresponds to a cross-sectional view of the pixel area 161 in FIG. 13B. In FIG. 17, the insulating layer 123 covering an end portion of the electrode 122 of the light-emitting element is not shown; however, they are provided in a practice. It is understood from FIG. 17 that a semiconductor layer 211a overlaps with a first conductive layer 212a including a region serving as a gate electrode and a capacitor electrode, and a transistor 201 corresponding to the transistor 153 in FIG. 13B and a capacitor 202 corresponding to the capacitor 154 are provided. The first conductive layer 212a is connected to an electrode 207 of a light-emitting element (corresponding to the electrode 122 of the light-emitting element of FIG. 13B) through a second conductive layer 213. In addition, a gate line 204 is formed in the same layer as the first conductive layer 212a. Further, a source line 205 and a current supply line 206 are provided so as to intersect with the gate line 204. The source line 205 is connected to a source of a transistor 203 including a semiconductor layer 211b and a third conductive layer 212b. It is to be noted that the transistor 155 of FIG. 15C corresponds to the transistor 203. The third conductive layer 212b is provided in the same layer as the gate line 204 and the first conductive layer 212a and connected to the gate line 204. In addition, a part of the gate line 204 is provided so as to serve as a gate electrode of the transistor 203. The current supply line 206 is connected to the semiconductor layer 211a so that a current is supplied to the light-emitting element when the transistor 201 is turned on. It is to be noted that, in this embodiment mode, components may also be electrically connected to each other through another conductive layer as in a case where the semiconductor layer 211b and the first conductive layer 212a are connected to each other through another conductive layer (a forth conductive layer 214 in this mode). Further, in this mode, a portion of the first conductive layer 212a, which serves as an electrode of the capacitor 202, has an uneven sawtooth-shape. With such a shape, electric charges are easily accumulated in the capacitor 202.

Figure 18:
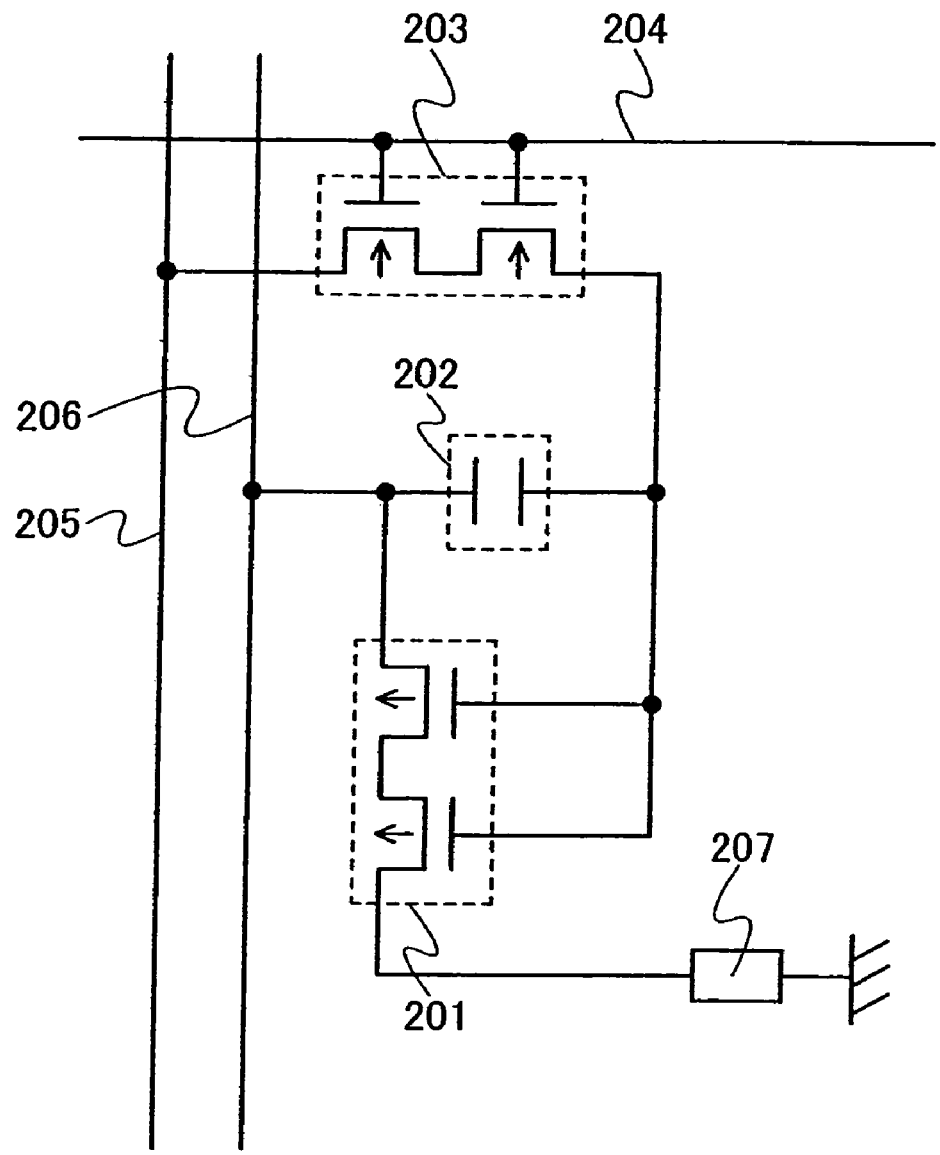
FIG. 18 is a figure illustrating a manufacturing method of a semiconductor device of the present invention.

The transistors 201 and 203, the capacitor 202, the gate line 204, the source line 205, and the current supply line 206 are connected as shown in a circuit diagram of FIG. 18. It is to be noted that a light-emitting element 208 includes the electrode 207 of the light-emitting element of FIG. 17. The light-emitting element 208 is a diode type element. In a case where the transistor 201 connected in series to the light-emitting element 208 is a p-channel transistor as in this mode, the electrode 207 of the light-emitting element serves as an anode. On the other hand, in a case where the transistor 201 is an n-channel transistor, the electrode 207 of the light-emitting element serves as a cathode.

In a pixel area of a light emitting device according to the present invention, a plurality of light-emitting elements, which are driven by a circuit as shown in FIG. 18, are provided in matrix. A circuit for driving a light-emitting element is not limited to the circuit shown in FIG. 18 and for example, a circuit having a configuration provided with an erasing transistor, which is used for an erasing line and erasing operation to forcibly erase an inputted signal, or the like may also be used.

Embodiment Mode 7

An electronic device manufactured by the present invention will be described with reference to FIGS. 19A to 19E.

Figure 19A:
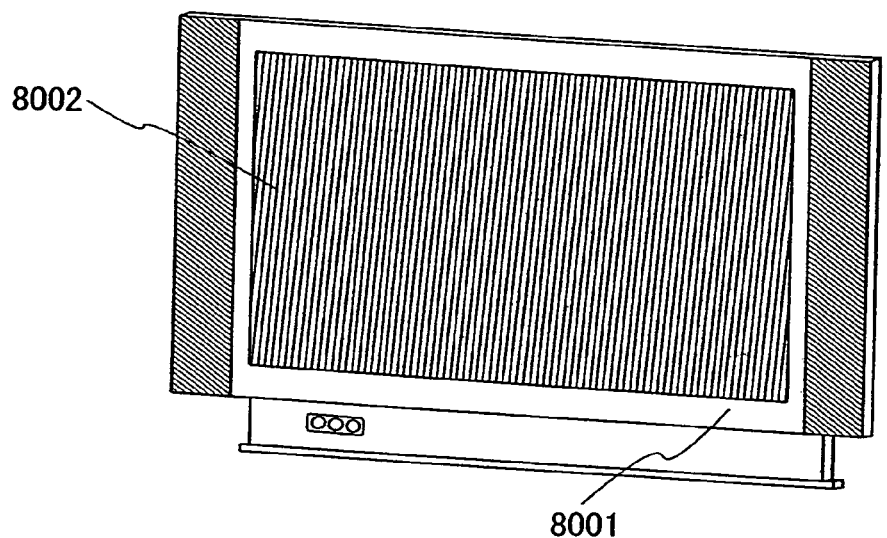
FIGS. 19A to 19E are figures illustrating electronic devices.

A television shown in FIG. 19A includes a main body 8001, a display portion 8002, and the like. The display portion 8002 has pixels each provided with a TFT manufactured in accordance with a manufacturing method of the invention. Such TFTs can reduce variation in the TFTs; therefore, a television including TFTs having improved characteristics can be provided.

Figure 19B:
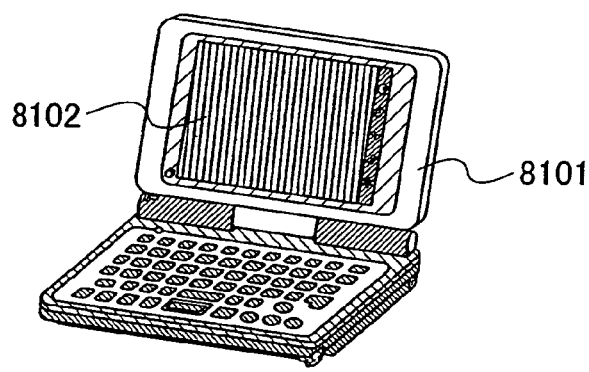

An information terminal device shown in FIG. 19B includes a main body 8101, a display portion 8102, and the like. The display portion 8102 has pixels each provided with a TFT manufactured in accordance with a manufacturing method of the invention. Such TFTs can reduce variation in the TFFs; therefore, an information terminal device including TFTs having improved characteristics can be provided.

Figure 19C:
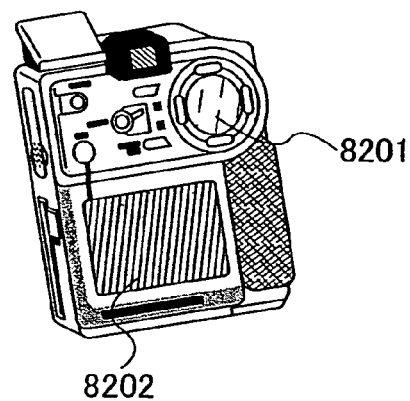

A video camera shown in FIG. 19C includes a main body 8201, a display portion 8202, and the like. The display portion 8202 has pixels each provided with a TFT manufactured in accordance with a manufacturing method of the invention. Such TFTs can reduce variation in the TFTs; therefore, a video camera including TFTs having improved characteristics can be provided.

Figure 19D:
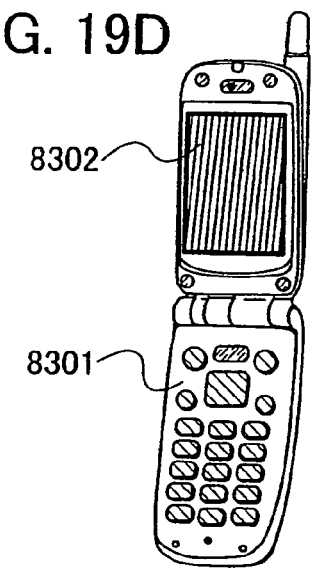

A telephone set shown in FIG. 19D includes a main body 8301, a display portion 8302, and the like. The display portion 8302 has pixels each provided with a TFT manufactured in accordance with a manufacturing method of the invention. Such TFTs can reduce variation in the TFTs; therefore, a telephone set including TFFs having improved characteristics can be provided.

Figure 19E:
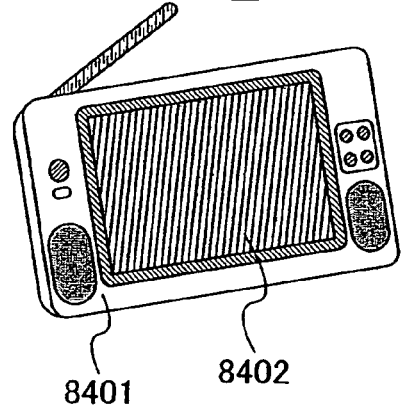

A portable television shown in FIG. 19E includes a main body 8401, a display portion 8402, and the like. The display portion 8402 has pixels each provided with a TFT manufactured in accordance with a manufacturing method of the invention. Such TFTs can reduce variation in the TFTs; therefore, a portable television including TFTs having improved characteristics can be provided. Further, the light emitting device of the present invention can be applied to various televisions such as a small one incorporated in a portable terminal such as a portable phone, a medium-sized one which is portable, and a large one (e.g., 40 inches or more in size).

It is to be noted that electronic apparatuses according to the present invention are not limited to those shown in FIGS. 19A to 19E. An electronic apparatus which has a display device including a TFT in a display portion or the like is included.

As described above, the present invention can be applied extremely widely to manufacturing electronic apparatuses in any field. Further, electronic apparatuses of this embodiment mode can have a structure in accordance with any one or any combination of Embodiment Modes 1 to 6.

Embodiment Mode 8

A method for manufacturing a semiconductor device of the invention will be described with reference to cross-sectional views of FIGS. 20A to 20C, 21A and 21B, 22A and 22B, 23A and 23B, and 24A and 24B; and a top view of FIGS. 25A and 25B.

First, an insulating layer 51 is formed over one surface of a substrate 50 (see FIG. 20A). Next, a release layer 52 is formed over the insulating layer 51. Then, an insulating layer 53 is formed over the release layer 52.

The substrate 50 is a substrate having an insulating surface and is, for example, a glass substrate, a plastic substrate, a quartz substrate, or the like. As the substrate 50, either a glass substrate or a plastic substrate is preferably used. This is because a glass substrate or a plastic substrate having a side of 1 meter or more and/or having a desired shape such as a square can be easily manufactured. Thus, when a glass substrate or a plastic substrate which has a square shape and has a side of 1 meter or more is used for example, productivity can be drastically improved. This is a great advantage compared with the case of using a silicon substrate having a circular shape with a diameter of about 30 centimeters at maximum.

The insulating layers 51 and 53 are formed by vapor deposition (CVD) or sputtering by using oxide or nitride of silicon, oxide of silicon containing nitrogen, nitride of silicon containing oxygen, or the like. The insulating layer 51 prevents impurity elements from entering an upper layer from the substrate 50. The insulating layer 51 is not necessarily formed if not required.

The release layer 52 is formed by sputtering or the like with a single layer or a multi-layer of a layer containing an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), silicon (Si), or the like or an alloy material or a compound material containing the above described element as its main component. Note that the layer containing silicon may have any of the amorphous, microcrystalline, or polycrystalline structure.

In the case where the release layer 52 has a single-layer structure, a layer containing any one of the following may be preferably formed: tungsten, molybdenum, a mixture of tungsten and molybdenum, oxide of tungsten, oxynitride of tungsten, nitride oxide of tungsten, oxide of molybdenum, oxynitride of molybdenum, nitride oxide of molybdenum, oxide of a mixture of tungsten and molybdenum, oxynitride of a mixture of tungsten and molybdenum, and nitride oxide of a mixture of tungsten and molybdenum.

In the case where the release layer 52 has a multi-layer structure, a layer containing tungsten, molybdenum, or a mixture of tungsten and molybdenum may be preferably formed as a first layer. As a second layer, a layer containing oxide of tungsten, oxide of molybdenum, oxide of a mixture of tungsten and molybdenum, oxynitride of tungsten, oxynitride of molybdenum, or oxynitride of a mixture of tungsten and molybdenum may be preferably formed.

In the case where a multi-layer structure of tungsten and oxide of tungsten is formed as the release layer 52, a layer containing tungsten may be formed as the release layer 52 first, and then a layer containing oxide of silicon may be formed as the insulating layer 53 so that a layer containing oxide of tungsten is formed at the interface between the layer containing tungsten and the layer containing oxide of silicon. The same can be applied to the case of forming a layer containing nitride, oxynitride, or nitride oxide of tungsten, or the like; after a layer containing tungsten is formed, a layer containing nitride of silicon, a silicon nitride layer containing oxygen, or a silicon oxide layer containing nitrogen may be formed thereover.

Subsequently, a plurality of transistors 54 are formed over the insulating layer 53. In this step, thin film transistors are formed as the plurality of transistors 54.

Each of the plurality of transistors 54 includes a semiconductor layer 90, a gate insulating layer (also called merely an insulating layer) 55, a first conductive layer 91, and a second conductive layer 92 which is a gate (also called a gate electrode). The semiconductor layer 90 includes impurity regions 93 and 94 functioning as a source or a drain, and a channel formation region 95. The impurity regions 93 and 94 are doped with an impurity element which imparts n-type (e.g., phosphorus: P or arsenic: As) or an impurity element which imparts p-type (e.g., boron: B). The impurity region 94 is an LDD (Lightly Doped Drain) region. Since an irradiation apparatus of the present invention is used to crystallize the semiconductor layer 09, cost reduction can be realized.

Each of the plurality of transistors 54 may have either a top-gate structure in which the gate insulating layer 55 is provided over the semiconductor layer 90, the first conductive layer 91 is provided over the gate insulating layer 55, and the second conductive layer 92 is provided over the first conductive layer 91 or a bottom-gate structure in which the gate insulating layer 55 is provided over the second conductive layer 92 and the semiconductor layer 90 is provided over the gate insulating layer 55. Further, each of one or more of the plurality of transistors 54 may be a multi-gate transistor in which two or more gate electrodes and two or more channel formation regions are provided.

Note that although only the plurality of transistors 54 are formed over the substrate 50 here, the invention is not limited to this structure. An element to be provided over the substrate 50 may be appropriately adjusted in accordance with the use application of the semiconductor device. For example, in the case of forming a semiconductor device having a function of sending and receiving data without contact, only a plurality of transistors, or a plurality of transistors and a conductive layer which functions as an antenna may be formed over the substrate 50. In addition, in the case of forming a semiconductor device having a function of storing data, a plurality of transistors and a memory element (e.g., a transistor or a memory transistor) may be formed over the substrate 50. Further, in the case of forming a semiconductor device having a function of controlling a circuit, generating a signal, or the like (e.g., a CPU or a signal generation circuit), a transistor may be formed over the substrate 50. In addition, another element such as a resistor or a capacitor may be formed if necessary.

Then, over the plurality of transistors 54, insulating layers 56 and 57 are formed. The insulating layers 56 and 57 are formed by vapor deposition, sputtering, SOG (Spin On Glass), a droplet discharge method (e.g., ink jetting), or the like using oxide of silicon, nitride of silicon, polyimide, acrylic, an insulating film comprising a material containing a Si—O—Si bond which is formed using a siloxane based material as a starting material (hereinafter referred to as a siloxane based insulating film), oxazole resin, or the like. Siloxane has a skeletal structure including a bond of silicon (Si) and oxygen (O). An organic group (for example, an alkyl group or aromatic hydrocarbon) which at least contains hydrogen is used as a substituent. Alternatively, a fluoro group may be used as a substituent. As a substituent, an organic group at least containing hydrogen and a fluoro group may also be used. Oxazole resin is, for example, photosensitive polybenzoxazole. The oxazole resin which is lower in the relative permittivity (about 2.9) than the relative permittivity of polyimide or the like (about 3.2 to 3.4) can suppress generation of parasitic capacitance and can perform high-speed operation.

In the above-described structure, three insulating layers (the insulating layers 56 and 57) are formed over the plurality of transistors 54; however, the invention is not limited thereto. The number of insulating layers provided over the plurality of transistors 54 is not particularly limited.

Then, openings are formed in the gate insulating layer 55 and the insulating layers 56 and 57, and conductive layers 59 to 64 each connected to a source (also called a source region or a source electrode) or a drain (also called a drain region or a drain electrode) of each of the plurality of transistors 54 (see FIG. 20A) are formed. The conductive layers 59 to 64 are provided in the same layer. In addition, each of the conductive layers 59 to 64 is a source or drain wiring. Signals supplied from external are supplied to the plurality of transistors 54 through the conductive layers 59 to 64.

By sputtering or the like, the conductive layers 59 to 64 are formed with a single layer or a multi-layer of the following: an element selected from titanium, tungsten, chromium, aluminum, tantalum, nickel, zirconium, hafnium, vanadium, iridium, niobium, lead, platinum, molybdenum, cobalt, rhodium, or the like; an alloy material containing the element as its main component; or a compound material of oxide or nitride containing the element as its main component. As an example of the multi-layer structure of each of the conductive layers 59 to 64, there are a three-layer structure of titanium, aluminum, and titanium, a five-layer structure of titanium, titanium nitride, aluminum, titanium, and titanium nitride, a five-layer structure of titanium, titanium nitride, aluminum added with silicon, titanium, and titanium nitride, and the like.

Next, a conductive layer 66 is formed over the conductive layer 59 (see FIG. 20B). A layer containing gold, silver, or copper is formed by screen printing, a droplet discharge method, or the like as the conductive layer 66. Preferably, the conductive layer 66 may be formed using a paste containing fine particles of silver (a material in which fine particles of silver and resin are mixed) by screen printing. This is because screen printing can reduce manufacturing time and cost of an apparatus. In addition, silver has low resistance.

Then, laser beam irradiation is performed with a laser beam that can dissolve one or both of the conductive layers 66 and 59. Although the conductive layers 66 and 59 are partially in contact with each other before performing the laser beam irradiation, the portion where the conductive layers 66 and 59 are in contact with each other can be increased by the laser beam irradiation. Therefore, more secured electrical connection between the conductive layers 66 and 59 can be obtained; thus, reliability can be improved. As the laser beam, there are a gas laser, a liquid laser, and a solid state laser when classified by a medium; and a free electron laser, a semiconductor laser, and an X-ray laser when classified by a characteristic of oscillation; however, any of the lasers may be used in the invention. Preferably, a gas laser or a solid state laser may be used, and more preferably, a solid state laser may be used. Furthermore, either of a continuous wave laser beam or a pulsed laser beam may be used in the invention.

Next, an insulating layer 68 is selectively formed over the insulating layer 57 and the conductive layers 59 to 64 (see FIG 20C). The insulating layer 58 is provided with an opening 69. The conductive layer 66 is exposed through the opening 69.

Note that the opening 69 preferably does not have such a shape that the surface of the conductive layer 66 is entirely exposed but has such a shape that the surface of the conductive layer 66 is partially exposed. Specifically, the opening 69 preferably has such a shape that a center portion of the conductive layer 66 is exposed. This is in order to carry out transposition accurately in a later step. If the insulating layer 68 is provided so as to entirely expose one surface of the conductive layer 66, a region where both of the conductive layer 66 and the insulating layer 68 are not provided may be formed. In the later transposition step, transposition is performed by adhesion between the insulating layer 68 and a substrate 88; therefore, when there is a region where either one of the conductive layer 66 or the insulating layer 68 is not provided, transposition cannot be performed accurately in some cases. However, in the above-described step, the insulating layer 68 is selectively provided so as to expose the center portion of the conductive layer 66. Accordingly, there is no region where one of the conductive layer 66 and the insulating layer 68 is not provided; thus, transposition can be performed accurately.

The insulating layer 68 is formed of an insulating resin such as an epoxy resin, an acrylic resin, or a polyimide resin to have a thickness of 5 μm to 200 μm, preferably 15 μm to 35 μm. In addition, the insulating layer 68 is formed uniformly by using screen printing, a droplet discharge method, or the like. Preferably, screen printing is used. This is because screen printing can reduce manufacturing time and cost of an apparatus. Then, heat treatment is performed if necessary.

Then, an opening 71 is formed so as to expose at least part of the release layer 52 (see FIG. 21A). In terms of short processing time, this step may preferably be carried out by laser beam irradiation. A laser beam is shone onto the substrate 50, the insulating layer 51, the release layer 52, and the insulating layer 53, the gate insulating layer 55, the insulating layers 56, 57, and 68; the surface of the insulating layer 68 is irradiated first with a laser beam. The opening 71 is formed so as to expose at least a part of the release layer 52. Therefore, the opening 71 is provided at least in the gate insulating layer 55, the insulating layers 56, 57, and 68. The structure shown in the drawing is the case where a laser beam reaches up to the insulating layer 51, and the insulating layers 51 and 53, the gate insulating layer 55, the insulating layers 56, 57, and 68 are sectioned. Note that the laser beam may reach up to the substrate 50.

In the step of irradiation of the above-described laser beam, ablation processing is used. In the ablation processing, a phenomenon is used in which a molecular bond in a portion irradiated with a laser bean, that is, a portion which has absorbed a laser beam is cut, photolyzed, and vaporized. In other words, a molecular bond in a certain portion of the insulating layer 51, the release layer 52, the insulating layer 53, the gate insulating layer 55, and the insulating layers 56, 57, and 68 is cut by the laser beam irradiation, and photolyzed and vaporized to form the opening 71.

In addition, as a laser, a solid state laser with a wavelength of 150 μnm to 380 μnm that is an ultraviolet region is preferably used. More preferably, an Nd: YVO$_4$ laser with a wavelength of 150 μnm to 380 μnm may be used. This is because, as for the Nd: YVO$_4$ laser with a wavelength of 150 μnm to 380 μnm, light is easily absorbed in the substrate compared with other lasers on longer wavelength side, and ablation processing is possible. Moreover, the periphery of a processed portion is not affected and processability is good.

Next, the substrate 88 is provided over the insulating layer 68 (see FIG. 21B). The substrate 88 is a substrate in which an insulating layer 72 and an adhesive layer 83 are stacked, which is a substrate of a heat-peeling type. The adhesive layer. 83 is a layer the adhesion of which decreases by heat treatment, which is, for example, a layer formed of a material utilizing softening of a thermoplastic adhesive at the time of heating, a layer formed of a material where a microcapsule that expands by heating or a foaming agent is mixed, a layer formed of a material in which thermal fusibility or pyrolytic characteristics is given to a thermosetting resin, or a layer using deterioration of interface intensity because of penetration of moisture or expansion of a water-absorbing resin because of the deterioration.

Then, using the substrate 88, the stack including the plurality of transistors 54 is separated from the substrate 50 (see FIG. 22A). The separation of the stack including the plurality of transistors 54 from the substrate 50 is performed either inside the release layer 52 or at the interface between the release layer 52 and the insulating layer 53 as a boundary. The structure shown in the drawing is the case where the separation is performed at the interface between the release layer 52 and the insulating layer 53 as a boundary. In this manner, the separation step can be performed easily in short time by using the substrate 88.

Next, as well as a substrate 89 is provided on the surface of the insulating layer 53, the stack including the plurality of transistors 54 is separated from the substrate 88 by heat treatment (see FIG. 22B). The substrate 89 is a substrate in which an insulating layer 73 and an adhesive layer 84 are stacked. The adhesive layer 84 is a layer the adhesion of which increases by heat treatment, which corresponds to a layer containing a thermoplastic resin. The thermoplastic resin corresponds to polyethylene, polystyrene, polypropylene, polyvinyl chloride, or the like.

As described above, since the substrate 88 is the substrate of a heat-peeling type, the adhesion between the substrate 88 and the insulating layer 68 decreases by heat treatment; thus, the stack including the plurality of transistors 54 is separated from the substrate 88. At the same time, the thermoplastic resin on the surface of the substrate 89 is cured by the heat treatment; thus, the adhesion between the insulating layer 53 and the one surface of the substrate 89 increases. In this manner, the step of separating the stack from the substrate 88 and the step of providing the stack over the substrate 89 can be carried out at the same time by using the two substrates 88 and 89 provided with the adhesive layers having different properties. Consequently, manufacturing time can be shortened.

Then, the conductive layer 66 is irradiated again with a laser beam if necessary. This is performed in order to improve defective electrical connection between the conductive layer 59 and the conductive layer 66 that may be caused by the above separation step. Thus, the step of laser beam irradiation is not necessarily performed if not necessary.

Next, the terminal 12 is formed so as to be in contact with the conductive layer 66, (see FIG. 23A). As the terminal 12, a layer containing gold, silver, or copper is formed by screen printing, a droplet discharge method, or the like. Preferably, they may be formed of a paste containing fine particles of silver (a material in which fine particles of silver and resin are mixed) by screen printing. This is because screen printing can reduce manufacturing time and cost of an apparatus thereof is low. In addition, silver has low resistance. Then, heat treatment is performed if necessary.

Then, laser beam irradiation is performed to the substrate 49, and the gate insulating layer 53, the insulating layers 56, 57, and 68 so that an opening 76 is formed (see FIG. 23B).

Figure 24A:
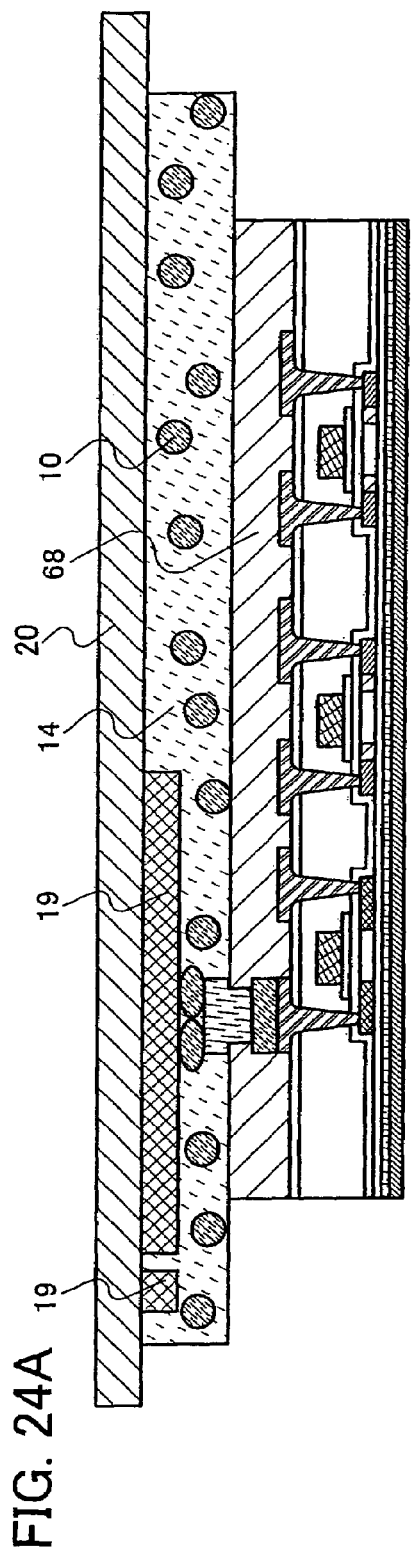
FIGS. 24A and 24B are figures illustrating a manufacturing method of a semiconductor device.
Figure 25A:
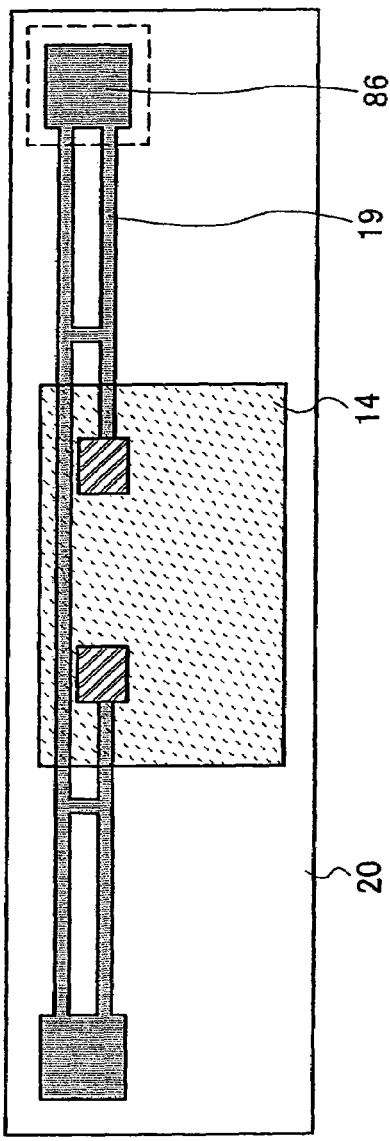
FIGS. 25A and 25B are figures illustrating a manufacturing method of a semiconductor device.

Next, the substrate 20 provided with the conductive layer 19 which functions as an antenna is prepared (see FIG. 24A). The conductive layer 19 which functions as an antenna has a capacitor 86, and each of the conductive layer 19 which functions as an antenna and the capacitor 86 is formed by screen printing, a droplet discharge method, or the like (see FIGS. 25A and 25B). FIG. 24A shows the conductive layer 19 which functions as an antenna. The resin layer 14 is a material where the conductive particle 10 is provided in an adhesive, which is also called an ACP (Anisotropic Conductive Paste). The resin layer 14 is uniformly formed by screen printing, a droplet discharge method, or the like.

Figure 25B:
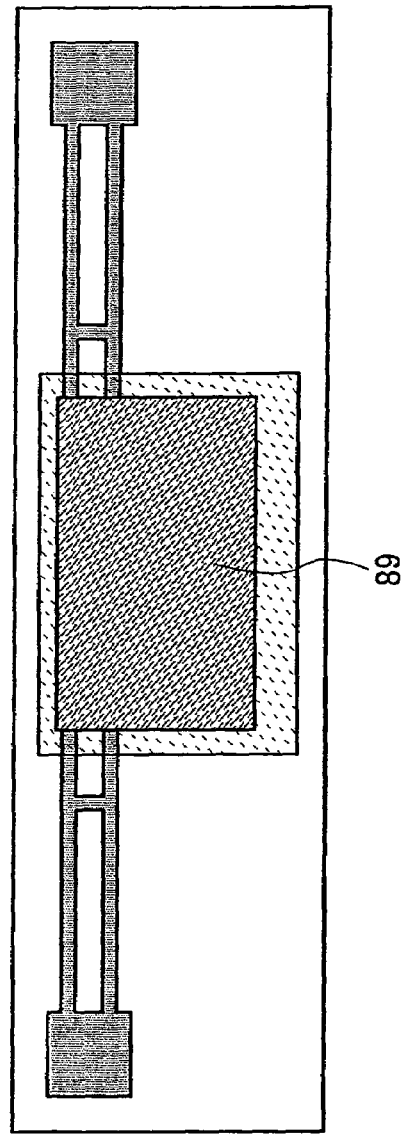

Then, the substrates 89 and 20 are attached to each other using the resin layer 14 (see FIGS. 24A and 25B). Then, if necessary, the insulating layer 68 and the resin layer 14 are attached to each other. At this time, one or both of pressure treatment and heat treatment is performed by using a flip-chip bonder, a die bonder, an ACF (Anisotropic Conductive Film) bonder, a pressure bonder, or the like.

Figure 24B:
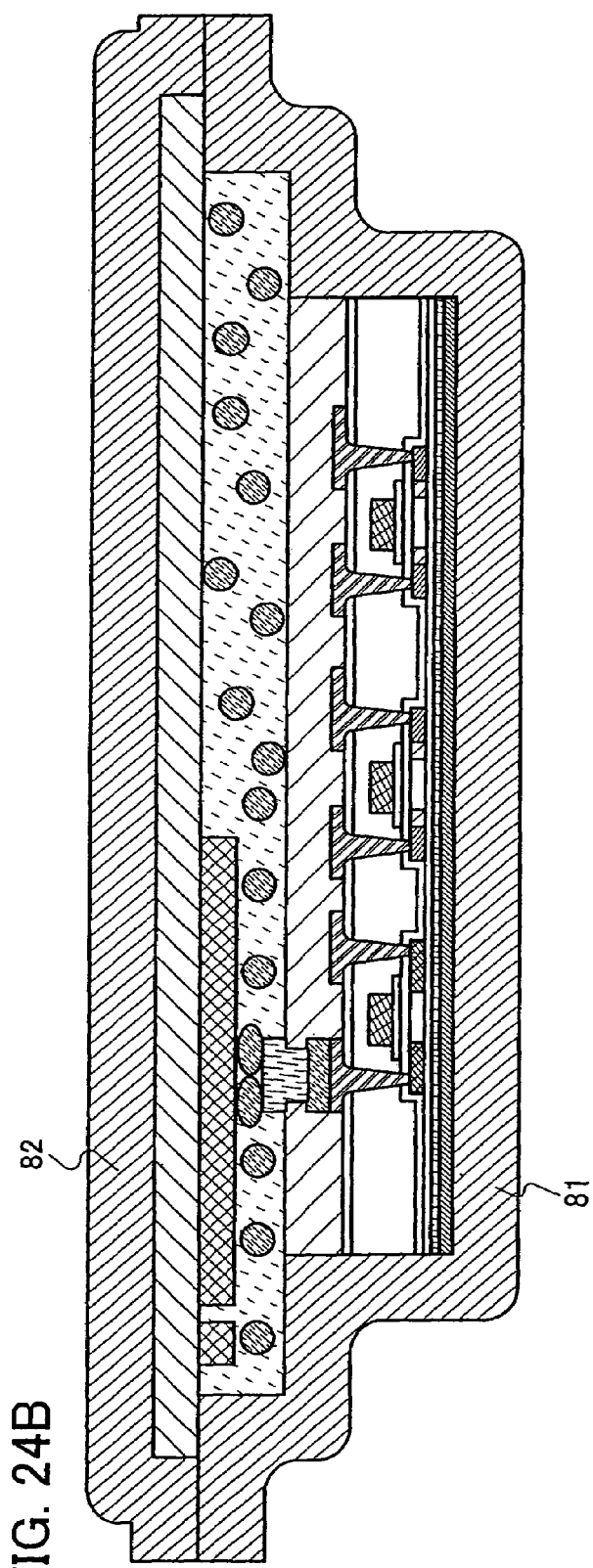

Further, another substrate may also be provided on a surface of the stack including the plurality of transistors 54 (see FIG. 24B). Specifically, another substrate may also be provided over one or both of respective surfaces of the substrates 89 and 20. In the structure shown in the drawing, a substrate 81 is provided on the surface of the substrate 89, and a substrate 82 is provided on the surface of the substrate 20. By providing the substrates 81 and 82, strength thereof can be further improved. The stack including the plurality of transistors 54 is sealed with the substrates 81 and 82 by melting the layer on each surface of the substrates 81 and 82, or an adhesive layer on each surface of the substrates 81 and 82 by heat treatment. In addition, pressure treatment is performed if necessary.

Although the stack including the plurality of transistors 54 is separated from the substrate 50 in this embodiment mode (see FIG. 22A), the invention is not limited to this mode; the substrate 50 may be thinned after forming the conductive layers 59 to 64 (see FIG. 20A).

In order to thin the substrate 50, a surface over which the plurality of transistors 54 is not formed, of the substrate 50 is ground by using a grinding apparatus (e.g., a grinder). Preferably, the substrate 50 may be ground so as to have a thickness of 100 µm or less. Next, the surface over which the plurality of transistors 54 is not formed, of the ground substrate 50 is polished by using a polishing apparatus (e.g., a polishing pad or a polishing abrasive grain such as cerium oxide or the like). Preferably, the substrate 50 may be polished so as to have a thickness of 50 µm or less, more preferably 20 µm or less, and further more preferably 5 µm or less. Note that, in order to thin the substrate 50, one or both of grinding and polishing may be preferably performed. Moreover, before the grinding step and the polishing step, a layer for protection may be provided over the conductive layers 59 to 64 if necessary. Further, after the grinding step and the polishing step, one or both of a cleaning step for removing dust and a drying step may be preferably performed if necessary.

The thickness of the thinned substrate 50 may be appropriately determined in consideration of time required for the grinding step and the polishing step, time required for a cutting step which is performed later, use application of a semiconductor device, the strength required for the use application of the semiconductor device, and the like. For example, in the case where productivity is to be improved by shortening the time for the grinding step and the polishing step, the thickness of the substrate 50 after being polished is preferably set to be about 50 µm. In addition, in the case where productivity is to be improved by shortening the time required for the cutting step that is performed later, the thickness of the substrate 50 after being polished may be preferably set to be 20 µm or less, more preferably 5 µm or less. Moreover, in the case where a semiconductor device is to be attached to or embedded in a thin product, the thickness of the substrate 50 after being polished may be preferably set to be 20 µm or less, more preferably 5 µm or less. Further, the lower limit of the thickness of the thinned substrate 50 is not particularly limited; the substrate 50 may be thinned until the substrate 50 is removed (until the thickness of the substrate 50 becomes 0 µm).

Next, the conductive layer 66 is formed so as to be in contact with the conductive layer 59 (see FIG. 20B). Then, the conductive layer 66 is irradiated with a laser beam (see FIG. 20B). Then, the insulating layer 68 is selectively formed (see FIG. 20C). By laser beam irradiation, the opening 71 is formed (see FIG. 21A). Although the substrate 50 is not cut in forming the opening 71 in the structure shown in the drawing, the substrate 50 is preferably cut in the case where the substrate 50 is thinned. Thus, the step of separating the stack including the plurality of transistors 54 from the substrate 50 is preferably omitted. The subsequent steps are the same as those described above. In the case where the thinned substrate 50 is left without separating the stack including the plurality of transistors 54 from the substrate 50, penetration of harmful gas, moisture, or an impurity element can be suppressed. Thus, deterioration or destruction can be suppressed and reliability can be improved. Moreover, a barrier property can be improved.

Embodiment Mode 9

A manufacturing method of the semiconductor device of the invention is described with reference to cross-sectional diagrams of 26A to 26C, 27A and 27B, 28A and 28B, and 29. Up to the step of forming the transistor and the insulating layer 57, the same as Embodiment Mode 8 can be applied; therefore, description thereof is omitted here.

Figure 26A:
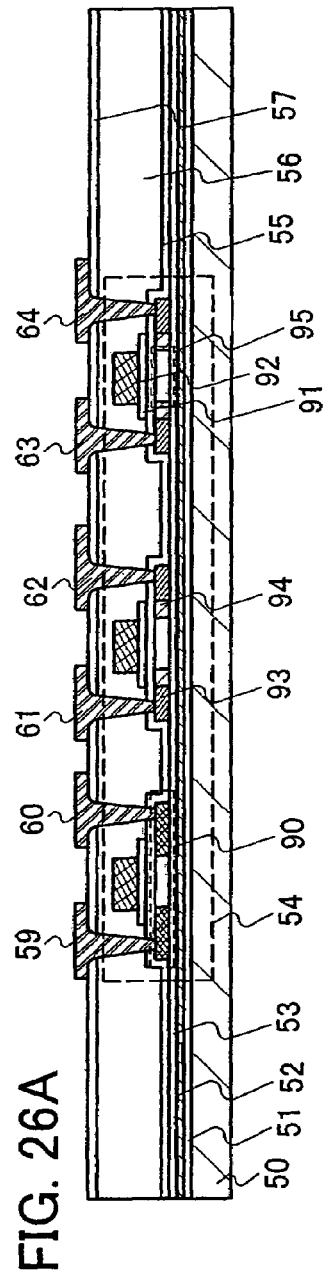
FIGS. 26A to 26C are figures illustrating a manufacturing method of a semiconductor device.

Then, openings are formed in the insulating layers 55 to 57, and the conductive layers 59 to 64 each connected to a source (also called a source region or a source electrode) or a drain (also called a drain region or a drain electrode) of each of the plurality of transistors 54 are formed (i.e., which is electrically floating) (see FIG. 26A). The conductive layers 59 to 64 are provided in the same layer. In addition, the conductive layers 59 to 64 are source or drain wirings. Signals supplied from external are supplied to the plurality of transistors 54 through the conductive layers 59 to 64.

As the conductive layers 59 to 64, a single layer or a multi-layer is formed by sputtering or the like, of the following: an element of titanium, tungsten, chromium, aluminum, tantalum, nickel, zirconium, hafnium, vanadium, iridium, niobium, lead, platinum, molybdenum, cobalt, rhodium, and the like; an alloy material containing the element as its main component; or a compound material of an oxide or a nitride containing the element as its main component. As an example of the multi-layer structure of the conductive layers 59 to 64, there are a three-layer structure of titanium, aluminum, and titanium; a five-layer structure of titanium, titanium nitride, aluminum, titanium, and titanium nitride; a five-layer structure of titanium, titanium nitride, aluminum added with silicon, titanium, and titanium nitride; and the like.

Figure 26B:
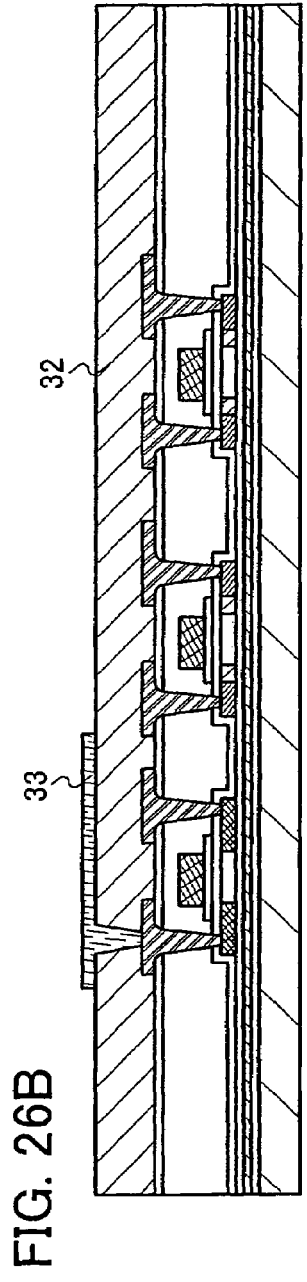
Figure 26C:
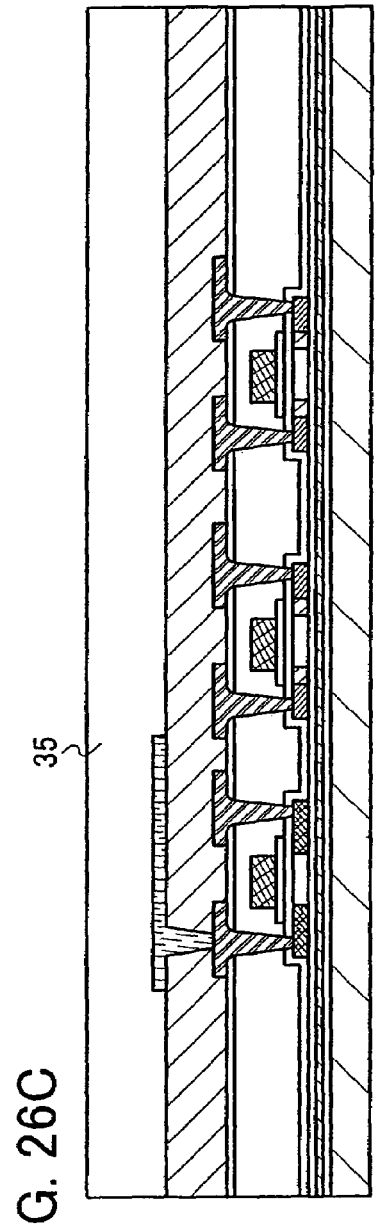

Next, the insulating layer 32 is formed of a single layer or a multi-layer so as to cover the conductive layers 59 to 64 as shown in FIG. 26B. Subsequently, a contact hole is formed in the insulating layer 32 covering the conductive layers 59 to 64 and the conductive layer 33 is formed. The conductive layer 33 functions as an antenna. Note that the conductive layer 33 is formed by screen printing, a droplet discharge method, or the like.

Then, laser beam irradiation is performed with a laser beam that can dissolve one or both of the conductive layers 59 and 33. Although the conductive layers 59 and 33 are partially in contact with each other before performing the laser beam irradiation, the portion where the conductive layers 59 and 33 are in contact with each other can be increased by the laser beam irradiation. Thus, more secured electrical connection between the conductive layers 59 and 33 can be obtained; thus reliability can be improved. As the laser beam, there are a gas laser, a liquid laser, and a solid state laser when classified by a medium; and a free electron laser, a semiconductor laser, and an X-ray laser when classified by a characteristic of oscillation; however, any of the lasers may be used in the invention. Preferably, a gas laser or a solid state laser may be used, and more preferably, a solid state laser may be used. Furthermore, either of a continuous oscillation laser beam or a pulsed laser beam may be used in the invention.

After that, over the insulating layer 32 and the conductive layer 33 which functions as an antenna, a protective layer, e.g., a layer containing carbon such as Diamond-Like Carbon (DLC), a layer containing silicon nitride, or a layer containing silicon nitride oxide may be formed.

Next, as shown in FIG. 17C, the insulating layer 35 is formed over the insulating layer 32 and the conductive layer 33 which functions as an antenna by screen printing or the like. The insulating layer 35 which is provided as a protective layer in a later peeling step may be preferably a planarizing layer.

Then, the opening 71 so as to expose at least part of the release layer 52 is formed (see FIG. 27A). In terms of short processing time, this step may preferably be carried out by laser beam irradiation: the laser beam irradiation is performed to the substrate 50, the insulating layer 51, the release layer 52, and the insulating layers 53, the gate insulating layer 55, the insulating layers 56, 57, 32 and 35; and the surface of the insulating layer 35 is irradiated first with a laser beam. The opening 71 is formed so as to expose at least part of the release layer 52; therefore, the opening 71 is provided at least in the insulating layer 53, the gate insulating layer 55, and the insulating layers 56, 57, 32 and 35. The structure shown in the drawing is the case where a laser beam reaches up to the insulating layer 51, and the insulating layers 51 and 53, the gate insulating layer 55, the insulating layers 56, 57, 32, and 35 are separated. Note that the laser beam may reach up to the substrate 50.

In addition, as a laser, a solid state laser with a wavelength of 150 μnm to 380 μnm that is an ultraviolet region may be preferably used. More preferably, an Nd: $YVO_4$ laser with a wavelength of 150 μnm to 380 μnm may be used. This is because, as for the Nd: $YVO_4$ laser with a wavelength of 150 μnm to 380 μnm, light is easily absorbed in the substrate compared with other lasers on longer wavelength side, and ablation processing is possible. Moreover, the periphery of a processed portion is not affected and processability is good.

Next, the substrate 88 is provided over the insulating layer 68 (see FIG. 27B). The substrate 88 is a substrate in which the insulating layer 72 and the adhesive layer 83 are stacked, which is a substrate of a heat-peeling type. The adhesive layer 83 is a layer the adhesion of which decreases by heat treatment, which is, for example, a layer formed of a material utilizing softening of a thermoplastic adhesive at the time of heating, a layer formed of a material where a microcapsule that expands by heating or a foaming agent is mixed, a layer formed of a material in which thermal fusibility or pyrolytic characteristics is given to a thermosetting resin, or a layer using deterioration of interface intensity because of penetration of moisture or expansion of a water-absorbing resin because of the deterioration.

Figures 28A, 28B:
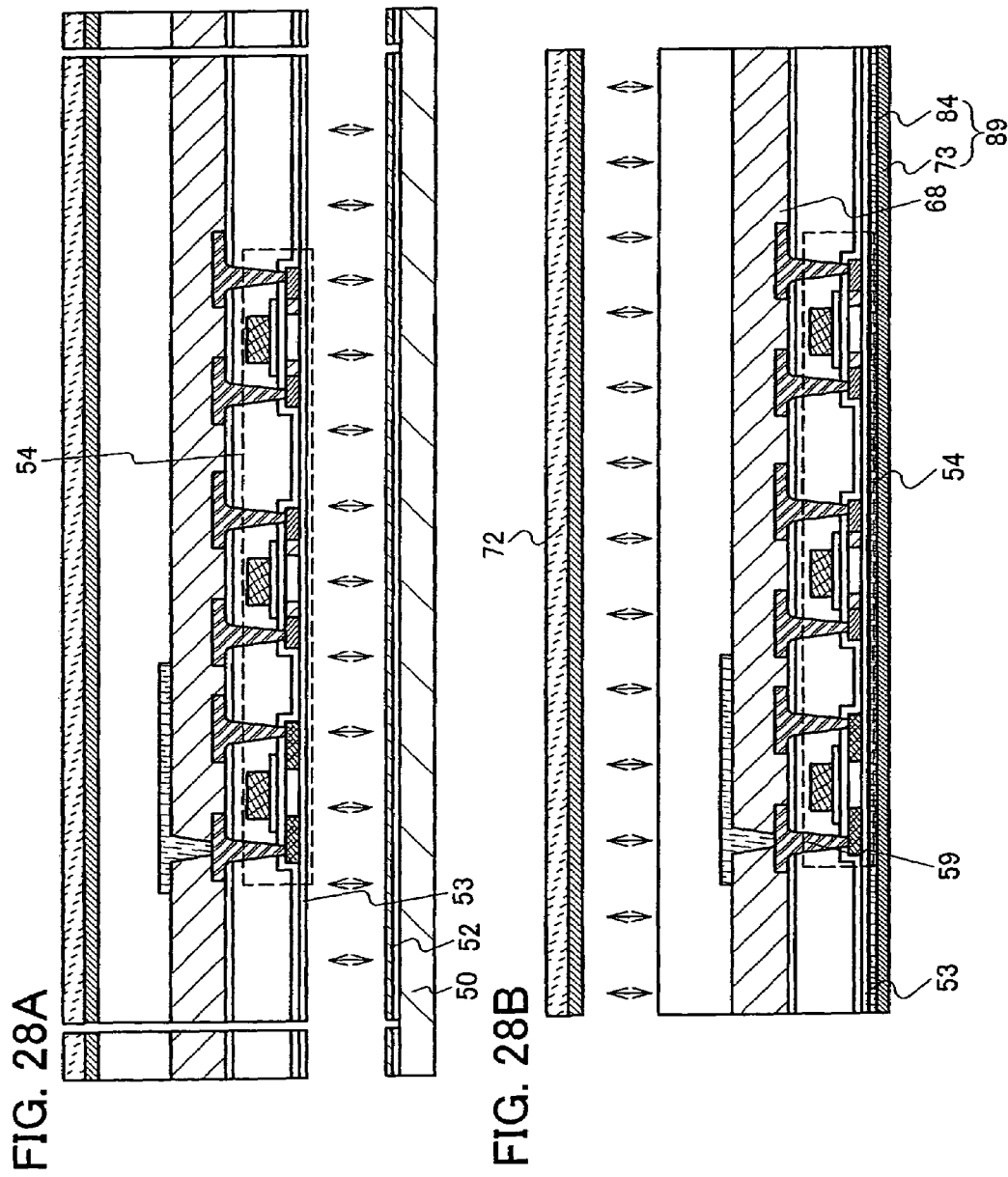
FIGS. 28A and 28B are figures illustrating a manufacturing method of a semiconductor device.

Then, using the substrate 88, the stack including the plurality of transistors 54 is separated from the substrate 50 (see FIG. 28A). The separation of the stack including the plurality of transistors 54 is performed either inside the release layer 52 or at the interface between the release layer 52 and the insulating layer 53 as a boundary. The structure shown in the drawing is the case where the separation is performed at the interface between the release layer 52 and the insulating layer 53 as a boundary. In this manner, the separation step can be performed easily in short time by using the substrate 88.

Next, as well as a substrate 89 is provided on the surface of the insulating layer 53, the stack including the plurality of transistors 54 is separated from the substrate 88 by heat treatment (see FIG. 28B). The substrate 89 is a substrate in which the insulating layer 73 and the adhesive layer 84 are stacked. The adhesive layer 84 is a layer the adhesion of which increases by heat treatment, which corresponds to a layer containing a thermoplastic resin. The thermoplastic resin corresponds to polyethylene, polystyrene, polypropylene, polyvinyl chloride, or the like.

As described above, since the substrate 88 is the substrate of a heat-peeling type, the adhesion between the substrate 88 and the insulating layer 35 decreases by heat treatment; thus, the stack including the plurality of transistors 54 is separated from the substrate 88. At the same time, the thermoplastic resin on the surface of the substrate 89 is cured by the heat treatment; thus, the adhesion between the insulating layer 53 and the one surface of the substrate 89 increases. In this manner, the step of separating the stack from the substrate 88 and the step of providing the stack over the substrate 89 can be carried out at the same time by using the two substrates 88 and 89 provided with the adhesive layers having different properties. Consequently, manufacturing time can be shortened.

Figure 29:
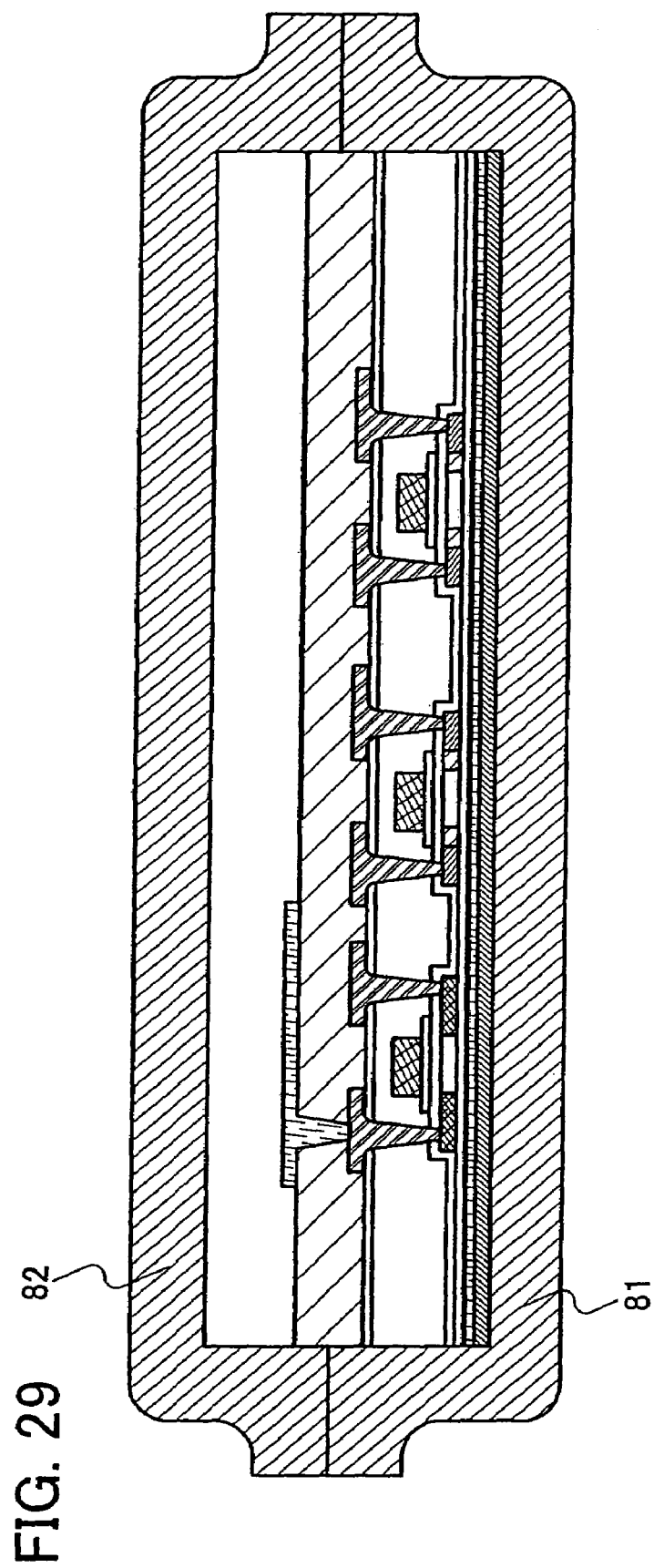
FIG. 29 is a figure illustrating a manufacturing method of a semiconductor device.

Further, a substrate may also be provided on a surface of the stack including the plurality of transistors 54 (see FIG. 29). Specifically, a substrate may be further provided over one or both of respective surfaces of the insulating layer 35 and the substrate 89. In the structure shown in the drawing, the substrate 81 is provided on the surface of the substrate 89, and the substrate 82 is provided on the surface of the insulating layer 35. By providing the substrates 81 and 82, strength thereof can be further improved. The stack including the plurality of transistors 54 is sealed with the substrates 81 and 82 by melting the layer on each surface of the substrates 81 and 82, or the adhesive layer on each surface of the substrates 81 and 82 by heat treatment. In addition, pressure treatment is performed if necessary.

Although the stack including the plurality of transistors 54 is separated from the substrate 50 in this embodiment mode, the invention is not limited to this mode; the substrate 50 may be thinned. The same step as that in Embodiment Mode 8 is applied to a step thereof, thus description thereof is omitted here.

Embodiment Mode 10

Figure 30:
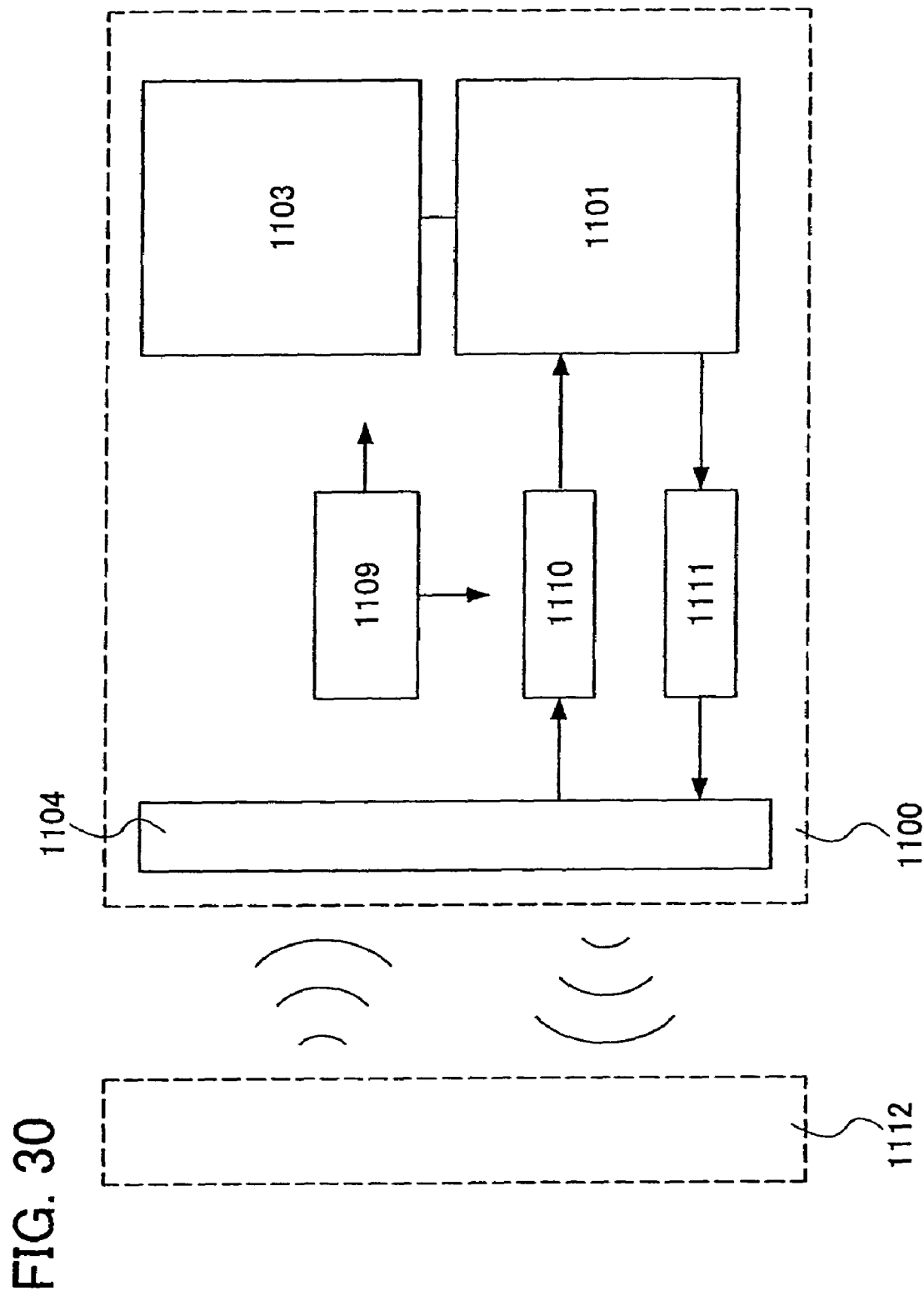
FIG. 30 is a figure illustrating a semiconductor device of the present invention.

A structure of the semiconductor device of the invention is described with reference to FIG. 30. A semiconductor device 1100 of the invention includes an arithmetic processing circuit 1101, a memory circuit 1103, an antenna 1104, a power supply circuit 1109, a demodulation circuit 1110, and a modulation circuit 1111. The semiconductor device 1100 includes the antenna 1104 and the power supply circuit 1109 as mandatory components, and the other components are arbitrarily provided according to use application of the semiconductor device 1100.

The arithmetic processing circuit 1101 analyzes commands, controls the memory circuit 1103, outputs data which is transmitted to the outside, to the modulation circuit 1111, or the like, based on a signal inputted from the demodulation circuit 1110.

The memory circuit 1103 includes a circuit including a memory element and a control circuit for controlling writing and reading of data. The memory circuit 1103 has stored at least an identification number of the semiconductor device. The identification number is used for distinguishing the semiconductor device from other semiconductor devices. In addition, the memory circuit 1103 includes one or plural kinds of memories of an organic memory, a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of conductive layers. Since the organic memory has such a simple structure, a manufacturing process can be simplified and cost can be reduced. In addition, because of the simple structure, the area of a stack can be easily reduced and high capacity can be easily achieved. Further, the organic memory is non-volatile, which is advantageous because an internal battery is not required. Accordingly, it is preferable to use an organic memory for the memory circuit 1103.

The antenna 1104 converts a carrier wave supplied from a reader/writer 1112 into an alternating electrical signal. In addition, load modulation is applied by the modulation circuit 1111. The power supply circuit 1109 generates power supply voltage by using the alternating electrical signal converted by the antenna 1104 and supplies the power supply voltage to each circuit.

The demodulation circuit 1110 demodulates the alternating electrical signal converted by the antenna 1104 and supplies the demodulated signal to the arithmetic processing circuit 1101. The modulation circuit 1111 applies load modulation to the antenna 1104, based on a signal supplied from the arithmetic processing circuit 1101.

The reader/writer 1112 receives the load modulation applied to the antenna 1104 as a carrier wave. In addition, the reader/writer 1112 transmits the carrier wave to the semiconductor device 1100. Note that the carrier wave refers to an electromagnetic wave generated by the reader/writer 1112.

The structure of this embodiment mode can be combined with any structure of the other embodiment modes.

Embodiment Mode 11

Figure 31E:
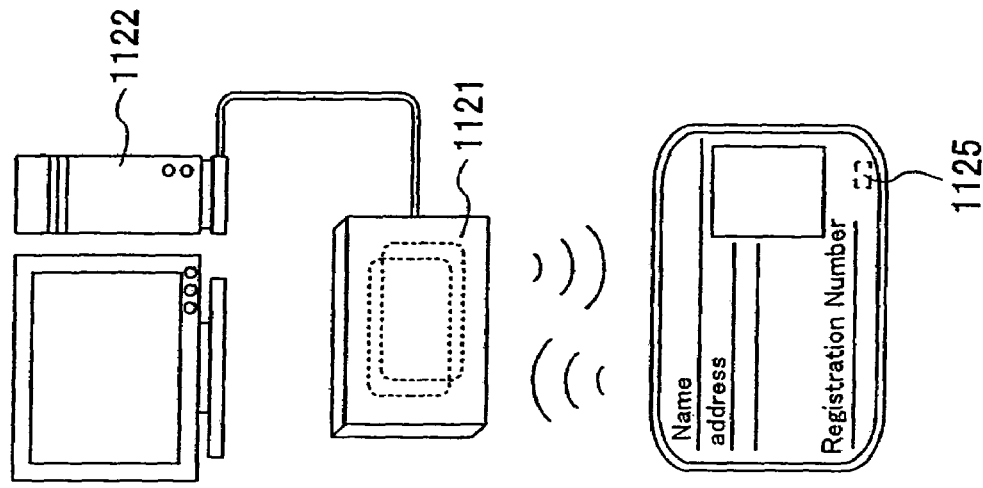
FIGS. 31A to 31E are figures illustrating semiconductor devices of the invention.
Figure 31C:
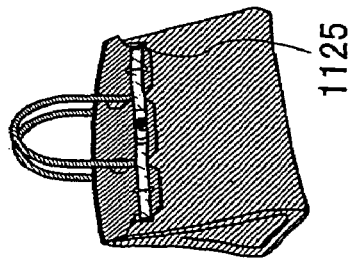
Figure 31D:
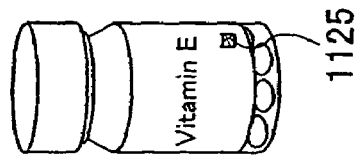
Figure 31A:
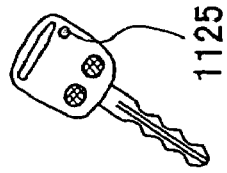
Figure 31B:
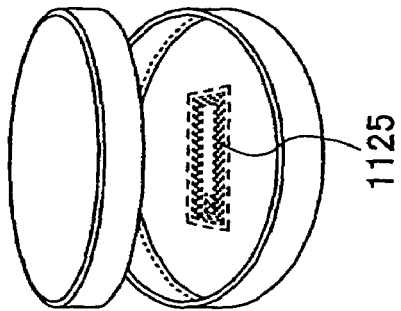

The semiconductor device of the invention can be used in various objects and various systems by utilizing a function capable of transmitting and receiving data without contact. The various objects include, for example, keys (see FIG. 31A), banknotes, coins, securities, bearer bonds, certificates (a driver's license, a resident's card, or the like), books, packing containers (a petri dish or the like; see FIG. 31B), personal accessories and ornaments (a bag, glasses, or the like; see FIG. 31C), packing and wrapping containers (wrapping paper, a bottle, or the like; see FIG. 31D), recording media (a disk, a video tape, or the like), vehicles (a bicycle or the like), foods, clothing, everyday articles, and electronic devices (a liquid crystal display device, an EL display device, a television device, a portable terminal, or the like). The semiconductor device 1125 of the invention is fixed by being attached to the surfaces of the objects having various forms as described above, or being embedded into the objects.

In addition, the various systems include a physical distribution-inventory management system, a certification system, a distribution system, a production record system, a book management system, and the like. By utilizing a semiconductor device 520 of the invention, high-function, multifunction, and a high-added value of the system can be achieved. For example, the semiconductor device 1125 of the invention is provided inside an identification card, and a reader/writer 1121 is provided at an entrance of a building or the like (see FIG. 31E). The reader/writer. 1121 reads an identification number inside the identification card that every person possesses and supplies information related to the identification number that has been read to a computer 1122. The computer 1122 determines whether to permit the person's entrance or exit, based on the information supplied from the reader/writer 1121. In such a manner, by utilizing the semiconductor device of the invention, an entrance-exit management system with improved convenience can be provided.

The structure of this embodiment mode can be combined with any structure of the other embodiment modes.

Using a laser irradiation apparatus of the invention, the flow rate of a gas blown onto a surface of a substrate can be reduced compared with the case of using a conventional laser irradiation apparatus; thus, cost of manufacturing a semiconductor device can be reduced.

This application is based on Japanese Patent Application serial no. 2005-337901 filed in Japan Patent Office on Nov. 23, 2005, the contents of which are hereby incorporated by reference.

What is claimed is:

1. A laser irradiation apparatus comprising:
a laser oscillator;
an optical system shaping laser light produced by the laser oscillator;
a blower having an opening for supplying a gas;
a stage provided below the blower;
a supporting mechanism maintaining a constant distance between the blower and the stage; and
a unit provided between the optical system and the blower for observing the laser light transmitted through the optical system,
wherein the unit includes a CCD camera,
wherein the optical system includes a lens,
wherein the unit is capable of checking shape of the laser light so that a distance between the lens in which laser light lastly passes through and the CCD camera is substantially the same as a distance between a substrate to be irradiated with the laser light and the lens,
wherein the unit is capable of moving between a first position and a second position,
wherein the unit overlaps with the optical system and the stage in the first position,
wherein the unit does not overlap with the optical system in the second position, and
wherein the unit checks energy and shape of the laser light.

2. A laser irradiation apparatus according to claim 1, wherein the gas is an inert gas.

3. A laser irradiation apparatus according to claim 1, wherein the unit includes a power meter and beam profiler.

4. A laser irradiation apparatus according to claim 3, wherein the first position allows the laser light transmitted through the optical system to be entered to the power meter or the beam profiler.

5. A laser irradiation apparatus comprising:
a laser oscillator;
an optical system shaping laser light produced by the laser oscillator;
a blower having an opening for supplying a gas and a window transparent to the laser light shaped by the optical system;
a stage provided below the blower;
a supporting mechanism maintaining a constant distance between the blower and the stage; and
a unit provided between the optical system and the blower for observing the laser light transmitted through the optical system,
wherein the unit includes a CCD camera,
wherein the optical system includes a lens,
wherein the unit is capable of checking shape of the laser light so that a distance between the lens in which laser light lastly passes through and the CCD camera is substantially the same as a distance between a substrate to be irradiated with the laser light and the lens,
wherein the unit is capable of moving between a first position and a second position,
wherein the unit overlaps with the optical system and the stage in the first position,
wherein the unit does not overlap with the optical system in the second position, and
wherein the unit checks energy and shape of the laser light.

6. A laser irradiation apparatus according to claim 5, wherein the gas is an inert gas.

7. A laser irradiation apparatus according to claim 5, wherein the unit includes a power meter and beam profiler.

8. A laser irradiation apparatus according to claim 7, wherein the first position allows the laser light transmitted through the optical system to be entered to the power meter or the beam profiler.

9. A laser irradiation apparatus comprising:
a laser oscillator;
an optical system shaping laser light produced by the laser oscillator;
a blower having an opening for supplying a gas;
a stage provided below the blower;
a supporting mechanism maintaining a constant distance between the blower and the stage; and
a unit provided between the optical system and the blower for observing a shape or a focal point of the laser light transmitted through the optical system,
wherein the unit includes a CCD camera,
wherein the optical system includes a lens,
wherein the unit is capable of checking shape of the laser light so that a distance between the lens in which laser light lastly passes through and the CCD camera is substantially the same as a distance between a substrate to be irradiated with the laser light and the lens,
wherein the unit is capable of moving between a first position and a second position,
wherein the unit overlaps with the optical system and the stage in the first position,
wherein the unit does not overlap with the optical system in the second position, and
wherein the unit checks energy and shape of the laser light.

10. A laser irradiation apparatus according to claim 9, wherein the unit for observing the shape or the focal point of the laser light includes a beam profiler.

11. A laser irradiation apparatus according to 10, wherein the beam profiler includes an ND filter and a CCD camera.

12. A laser irradiation apparatus according to claim 9, wherein the gas is an inert gas.

13. A laser irradiation apparatus according to claim 9, wherein the unit includes a power meter and beam profiler.

14. A laser irradiation apparatus according to claim 13, wherein the first position allows the laser light transmitted through the optical system to be entered to the power meter or the beam profiler.

15. A laser irradiation apparatus comprising:
a laser oscillator;
an optical system shaping laser light produced by the laser oscillator;
a blower having an opening for supplying a gas;
a stage provided below the blower;
a supporting mechanism maintaining a constant distance between the blower and the stage; and
a unit provided between the optical system and the blower for observing energy of the laser light transmitted through the optical system,
wherein the unit includes a CCD camera, wherein the optical system includes a lens, wherein the unit is capable of checking shape of the laser light so that a distance between the lens in which laser light lastly passes through and the CCD camera is substantially the same as a distance between a substrate to be irradiated with the laser light and the lens, wherein the unit is capable of moving between a first position and a second position, wherein the unit overlaps with the optical system and the stage in the first position, wherein the unit does not overlap with the optical system in the second position, and wherein the unit checks energy and shape of the laser light.

16. A laser irradiation apparatus according to claim 15, wherein the unit for observing the energy of the laser light includes a power meter.

17. A laser irradiation apparatus according to claim 15, wherein the gas is an inert gas.

18. A laser irradiation apparatus according to claim 15, wherein the unit includes a power meter and beam profiler.

19. A laser irradiation apparatus according to claim 18, wherein the first position allows the laser light transmitted through the optical system to be entered to the power meter or the beam profiler.

20. A laser irradiation apparatus comprising:

a laser oscillator;

an optical system shaping laser light produced by the laser oscillator;

a blower having an opening for supplying a gas;

a stage provided below the blower;

a supporting mechanism maintaining a constant distance between the blower and the stage;

a first unit provided between the optical system and the blower for observing a shape or a focal point of the laser light transmitted through the optical system; and a second unit provided between the optical system and the blower for observing energy of the laser light transmitted through the optical system, wherein the first unit includes a CCD camera, wherein the optical system includes a lens, wherein the first unit is capable of checking shape of the laser light so that a distance between the lens in which laser light lastly passes through and the CCD camera is substantially the same as a distance between a substrate to be irradiated with the laser light and the lens, wherein the first unit and the second unit are capable of moving between a first position and a second position, wherein the first unit and the second unit overlap with the optical system and the stage in the first position, wherein the first and the second unit do not overlap with the optical system in the second position, and wherein the first unit and the second unit check energy and shape of the laser light.

21. A laser irradiation apparatus according to claim 20, wherein the first unit for observing the shape or the focal point of the laser light includes a beam profiler.

22. A laser irradiation apparatus according to claim 21, wherein the beam profiler includes an ND filter and a CCD camera.

23. A laser irradiation apparatus according to claim 20, wherein the second unit for observing the energy of the laser light includes a power meter.

24. A laser irradiation apparatus according to claim 20, wherein the gas is an inert gas.

25. A laser irradiation apparatus according to claim 20, wherein the first unit includes a beam profiler, and wherein the second unit includes a power meter.

26. A laser irradiation apparatus according to claim 25, wherein the first position allows the laser light transmitted through the optical system to be entered to the power meter or the beam profiler.

* * * * *

UNITED STATES PATENT AND TRADEMARK OFFICE
CERTIFICATE OF CORRECTION

| | | |
|---|---|---|
| PATENT NO. | : 7,714,251 B2 | Page 1 of 2 |
| APPLICATION NO. | : 11/604007 | |
| DATED | : May 11, 2010 | |
| INVENTOR(S) | : Hidekazu Miyairi | |

It is certified that error appears in the above-identified patent and that said Letters Patent is hereby corrected as shown below:

At column 12, line 62, please change "beat" to --heat--;

At column 13, line 59, please change "beat" to --heat--;

At column 15, line 62, please change "110c" to --110e--;

At column 18, line 5, please change "19a" to --119a--;

At column 22, line 17, please change "TFFs" to --TFTs--;

At column 22, line 31, please change "TFFs" to --TFTs--;

At column 26, line 31, please change "bean" to --beam--;

At column 26, line 39, please change "150 μnm to 380 μnm" to --150 nm to 380 nm--;

At column 26, line 41, please change "150 μnm to 380 μnm" to --150 nm to 380 nm--;

At column 26, line 42, please change "μnm" to --nm--;

At column 26, line 43, please change "μnm" to --nm--;

At column 26, line 50, please change "layer." to --layer--;

At column 30, line 30, please change "150 μnm to 380 μnm" to --150 nm to 380 nm--;

At column 30, line 32, please change "150 μnm to 380 μnm" to --150 nm to 380 nm--;

At column 30, line 34, please change "150 μnm to 380 μnm" to --150 nm to 380 nm--;

At column 32, line 63, please change "writer." to --writer--;

Signed and Sealed this

Twenty-sixth Day of October, 2010

David J. Kappos
*Director of the United States Patent and Trademark Office*

At column 34, line 46, please change "10" to --claim 10--.